US012730488B2

(12) United States Patent
Marsters

(10) Patent No.: US 12,730,488 B2
(45) Date of Patent: Sep. 8, 2026

(54) REVERSIBLE LOGIC GATE-BASED THERMAL MANAGEMENT WITH SOFTWARE-CONTROLLED ENTROPY OFFLOADING UNIT FOR HIGH-PERFORMANCE PROCESSOR

(71) Applicant: Bank of America Corporation, Charlotte, NC (US)

(72) Inventor: John-David Stuart Marsters, London (GB)

(73) Assignee: Bank of America Corporation, Charlotte, NC (US)

( * ) Notice: Subject to any disclaimer, the term of this patent is extended or adjusted under 35 U.S.C. 154(b) by 89 days.

(21) Appl. No.: 18/951,922

(22) Filed: Nov. 19, 2024

(65) Prior Publication Data

US 2026/0140554 A1 May 21, 2026

(51) Int. Cl.

| | |
|---|---|
| ***G06F 1/32*** | (2019.01) |
| ***G06F 1/20*** | (2006.01) |
| ***G06F 1/3296*** | (2019.01) |
| ***H03K 19/20*** | (2006.01) |
| *G06F 1/3203* | (2019.01) |
| *G06F 1/3287* | (2019.01) |

(52) U.S. Cl.

CPC ............ *G06F 1/206* (2013.01); *G06F 1/3296* (2013.01); *H03K 19/20* (2013.01); *G06F 1/3203* (2013.01); *G06F 1/3287* (2013.01)

(58) Field of Classification Search

CPC ........ G06F 1/206; G06F 1/3296; H03K 19/20

USPC .......................................................... 713/320

See application file for complete search history.

(56) References Cited

U.S. PATENT DOCUMENTS

| | | | | |
|---|---|---|---|---|
| 9,081,501 | B2 | 7/2015 | Asaad et al. | |
| 9,971,713 | B2 | 5/2018 | Asaad et al. | |
| 11,112,458 | B1 * | 9/2021 | Schat | H03K 19/20 |
| 11,255,663 | B2 | 2/2022 | Binder | |
| 11,726,184 | B2 | 8/2023 | Ferreira et al. | |
| 11,892,893 | B2 | 2/2024 | Rintamaeki et al. | |
| 11,906,290 | B2 | 2/2024 | Binder | |
| 12,001,266 | B1 * | 6/2024 | Mathuriya | H10W 40/10 |
| 12,346,775 | B2 | 7/2025 | Griffin et al. | |

(Continued)

*Primary Examiner* — Volvick Derose

(74) *Attorney, Agent, or Firm* — Banner & Witcoff, Ltd.

(57) ABSTRACT

The invention presents a reversible logic gate-based thermal management system with a software-controlled entropy offloading unit (TOU) for high-performance processors. Reversible logic gates are used in high-computation regions to minimize entropy conversion and reduce heat, while non-reversible gates are used in low-computation areas. The system includes a software-controlled entropy offloading module that dynamically transfers excess information entropy from the processor to the TOU. The TOU performs irreversible computations and manages heat through a cascading non-reversible gate structure and modular cooling systems. Real-time thermal sensors and software algorithms monitor processor performance, adjusting offloading rates and cooling mechanisms based on computational loads and thermal data. The system integrates predictive models to forecast future heat generation and proactively adjust entropy management strategies. This architecture ensures efficient thermal regulation and maintains processor performance, with the flexibility to scale for increased computational demands.

20 Claims, 14 Drawing Sheets

Sample Dedicated TOU Design (Integrated)

(56) References Cited

U.S. PATENT DOCUMENTS

| | | | | |
|---|---|---|---|---|
| 2003/0110423 | A1 | 6/2003 | Helms et al. | |
| 2009/0177445 | A1* | 7/2009 | Capps, Jr. | G06F 1/206 716/136 |
| 2011/0219208 | A1 | 9/2011 | Asaad et al. | |
| 2015/0095674 | A1* | 4/2015 | Sasanka | G06F 12/0223 713/322 |
| 2016/0011996 | A1 | 1/2016 | Asaad et al. | |
| 2019/0154439 | A1 | 5/2019 | Binder | |
| 2019/0384367 | A1* | 12/2019 | Jain | G06F 1/3296 |
| 2019/0392342 | A1* | 12/2019 | Leipold | G02F 1/01725 |
| 2020/0284883 | A1 | 9/2020 | Ferreira et al. | |
| 2021/0133614 | A1 | 5/2021 | Ashrafi | |
| 2023/0176873 | A1 | 6/2023 | Wu et al. | |
| 2024/0118702 | A1 | 4/2024 | Cella et al. | |
| 2024/0144011 | A1 | 5/2024 | Cella et al. | |
| 2024/0144103 | A1 | 5/2024 | Cella et al. | |
| 2024/0144115 | A1 | 5/2024 | Cella et al. | |
| 2024/0144138 | A1 | 5/2024 | Cella et al. | |
| 2024/0144139 | A1 | 5/2024 | Cella et al. | |
| 2024/0144140 | A1 | 5/2024 | Cella et al. | |
| 2024/0144141 | A1 | 5/2024 | Cella et al. | |
| 2024/0144181 | A1 | 5/2024 | Cella et al. | |
| 2024/0152175 | A1* | 5/2024 | DeBenedictis | G06N 10/20 |
| 2024/0175678 | A1 | 5/2024 | Binder | |
| 2024/0320536 | A1* | 9/2024 | Tsfasman | G06N 10/20 |

* cited by examiner

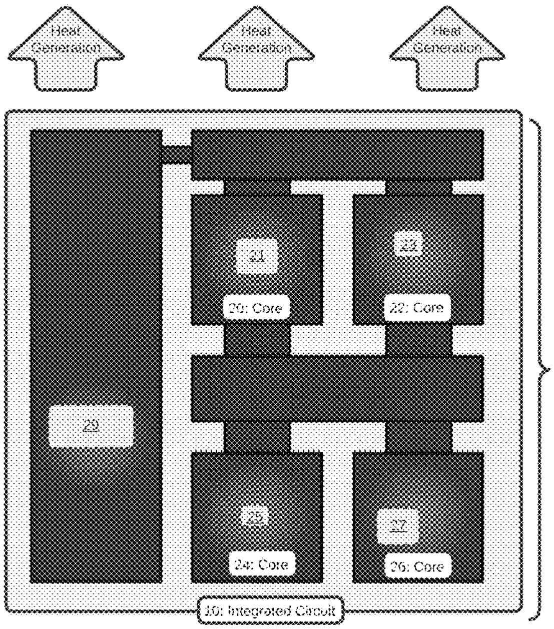

Notes:
- Sample 4-Core Processor
- Sample Processor Cores: 20, 22, 24, 26
- Sample Areas of High Gate Activity and Corresponding Localized Higher Heat Generation Due to Entropy Because of Information Loss: 21, 23, 25, 27, 29
- Heat Concentrated in Critical (i.e., High Activity) Areas (i.e., 21, 23, 25, 27, 29)

Standard Integrated Circuit Design Using Standard (i.e., Non-Reversible) Logic Gates)
FIG. 1A (Prior Art)

Notes:
- Thermal Output Units: 30A (Integrated) and 30B (Outboard) (See also FIGS. 2A-2B for TOU Sample Implementions)
- High-Activity Portions of IC / Core(s) Replaced with Reversible Gates (i.e., Non-Loss, Reduced Loss / Entropy Generation Areas): 32
- Unlabled Portions of IC / Core(s) Still Utilize Standard Gates Due to Activity Levels Below Optimization Threshold
- Reduces Heat Generation in Critical Areas of Integrated Circuits
- No Major Change to Computign Paradigms

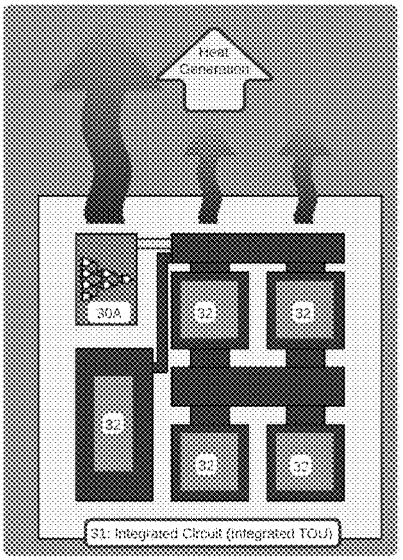

Sample Dedicated TOU Design (Integrated)
FIG. 1B

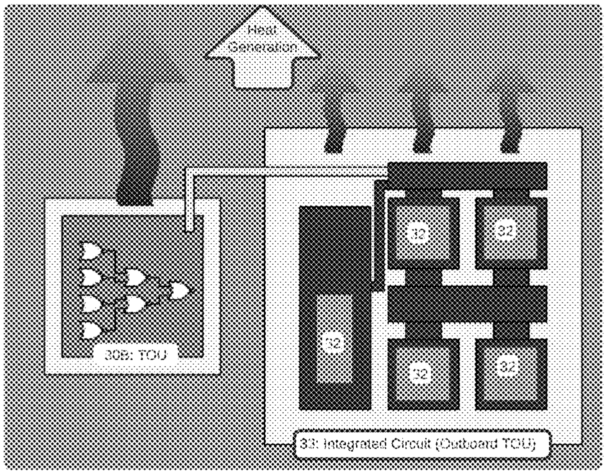

Sample Dedicated TOU Design (Outboard)
FIG. 1C

Exemplary (General) High-Level Block Diagram for System Architecture

Sample High-Level TOU

Sample Multi-Input Single (or Reduced Output) Gates for TOU

Exemplary (General) High-Level Flow Diagram for Entropy Offloading Process

Notes:

- Reversible logic gates utilized in key areas of the processor to prevent irreversible information loss and reduce heat generation.
- The reversible gates preserve input-output state mappings during computations, minimizing entropy changes.
- Additionally, the invention includes a Thermal Output Unit (TOU) to offload extraneous data from the processor core, where the irreversible destruction of information is performed, thus isolating heat production in the TOU.
- The TOU can incorporate or be utilized in conjunction with various heat dissipation systems such as heat sinks and vapor chambers to prevent heat from affecting the processor core's performance.

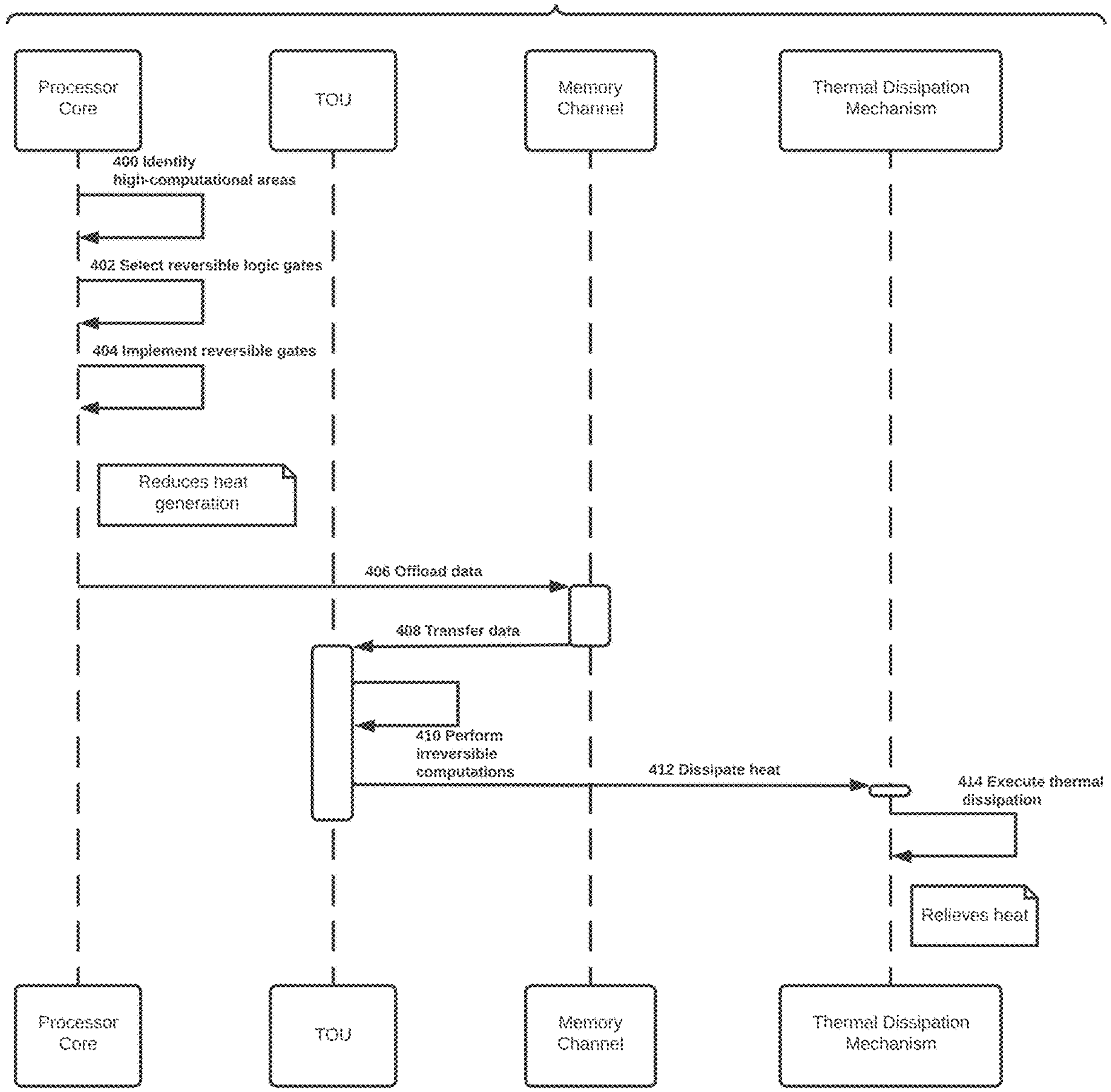

Examplary Sequency Diagram for
Reversible Logic Gate-Based Thermal Management with Dedicated Entropy Offloading Unit for High-Performance Processor
FIG. 4A Notes:

- Can build upon FIG. 4A by incorporating software modules to dynamically manage the offloading of entropy and regulate thermal performance.
- The software modules include an entropy offloading module that controls when and where entropy is transferred to the TOU, a dynamic heat regulation module that monitors and adjusts thermal conditions in real-time, and a performance optimization module that adjusts the use of reversible logic gates based on computational loads and heat generation.
- The TOU processes offloaded data similarly to FIG. 4A but with enhanced adaptability through software-based control.

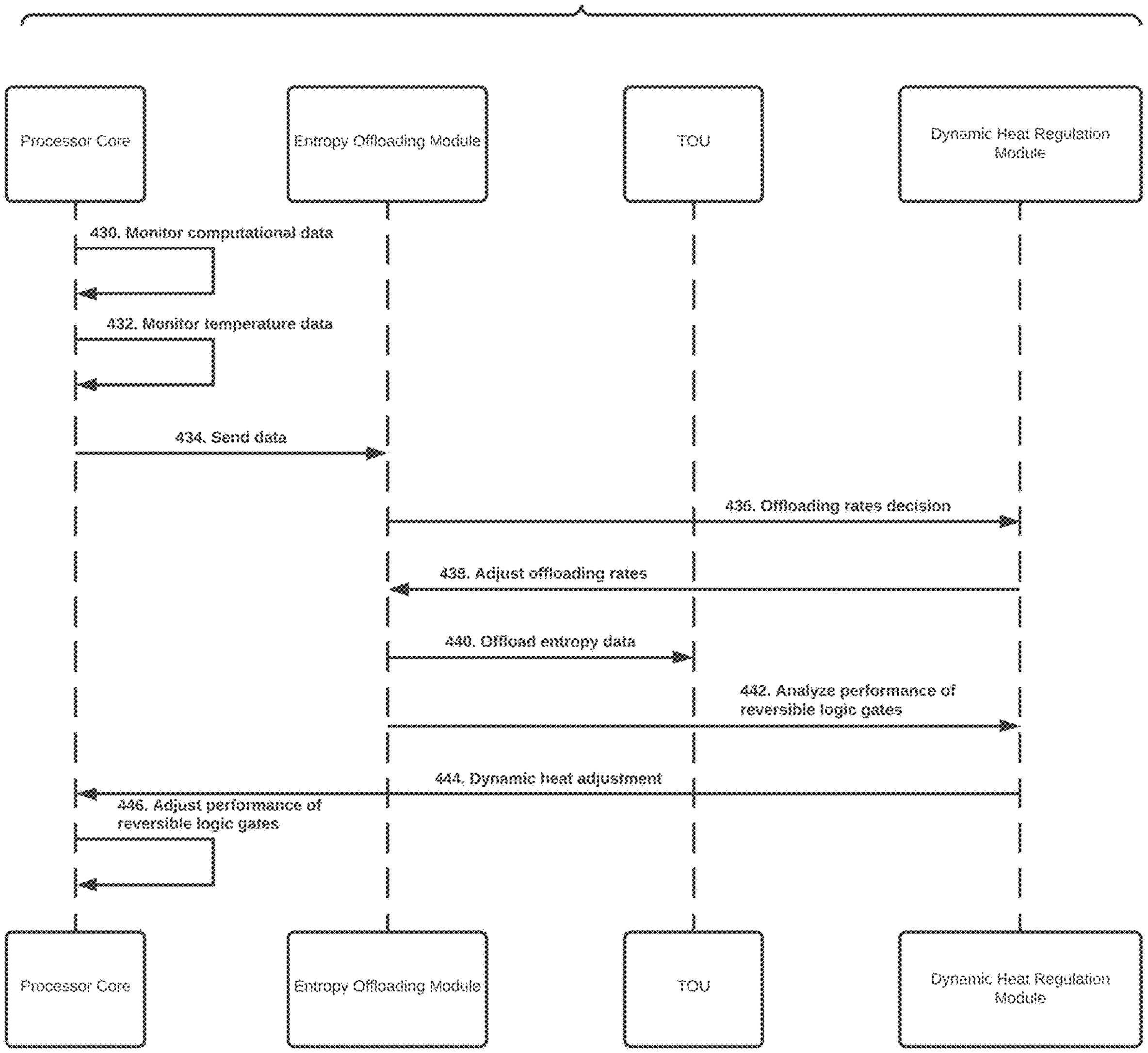

Examplary Sequency Diagram for
Reversible Logic Gate-Based Thermal Management with Software-Controlled Entropy Offloading Unit for High-Performance Processor

FIG. 4B

Notes:

- Thermal observation, thermal imaging, or thermal simulation or the like can be used to identify regions of the processor with high gate activity and entropy generation.
- These regions, where standard logic gates generate excessive heat, are retrofitted or redesigned using loss-less reversible gates to reduce heat generation.
- Additionally, entropy is offloaded to the TOU, where the irreversible destruction of data is performed.
- Thermal observation data or the like can be used to edesign (iteratively, if desired) the processor or other IC to optimize performance and heat dissipation efficiency.

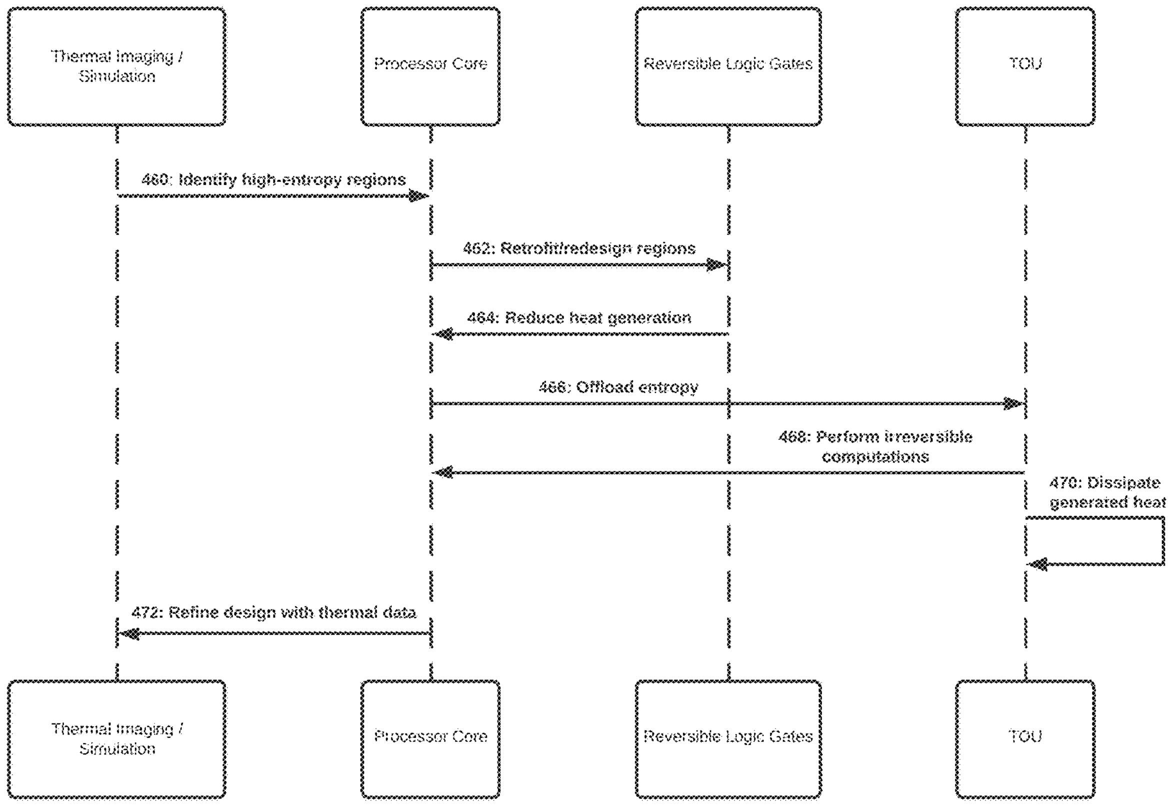

Examplary Sequency Diagram for
Thermal Imaging-Based Entropy Management with Reversible Logic Gates and Thermal Output Unit for High-Performance Processor Optimization

FIG. 4C

Sample Thermal / Heat Map for Original Processor or Processor Design with Traditional / Standard Non-Reversible Logic Gates

Sample Thermal / Heat Map for Redesigned Processor or with Loss-Less / Reduced Loss Reversible Logic Gates

Sample Process for Reversible Logic Gate-Based Thermal Management with Dedicated Entropy Offloading Unit for High-Performance Processor

Sample System for Reversible Logic Gate-Based Thermal Management with Dedicated Entropy Offloading Unit for High-Performance Processor Sample Process for Reversible Logic Gate-Based Thermal Management with Software-Controlled Entropy Offloading Unit for High-Performance Processor Sample System for Reversible Logic Gate-Based Thermal Management with Software-Controlled Entropy Offloading Unit for High-Performance Processor Sample Process for Thermal Imaging-Based Entropy Management with Reversible Logic Gates and Thermal Output Unit for High-Performance Processor Optimization Sample System for Thermal Imaging-Based Entropy Management with Reversible Logic Gates and Thermal Output Unit for High-Performance Processor Optimization

REVERSIBLE LOGIC GATE-BASED THERMAL MANAGEMENT WITH SOFTWARE-CONTROLLED ENTROPY OFFLOADING UNIT FOR HIGH-PERFORMANCE PROCESSOR

TECHNICAL FIELD

The inventions disclosed herein pertain to the field of semiconductor device fabrication, specifically the design and architecture of integrated circuits (ICs) and processors. This field involves the development and manufacturing of semiconductor devices and systems, which include designing the layout of processor cores and thermal management systems. The invention improves the energy efficiency and performance of processors by introducing reversible logic gates and an offloading unit for entropy management, enabling higher computational speeds with reduced thermal output.

DESCRIPTION OF THE RELATED ART

In the realm of modern computing, the challenge of heat generation and dissipation is a growing concern, especially as processors become more powerful and operate at increasingly higher power densities. The rapid evolution of semiconductor technology has resulted in processors that handle immense computational loads, but this performance comes with significant thermal consequences. Heat is generated during computation, especially when information is irreversibly processed, and this heat must be managed effectively to prevent damage to the processor and ensure optimal performance. The miniaturization of transistors, which has been critical to increasing processing power, compounds the problem, as even minor temperature fluctuations can dramatically affect the functionality of these tiny components. The result is a situation where thermal management becomes a primary bottleneck to further advances in processing power, limiting the performance of the latest processors.

Traditional methods for dealing with heat dissipation, such as fans, heat sinks, vapor chambers, and thermal interface materials, are designed to remove heat once it has been generated within the processor. These technologies have been refined over the years, becoming more effective at cooling high-performance processors. However, they are inherently reactive in nature, addressing heat "after the fact" rather than preventing it from being generated in the first place. This approach is problematic because it does not address the root causes of heat generation. To achieve significant improvements in processing efficiency and thermal management, new approaches are needed that reduce the amount of heat generated at its source rather than focusing solely on managing it after it has been produced.

One source of this heat generation is directly tied to the fundamental architecture of logic gates within the processor. Logic gates are the basic building blocks of digital circuits, performing the essential function of transforming inputs into outputs. In traditional logic gates, this process is irreversible. Once the gate processes a set of inputs and produces an output, information about the original input is lost. This loss of information is not just a computational inconvenience; it has direct thermodynamic consequences.

According to "Landauer's Principle", whenever information is irreversibly erased, the reduction of information entropy leads to a corresponding increase in heat entropy. Specifically, Landauer's Principle quantifies the minimum amount of energy that must be dissipated as heat when one bit of information is irreversibly erased. The formula $Q=K_B*T*\ln2$ describes the energy dissipated, where Q is the heat generated, $K_B$ is the Boltzmann constant, T is the absolute temperature, and ln2 reflects the binary nature of information processing and refers to the natural logarithm of 2. The natural logarithm, denoted as "ln," is the logarithm to the base "e," where "e" is Euler's number, approximately equal to 2.71828. The natural logarithm of a number gives the power to which "e" must be raised to obtain that number. In the case of ln2, it represents the power to which "e" must be raised to equal 2. Numerically, the natural log of 2 is approximately equal to 0.6931.

In the context of Landauer's Principle, the natural log of 2 appears because binary information processing is based on two possible states for each bit, 0 and 1. When one bit of information is irreversibly erased, the entropy change is proportional to the natural log of 2, which reflects the logarithmic relationship between the two possible states in a binary system.

Landauer's Principle establishes that the erasure of information during irreversible computations is intrinsically linked to heat generation. As processors perform billions of operations every second, each erasure of a bit of information results in a small amount of heat being produced. While the heat generated by a single bit of information may be negligible, the cumulative effect of billions of bits being processed every second is material. This is especially true in high-performance processors that are designed to handle vast amounts of data. The more information that is processed and lost, the more heat is generated, creating a significant challenge for thermal management.

As processors scale up in complexity, incorporating more transistors, cores, and parallel processing capabilities, the amount of heat generated due to information loss also increases. High-performance processors, such as those used in applications like artificial intelligence (AI), machine learning (ML), and real-time data analytics, are particularly susceptible to this issue. These processors operate at high current levels, often exceeding hundreds of amps, which results in significant heat production. Traditional cooling methods struggle to keep up with the thermal demands of these systems, and as a result, these processors frequently encounter thermal limitations that can prevent them from achieving their full potential. When processors reach their thermal limits, they are often forced to throttle their performance to avoid overheating, which reduces their overall speed and efficiency. This thermal throttling creates a situation where the processor is unable to run at its full capacity, leading to lost performance and inefficiencies.

The growing complexity of modern computing workloads further exacerbates the problem of heat generation. Tasks such as deep learning, neural network inference, and large-scale data processing place enormous demands on processor resources, requiring parallel processing across multiple cores. Each core generates heat as it performs computations, and without effective thermal management, the heat produced by each core contributes to the overall thermal load of the processor. This is especially problematic in densely packed processor designs, where the physical proximity of multiple cores means that heat generated by one core can affect the performance of neighboring cores. The result is the development of localized hot spots within the processor, where specific areas become significantly hotter than others, leading to uneven thermal loads that degrade performance.

The miniaturization of transistors, which has driven much of the advancement in processor technology, introduces additional challenges related to heat generation. As transistors approach quantum-scale dimensions, they become far more sensitive to thermal fluctuations. At these scales, even small increases in temperature can significantly alter the electrical properties of transistors, resulting in reduced reliability, increased susceptibility to computational errors, and even permanent damage. This sensitivity to heat makes thermal management systems critical not only for maintaining performance but also for ensuring the long-term stability of processors. However, the effectiveness of traditional cooling methods diminishes as transistors shrink, leaving designers searching for solutions that address the problem of heat generation at the root level.

Advancements in heat removal systems, such as microfluidic cooling and carbon nanotube-based heat sinks, have provided incremental improvements in the ability to dissipate heat. However, these technologies still operate on the principle of managing heat after it has been produced. As processor power densities continue to rise, the ability of post-production cooling systems to keep up with the growing thermal load is becoming increasingly strained. The reliance on these cooling solutions introduces limitations in how far processors can be scaled. As more cores are added to a chip, each additional core generates more heat, making it harder to cool the entire processor effectively. This limits the scalability of multi-core processors, which are a key architecture for achieving higher levels of parallel computing performance.

Furthermore, the increased energy consumption required to cool processors poses additional challenges. As processors generate more heat, they require more energy to run their cooling systems, which increases the overall power consumption of the system. This is particularly problematic in data centers, where many hundreds or thousands of processors are deployed. The energy required to cool these processors can represent a significant portion of the operational costs of running a data center. Moreover, the environmental impact of this increased energy consumption is also a concern, as it contributes to the carbon footprint of the computing infrastructure.

One of the consequences of inadequate thermal management is that processors must reduce their performance to avoid overheating. Even though a processor may be capable of operating at higher speeds, it is forced to slow down to prevent excessive heat buildup. This performance throttling is particularly detrimental in high-performance computing environments where speed and efficiency are critical to success. In these scenarios, the full potential of the hardware cannot be realized due to thermal constraints. The inability to fully utilize the processor's capabilities may result in inefficiencies and wasted computational power, further limiting the effectiveness of high-performance computing systems.

Thermal management challenges are not limited to high-performance computing systems; they also affect mobile devices and edge computing environments. In mobile devices, power consumption and heat generation are critical concerns, as these devices have limited space for cooling solutions. As mobile processors become more powerful, the need for efficient thermal management becomes even more pressing. Excessive heat can degrade battery life, reduce performance, and even cause physical damage to the device itself. Similarly, in edge computing environments, where computing resources are deployed closer to the end user to reduce latency, the ability to manage heat without relying on large, centralized cooling systems is essential.

The invention addresses several long-felt needs in the semiconductor and computing industries, where heat generation and thermal management have been persistent issues as processors have increased in complexity and power density. Below is a sample breakdown of various long-felt needs:

a. Relocation of Heat Generation/Dissipation: The long-felt need for managing heat generated due to Landauer's Principle arises from the inherent challenge in modern processors where irreversible computations produce heat as a result of their inherent information destruction. As processors perform billions of these operations per second, additional heat is concentrated in core areas, contributing to thermal bottlenecks that force performance throttling and limit the processor's potential. While traditional cooling methods, which address heat after it is generated, remain effective for some aspects of heat management, they alone are increasingly insufficient for handling the thermal challenges of modern processors; this is especially true as processors become more powerful and densely packed. By relocating the heat-generating process of irreversible computations to a dedicated Thermal Output Unit (TOU) outside the processor core, this invention isolates thermal effects away from critical areas, allowing more efficient heat dissipation. This approach solves the issue by managing heat in a controlled location, improving processor efficiency, reducing energy consumption, and enabling better scalability without the constraints imposed by excessive heat generation in the core. Thus, the relocation of heat generation represents a significant advancement in thermal management, enhancing processor performance and scalability.

b. Reduction of Heat at the Source: A major long-standing challenge in the industry has been the need to manage heat generation during computation rather than merely dissipating it after it has been produced. Traditional cooling methods focus on heat removal, but one source of the heat—irreversible computations—has not been effectively addressed. The invention meets the need to reduce the amount of heat generated this way by minimizing the irreversible destruction of information during computation. By addressing this cause of heat generation, the invention contributes to the reduction of thermal bottlenecks that have limited further advancements in processing power.

c. Efficient Thermal Management for High-Density Processors: As processors have become more densely packed with transistors and cores, the ability to manage heat effectively has become increasingly difficult. Traditional cooling systems are reaching their physical and operational limits, especially as multi-core processors scale up in size. The invention addresses the need for an efficient way to mitigate the increased thermal load in high-density, multi-core processors by using reversible logic gates and entropy offloading to relocate heat generation. This enables more effective and scalable thermal management, facilitating the development of even more powerful processors.

d. Mitigating Performance Throttling: Thermal throttling, where processors reduce their speed to avoid overheating, has been a major performance constraint. High-performance processors may often encounter thermal limitations that prevent them from achieving their full potential, particularly in environments requiring continuous, high-speed computation. The invention directly addresses the need to mitigate thermal throttling by providing a mechanism that reduces heat generation at the source, allowing processors to operate at higher speeds without the risk of overheating.

e. Improving Energy Efficiency: Data centers and large-scale computing environments are increasingly grappling with the high energy consumption required to cool powerful processors. With traditional cooling methods consuming a significant portion of operational energy, there has been a long-standing need for more energy-efficient systems that can manage heat without excessive power consumption. By reducing the heat produced during computation, the invention reduces the burden on cooling systems, thus improving overall energy efficiency. This is especially beneficial in data centers and cloud computing environments, where reducing energy consumption has both economic and environmental benefits.

f. Thermal Management for Mobile and Edge Devices: Mobile devices and edge computing environments have unique thermal management challenges due to their limited space and cooling resources. As mobile processors become more powerful, the need to manage heat efficiently becomes even more critical to avoid damaging components, shortening battery life, and reducing performance. Similarly, edge computing systems, which are often deployed in environments without large, centralized cooling systems, require effective thermal management to maintain performance. The invention addresses the long-felt need for a thermal management solution that can be applied to mobile and edge devices by reducing heat at its source, rather than relying on bulky post-production cooling systems.

g. Addressing Heat Sensitivity in Miniaturized Transistors: The miniaturization of transistors has made them more sensitive to temperature fluctuations. Even small increases in heat can significantly affect the electrical properties of transistors at quantum-scale dimensions, leading to reduced reliability and increased computation errors. Traditional cooling methods are reaching their limits in protecting these components from thermal fluctuations. The invention satisfies the need for a solution that addresses this sensitivity by reducing the heat generated within the transistors themselves, thus helping to maintain their stability and performance as they continue to shrink in size.

h. Maintaining Processor Reliability and Longevity: Excessive heat is one of the primary causes of wear and tear in processors, shortening their lifespan and reducing long-term reliability. The invention fulfills the need for a thermal management solution that not only improves performance but also extends the life of the processor by minimizing the damaging effects of heat over time. By addressing heat generation at the computational level, this invention helps ensure that processors can maintain reliable performance over extended periods, particularly in mission-critical applications like scientific computing and financial systems.

i. Improving the Scalability of Processor Designs: As processors continue to scale up in power and complexity, the scalability of thermal management systems has become a pressing concern. Traditional cooling systems can often struggle to handle the heat generated by increasingly powerful multi-core processors. The invention addresses the need for scalable thermal management by allowing processors to add more cores and transistors with fewer heat-related constraints. This opens the door to further advancements in parallel processing and multi-core architectures, helping to achieve higher levels of computational efficiency.

j. Post-Creation Thermal Optimization: There has been a long-felt need for post-creation thermal imaging to identify hot spots in processor cores, as these areas generate excessive heat during high-intensity computations. These hot spots are often contributed to by irreversible operations that reduce information entropy and produce heat, limiting core performance and increasing the risk of thermal throttling or hardware damage. By using thermal imaging after the processor has been designed and manufactured, engineers can pinpoint areas with the highest thermal stress. These regions can then be retrofitted with entropy loss-less, reversible logic gates to reduce heat generation at its source. Coupling these retrofitted areas with a dedicated Thermal Output Unit (TOU) for offloading entropy and managing heat dissipation allows for more effective control over the thermal load, significantly increasing core performance and minimizing thermal issues. This approach offers a proactive way to enhance processor efficiency and lifespan, addressing a critical need in thermal management for high-performance computing.

As explained herein, the invention's ability to reduce heat at the source, combined with its potential uses in a wide range of applications, addresses several long-standing challenges in computing, from data center efficiency to mobile device performance. By tackling heat generation through reversible computing and entropy offloading, the invention opens new possibilities for the continued advancement of processor technology.

SUMMARY OF THE INVENTION

Various inventions (individually and/or collectively "invention" or "inventions") are disclosed to address the foregoing technical problems with unmanaged entropy conversion to heat. A novel processor architecture utilizes reversible logic gates to prevent irreversible information loss within the processor, thereby reducing localized heat generation. Reversible logic gates preserve the input-output state mappings during computation, minimizing the entropy changes that contribute to heating effects. The invention also includes a Thermal Output Unit (TOU) that accepts unnecessary data offloaded from the processor core, allowing it to be destroyed in a controlled manner. This helps to isolate the attendant conversion to heat in a separate unit equipped with advanced heat dissipation mechanisms like heat sinks and vapor chambers. The offloading of data destruction improves energy efficiency and processor performance, and helps to address a significant source of heat generation. A method for reducing heat generation in a high-performance computing processor can involve operating reversible logic gates within the processor core to preserve information during computations. These reversible gates are selectively employed in areas of the core with high computational intensity. Intermediate or unnecessary data is offloaded from the processor core to a Thermal Output Unit (TOU) via a high-bandwidth memory channel. In the TOU, irreversible computations are performed to destroy the offloaded data, and the resulting heat is dissipated through thermal dissipation mechanisms, ensuring efficient heat management and improved processor performance.

Another configuration builds upon the foregoing by incorporating software-controlled mechanisms to dynamically manage entropy offloading and thermal performance. In addition to the hardware-based TOU, this system includes software modules like an entropy offloading module that monitors and controls when and where entropy is transferred, a dynamic heat regulation module that adjusts thermal conditions in real time, and a performance optimization module that regulates the use of reversible logic gates based on computational loads. This invention provides enhanced adaptability, allowing processors to manage heat more efficiently while maintaining peak performance. A method for software-controlled thermal management in a high-performance computing processor can generally involve several key steps. First, real-time computational and temperature data in the processor core is continuously monitored. Based on this data, information entropy is dynamically offloaded from high-computation regions to the Thermal Output Unit (TOU) through a software-based entropy offloading module. Within the TOU, irreversible data destruction is performed, and the generated heat is dissipated. The system then adjusts the offloading rates and manages the performance of reversible logic gates by employing a dynamic heat regulation module, ensuring optimal thermal conditions and processor efficiency.

Yet another focuses on optimizing processor performance through thermal imaging-based entropy management. It employs thermal imaging or simulation to identify regions in the processor that generate excessive heat due to high gate activity and entropy conversion. These regions are retrofitted with reversible logic gates to minimize heat generation, and information entropy is offloaded to the TOU for irreversible computation and heat dissipation. The system iteratively refines processor design based on thermal data, improving performance and efficiency by continuously optimizing the thermal load distribution across the processor. A method for optimizing a high-performance computing processor based on thermal imaging and entropy management can begin by using thermal imaging or simulation to identify regions within the processor core that generate high levels of heat entropy. These high-entropy regions are then retrofitted or redesigned with reversible logic gates to reduce heat generation. Entropy from these high-activity areas is offloaded to the Thermal Output Unit (TOU), where irreversible computations are performed and the resulting heat is dissipated. The processor design is iteratively refined based on ongoing thermal simulation data, ensuring continuous optimization of both performance and thermal efficiency.

Furthermore, the invention disclosed herein presents a revolutionary solution for improving thermal management in high-performance computing systems by integrating reversible logic gates with a specialized component for managing heat generation, referred to as the Thermal Output Unit (TOU). This invention takes a novel approach to computation by incorporating reversible computing principles to reduce heat at the source. Reversible logic gates, such as Toffoli and Fredkin gates, play a central role in this system. Unlike traditional logic gates that lose information during processing, leading to the generation of heat, reversible gates preserve the information throughout the computation process, allowing the system to operate with minimized conversion to heat.

Toffoli and Fredkin gates are specialized types of reversible logic gates, which play a crucial role in reducing heat generation in computational systems, particularly in high-performance processors. These gates are fundamentally different from traditional logic gates, as they do not lose information during their operation. This characteristic makes them valuable in environments where minimizing entropy conversion and heat dissipation is essential, such as in quantum computing and advanced processor design.

The Toffoli gate, also known as a controlled-controlled-NOT (CCNOT) gate, is a three-input reversible gate. It functions by taking three inputs: two control bits and one target bit. The Toffoli gate flips the target bit only when both control bits are set to 1. If the control bits are not both 1, the target bit remains unchanged. A key feature of the Toffoli gate is that it is fully reversible; from the output, it is possible to determine the original input values. This reversibility means that no information is lost during the computation process, a quality that significantly reduces the entropy change and, consequently, the heat generated. In modern computing systems, where heat management is a critical concern, the Toffoli gate is instrumental in designing more energy-efficient and thermally stable processors. Beyond conventional processors, Toffoli gates are particularly important in the field of quantum computing, where they are used to construct complex quantum circuits.

The Fredkin gate is another example of a reversible logic gate, also operating with three inputs. In the Fredkin gate, one input acts as a control, while the other two inputs are the bits that may be swapped. If the control bit is 1, the two remaining input bits are swapped; if the control bit is 0, the bits remain in their original positions. Like the Toffoli gate, the Fredkin gate is reversible, meaning that it preserves all information from its inputs through to its outputs. This preservation of information ensures that the gate does not cause a change in information entropy, which helps to minimize the heat generated by the computation. The Fredkin gate, like the Toffoli gate, finds applications in quantum computing, where information preservation is critical, as well as in advanced processor design where reducing heat production is a growing challenge.

Both the Toffoli and Fredkin gates offer significant benefits in the design of more efficient computational systems, particularly in the context of high-performance processors. Traditional logic gates are inherently irreversible, meaning that once they process a set of inputs, much of the original information is lost, which according to Landauer's Principle, leads to conversion of the information entropy to heat. The cumulative effect of billions of bits being processed irreversibly in today's processors results in measurable heat production. This is particularly problematic in environments where high-speed and energy-efficient computation is required, such as in artificial intelligence (AI), machine learning (ML), and data centers. By contrast, reversible logic gates like the Toffoli and Fredkin gates preserve information throughout the computational process, thus reducing heat generation at the source.

In the broader context of processor design, these gates can be employed selectively in areas of high computational intensity. This targeted use allows for more effective thermal management without the need for entirely reversible processors, which suffer significant practical limitations. By strategically integrating reversible gates like Toffoli and Fredkin in critical areas, processors can achieve greater energy efficiency, sustain higher performance without overheating, and minimize the thermal throttling that can often limit processing speeds.

In summary, the Toffoli and Fredkin gates are advanced types of reversible logic gates utilized in the invention that play a pivotal role in reducing heat generation by preserving information during computation. Their ability to minimize entropy conversion to heat makes them invaluable in high-performance computing environments, quantum computing, and in addressing the thermal management challenges of modern processors.

A key feature of this invention is the selective application of reversible gates within the processor, concentrating them in areas of high computational intensity. By selectively employing these gates in key sections of the processor, the invention reduces heat generation in critical regions where traditional logic gates would normally result in a significant loss of information and a corresponding increase in heat. The goal is not to make the entire processor reversible, but rather to use reversibility strategically to manage entropy and heat generation. The invention introduces a new way of thinking about processor design by focusing on where information loss occurs and moving that loss away from sensitive areas of the processor.

The TOU is a specialized component designed to handle the inevitable destruction of information in a controlled and thermally isolated manner. While reversible gates can minimize heat by preserving information for most of the computation process, there comes a point where unnecessary information must be discarded. This is where the TOU comes into play. It serves as a dedicated entropy management unit, where irreversible operations take place, resulting in the erasure of information that is no longer needed for further computations. This process is managed away from the core computational elements of the processor, which helps to keep the processor cool and efficient.

The invention includes a system of high-bandwidth memory channel(s) that efficiently transport data between the reversible gates in the processor and the TOU. These memory channels act as the means through which entropy is offloaded from the computational regions of the processor to the TOU. This transportation of data plays a critical role in ensuring that heat is not concentrated within the main computing elements of the processor. Instead, the entropy is removed to the TOU, where it can be processed and managed in a thermally controlled environment, reducing the risk of localized overheating within the processor's core regions.

The TOU is designed with advanced thermal management features, such as heat sinks and vapor chambers, that allow it to dissipate heat effectively during the process of information erasure. Because the TOU is thermally isolated from the main processor, it can handle large amounts of entropy without negatively impacting the performance of the core computing elements. This separation of computational logic and heat management allows the processor to operate at higher speeds and with greater efficiency than would be possible in a traditional processor, where heat is generated directly within the computational cores.

The Thermal Output Unit (TOU) is an essential component in managing and dissipating heat generated by high-performance processors during irreversible computations. There are multiple ways in which the TOU can be designed and implemented, each offering unique benefits depending on the processor's specific requirements and use cases. One of the simplest and most effective ways to design a TOU is as a hardware-based unit that is physically separated from the processor core but connected via high-speed communication channels. In this configuration, the TOU is equipped with or coupled to advanced heat dissipation mechanisms such as heat sinks, vapor chambers, and liquid cooling systems. The heat sinks, typically made from highly conductive materials like copper or aluminum, absorb heat through conduction and dissipate it through convection and radiation, while vapor chambers distribute heat evenly across the TOU's surface. In extreme performance situations, liquid cooling systems can be integrated, circulating coolant either through heat sinks external to the TOU processor package or through microchannels within the TOU to remove heat and release it through external radiators.

Another design option is to embed the TOU within the same processor package, although it remains thermally isolated from the core itself. This embedded design offers tight integration while ensuring that heat generated from irreversible computations does not affect the processor core. Though the heat produced in the TOU is within the same processor package, it is physically distanced from the core of the processor, and shared cooling infrastructure, like fans or liquid coolers, can be used to manage the thermal load more effectively. Optionally, thermally isolating materials such as ceramic composites or aerogels can further isolate the TOU-generated heat from the processor. This single-package approach is particularly useful for compact designs, such as in mobile processors or embedded systems, where space is limited but thermal management remains a priority.

For multi-core processors, a distributed TOU architecture can be implemented, in which each processor core is paired with its own mini-TOU that handles entropy offloading and heat generation locally. This design allows each core to manage its own heat production, reducing the risk of thermal bottlenecks. The distributed TOUs can then be connected to a centralized heat dissipation system, which can use liquid cooling, heat pipes, or other methods to handle the overall thermal load. This approach offers scalable and precise control over the thermal output of each core, making it ideal for processors with many cores, such as those used in data centers and AI applications.

Another innovative approach involves designing the TOU with entropy buffering and delayed processing capabilities. In this arrangement, the TOU includes entropy buffers that temporarily store offloaded data before processing it. By delaying the heat-generating irreversible computations until cooling systems are more effective or the thermal load is lower, the TOU can optimize heat management. This configuration also incorporates thermal-aware scheduling software that monitors the TOU's temperature and dynamically adjusts when entropy is processed, engaging cooling resources such as liquid cooling pumps during periods of low processing activity.

A more flexible solution is a reconfigurable TOU design, which adapts its heat dissipation mechanisms and processing capabilities based on real-time system requirements. This design allows the TOU to switch between different cooling strategies depending on the system load. Under low load, passive heat sinks may suffice, while active cooling systems, such as fans or liquid coolers, can be activated under high load. Additionally, reconfigurable logic elements within the TOU optimize how entropy is processed, depending on the type and volume of offloaded data. This adaptive system could also include AI-based thermal optimization, where an AI continuously monitors the processor's thermal environment and predicts heat generation trends, adjusting the TOU accordingly to prevent heat spikes before they occur.

Another advanced implementation involves integrating thermal imaging feedback into the TOU, allowing it to monitor its own performance and the processor's thermal profile in real-time. In this design, the TOU is equipped with thermal sensors that capture real-time data on heat distribution. This feedback enables the TOU to adjust its entropy offloading and heat dissipation strategies based on current thermal conditions, ensuring that no areas of the processor experience excessive heat. Over time, this thermal imaging data can be stored and used for long-term optimization, identifying patterns in heat generation and refining the TOU's heat management strategies to improve future performance.

In conclusion, the TOU can be designed in various ways to optimize thermal management and entropy offloading, ranging from simple hardware-based units to advanced systems that incorporate AI and real-time thermal imaging. The TOU can be embedded within the processor package, distributed across multiple cores, or designed to buffer entropy and process it under optimal conditions. These diverse approaches allow the TOU to handle the thermal demands of high-performance processors efficiently, ensuring that heat generation does not limit processor performance or scalability. As processors become more powerful and computational workloads grow, and as improved fabrication technologies continue reduce the contribution of resistive losses to heat generation, the TOU will play a critical role in maintaining system efficiency and preventing overheating.

An important aspect of the invention is that it does not require a complete overhaul of the existing processor architecture. Instead, the reversible gates and the TOU can be integrated into existing IC designs without requiring a complete computing paradigm change and massive redesign. This allows for an adaptable and scalable solution that can be applied to a wide range of processors, from high-performance computing systems to mobile and embedded devices. By focusing on key areas of heat generation, the invention ensures that performance gains can be achieved without the need to redesign entire processors from scratch.

This system is particularly well-suited to high-performance applications where parallel processing and computational density are critical. In environments such as artificial intelligence (AI) processing, deep learning, and neural network inference, large amounts of data are processed simultaneously, often resulting in significant heat generation. The invention mitigates this issue by allowing for the selective use of reversible gates in the most computationally intensive areas of the processor, such as tensor cores and matrix multiplication units. This reduces the overall heat output of the processor, enabling it to maintain higher performance levels without being throttled by thermal constraints.

Another core inventive feature of this system is its adaptability to future processor designs. As processors become more powerful, with increasing numbers of cores and transistors, the problem of heat generation becomes more acute. This invention offers a scalable solution that can grow alongside the increasing complexity of modern processors. By implementing reversible gates selectively and using the TOU to manage entropy, the system can be adapted to processors with many cores, ensuring that heat management remains effective even as computational density increases.

The invention also provides significant advantages in terms of energy efficiency. Traditional processors require substantial amounts of energy to power both computations and the cooling systems necessary to prevent overheating. By reducing heat at its source through the use of reversible logic gates and entropy offloading, the invention reduces the energy required for cooling, leading to lower overall power consumption. This is particularly important in large-scale data centers, where the costs associated with cooling can be a major operational expense. By reducing the need for extensive cooling systems, this invention allows data centers to operate more efficiently, reducing both costs and environmental impact.

Furthermore, the invention addresses the challenge of maintaining the reliability and stability of processors operating at quantum-scale dimensions. As transistors shrink, they become increasingly sensitive to temperature fluctuations, which can lead to errors in computation. By reducing heat generation within the core computing elements and concentrating heat in the TOU, the invention helps to maintain stable operating conditions for transistors at these scales. This is especially important in cutting-edge processors that use advanced fabrication techniques and operate close to the limits of current semiconductor technology.

The system's ability to reduce heat generation also has important implications for mobile computing devices. In mobile devices, processors must balance performance with energy consumption and heat management. This invention provides a solution by enabling mobile processors to perform more complex computations without generating excessive heat. The reduced thermal output allows mobile devices to maintain higher levels of performance while also extending battery life, as less energy is required for cooling. This means the invention shows considerable promise for use in smartphones, tablets, and other portable computing devices where efficient thermal management is critical.

Additionally, the invention's modular design allows it to be easily integrated into edge computing environments. Edge computing requires processors to be deployed closer to users, often in environments where traditional cooling systems are not feasible. The invention's ability to manage heat at the source through reversible computing and the TOU makes it ideal for these decentralized computing architectures. By reducing heat generation and the need for external cooling, the system enables edge processors to perform efficiently in a wide range of environments, from industrial IoT (Internet of Things) applications to smart cities.

The invention is also highly flexible in its implementation. The TOU can be customized based on the specific needs of the processor and the types of computations being performed. For example, in a processor with multiple cores, the TOU could be designed to handle entropy offloading from specific cores or computational units that generate the most heat. This allows the system to be tailored to the unique thermal characteristics of each processor, ensuring that the TOU can effectively manage entropy in the areas where it is most needed.

In summary, this invention represents a significant contribution to the field of thermal management for high-performance computing systems. By integrating reversible computing principles with a specialized entropy management unit, the TOU, the system reduces heat generation at the source, enabling processors to operate more efficiently and at higher performance levels. The invention's selective use of reversible gates, combined with its scalability, energy efficiency, and adaptability to a wide range of computing environments, positions it as a key innovation for the future of processor design.

In some arrangements, to implement the invention various aspects of the invention disclosed herein, various software modules are needed to manage the various processes and features associated with thermal management, entropy offloading, and computational optimization. Below is a detailed list of various software modules that can be used:

a. Entropy Offloading Module: This module identifies when and where excess information entropy (i.e., unnecessary or intermediate data) needs to be offloaded from the processor core, specifically from the reversible logic gates. It prioritizes regions of high computational intensity for offloading entropy through the high-bandwidth memory channel to the Thermal Output Unit (TOU). Functionality: Controls and initiates the transfer of information entropy between the processor core and the TOU, ensuring smooth and efficient offloading.

b. Thermal Management Module: This module manages the process of irreversible data destruction within the TOU. It ensures that data is erased efficiently while maintaining balance between computational tasks and the TOU's heat dissipation capacity. Functionality: Regulates the entropy conversion process in the TOU, ensuring that heat generation remains within the TOU's dissipation limits.

c. Dynamic Heat Regulation Module: This module monitors real-time temperature data from both the processor core and the TOU using thermal sensors. Based on the monitored data, it adjusts computational loads and entropy offloading rates to prevent overheating and ensure optimal heat dissipation. Functionality: Dynamically optimizes the heat balance between the processor core and the TOU by controlling the flow of entropy and adjusting workloads.

d. Thermal Management Controller Software: This software operates within the TOU and manages the operation of heat sinks, vapor chambers, and other cooling elements based on real-time thermal sensor data. It adjusts the dissipation mechanisms to maintain stable temperatures within the TOU and prevent heat from impacting the processor core. Functionality: Controls all the physical heat dissipation components and regulates their performance to ensure efficient heat management.

e. Performance Optimization Module: This module ensures that the processor core operates at optimal efficiency by selectively controlling when and where reversible logic gates are used. It dynamically adjusts entropy offloading rates and computational loads based on the real-time operational intensity and thermal conditions of the processor core. Functionality: Optimizes the balance between performance and thermal management, enabling higher clock speeds without risking overheating.

f. Load Balancing Module: This module is responsible for distributing the computational workload across the processor's cores to avoid concentrating too much computational activity in any one area, which could lead to excessive heat generation. It works in conjunction with the reversible logic gates to manage heat-efficient processing. Functionality: Distributes tasks across the processor cores to prevent thermal hotspots and ensure efficient resource utilization.

g. Entropy Transfer Control Module: This module specifically controls the data transfers between the reversible logic gates and the high-bandwidth memory channels. It ensures the correct routing of unnecessary or redundant data to the TOU and coordinates the timing and priority of data transfer. Functionality: Manages the transfer of entropy between the processor core and the TOU, optimizing the flow based on workload and thermal status.

h. Thermal Monitoring Module: This module aggregates data from the thermal sensors located in both the processor core and the TOU. It provides continuous monitoring of heat levels and sends this data to the Dynamic Heat Regulation Module and the Thermal Management Controller Software. Functionality: Tracks real-time thermal status across the system, enabling other modules to make informed decisions about heat dissipation and workload management.

i. Reversible Gate Control Module: This module manages the operation of the reversible logic gates within the processor core, ensuring they function correctly to preserve information and minimize heat generation. It coordinates with the Performance Optimization Module to adjust how the reversible gates are used based on computational intensity. Functionality: Ensures the correct functioning of reversible logic gates, selectively applying them where needed to maximize energy efficiency and minimize heat.

j. Heat Dissipation Adjustment Module: This module adjusts the operation of physical cooling components such as heat sinks and vapor chambers in real-time. It works with the Thermal Management Controller Software to ensure that all physical heat dissipation systems are functioning at optimal levels. Functionality: Regulates the cooling components based on heat generation within the TOU, ensuring that heat is dissipated effectively without affecting performance.

k. Data Erasure Module (within TOU): This software is responsible for managing the final step of irreversible data destruction within the TOU. It handles the logic required to process and destroy offloaded information entropy from the processor core and ensures that information is irreversibly erased, leading to heat generation according to Landauer's Principle. Functionality: Manages the erasure of redundant data within the TOU, generating heat that is isolated from the processor core.

Various of the foregoing software modules as well as others disclosed herein collectively can manage the core processes of thermal management, entropy offloading, data destruction, and performance optimization within the system. Each module interacts with others to ensure smooth and efficient operation, balancing computational workloads with the need for effective heat dissipation.

In some arrangements, the Thermal Output Unit (TOU) is constructed from materials and components that are optimized for efficient thermal dissipation and reliable irreversible data processing. Here is a detailed breakdown of the TOU's composition:

a. Logic Gates for Irreversible Operations: The TOU contains standard logic gates—such as NAND gates, NOR gates, or multi-input AND gates, etc.—for the irreversible destruction of information. These gates perform the final data erasure, which leads to heat generation based on Landauer's Principle. The gates are fabricated from standard semiconductor materials like doped silicon to form transistors.

b. Semiconductor Substrate: The TOU is built on a semiconductor substrate, such as silicon or silicon carbide, which serves as the foundational material for fabricating the logic gates and circuits within the TOU. Silicon carbide is often preferred for its superior thermal conductivity, allowing better heat management.

c. Thermal Conductive Layers: Within the TOU, there may be layers of thermally conductive materials, such as copper or aluminum, that help to channel the generated heat away from the components. These conductive layers are integrated with the substrate and the logic circuits to efficiently dissipate heat.

d. Heat Sinks: The TOU can be equipped with or coupled to heat sinks made of materials with high thermal conductivity, such as copper or aluminum alloys. These heat sinks are attached to the key heat-generating areas within the TOU, particularly near the irreversible logic gates, to absorb and dissipate the heat produced during data destruction.

e. Vapor Chambers: To further enhance heat dissipation, the TOU can be integrated with vapor chambers, which are advanced cooling components made of sealed metal containers (usually copper or aluminum) filled with a small amount of liquid, such as water or ethanol. When heat is generated, the liquid evaporates and circulates inside the chamber, transporting heat away from the hot spots and distributing it evenly.

f. Thermally Insulating Materials: The TOU can also include thermally insulating materials, such as ceramic composites or aerogels, which are used to isolate the heat generated within the TOU from the surrounding components, particularly the processor core. These insulating materials ensure that the heat generated by the TOU does not migrate back into the processor core, maintaining its thermal integrity.

g. High-Performance Cooling Solutions: The TOU can be integrated with advanced cooling systems, such as liquid cooling loops or microfluidic cooling systems, where a coolant flows either through heat sinks external to the TOU processor package or through microchannels embedded in or around the TOU structure. These systems are designed to remove heat efficiently from high-temperature areas and direct it to external radiators for dissipation.

h. Thermal Sensors: The TOU can be equipped with thermal sensors which continuously monitor the temperature of the unit. These sensors feed real-time data to the thermal management software module, allowing the system to dynamically adjust the entropy offloading process and the operation of cooling systems.

i. Thermal Management Controller: The TOU can contain an embedded thermal management controller, which is a microcontroller or application-specific integrated circuit (ASIC) responsible for regulating the flow of heat within the TOU. It monitors the temperature data from the thermal sensors and coordinates the operation of heat sinks, vapor chambers, and other cooling elements to ensure optimal thermal performance.

In summary, the TOU can be made of a combination of high-performance semiconductor materials, thermal conductive elements (like copper or aluminum), advanced cooling technologies (such as vapor chambers and heat sinks), and thermally insulating materials. These components work together to manage the heat generated by the irreversible destruction of information, ensuring that the heat is effectively dissipated and does not impact the processor's performance.

Various potential uses of the invention include, but are not limited to:

a. High-Performance Computing (HPC): The invention is particularly well-suited for high-performance computing environments, where speed and computational power are paramount. By reducing heat at the source and preventing thermal throttling, the invention can be used to improve the performance of processors used in supercomputers, data centers, and other HPC systems. These environments demand continuous, high-speed computation, and the invention allows processors to maintain peak performance without being limited by thermal constraints.

b. Artificial Intelligence (AI) and Machine Learning (ML) Applications: AI and ML algorithms are computationally intensive, often requiring large-scale parallel processing. The invention can be used to manage the heat generated during these intensive computations, enabling faster training and inference without the risk of overheating. In AI systems, where massive amounts of data must be processed simultaneously, the invention can reduce heat buildup and improve the overall efficiency of the system.

c. Data Centers and Cloud Computing: Data centers rely on large-scale processors to handle vast amounts of data. The invention can be used to reduce the heat generated by these processors, thereby lowering the energy required to cool them. In cloud computing environments, where many hundreds or thousands of processors are running concurrently, the invention can reduce the overall energy consumption and improve system performance by allowing processors to operate at higher speeds without thermal throttling.

d. Post-Design Thermal Imaging for Hot Spot Identification to Facilitate Design Modifications or Chip/Core Alterations: One of the potential uses of the invention is in conjunction with thermal imaging techniques to identify specific areas of a processor that generate excessive heat during operation. Post-design thermal imaging can be employed to pinpoint hot spots on the chip, where certain cores or logic gates are generating more heat than others. This information can then be used to adjust the design, retrofit areas with reversible logic gates, or optimize entropy offloading strategies to further reduce heat in problematic areas. The combination of thermal imaging with the invention provides an additional layer of optimization, enabling designers to fine-tune their processors for better performance and thermal efficiency.

e. Mobile Devices and Edge Computing: In mobile devices, where power and space are limited, the invention can be used to reduce heat generation, thus improving battery life and device longevity. Mobile processors are increasingly handling more complex tasks, such as gaming, real-time data processing, and AI-based applications. The invention provides a way to manage heat in these devices without relying on bulky cooling solutions. In edge computing environments, where processing resources are deployed closer to the end-user, the invention can reduce heat generation and improve the performance of edge nodes, enabling more efficient data processing at the edge of the network.

f. Scientific Computing and Simulation: The invention can be applied to processors used in scientific computing and large-scale simulations, which often require massive computational resources. Heat management is critical in these environments, where even small delays or errors can significantly impact the results of simulations. The invention allows for faster and more reliable processing in scientific computing, enabling researchers to conduct more complex simulations with fewer thermal limitations.

g. Automotive and Embedded Systems: In automotive applications, processors are increasingly being used for advanced driver-assistance systems (ADAS) and autonomous driving technologies. These systems require reliable and efficient processors capable of handling real-time data from sensors and cameras. The invention can help reduce the heat generated by these processors, ensuring reliable performance in harsh environments such as the interior of a vehicle, where temperature variations can be significant. In embedded systems, where cooling options are limited, the invention provides a method for managing heat more effectively, improving the reliability and lifespan of the system.

In light of the foregoing, the following provides a simplified summary of the present disclosure to offer a basic understanding of its various parts. This summary is not exhaustive, nor does it limit the exemplary aspects of the inventions described herein. It is not designed to identify key or critical elements or steps of the disclosure, nor to define its scope. Rather, it is intended, as understood by a person of ordinary skill in the art, to introduce some concepts of the disclosure in a simplified form as a precursor to the more detailed description that follows. The specification throughout this application contains sufficient written descriptions of the inventions, including exemplary, non-exhaustive, and non-limiting methods and processes for making and using the inventions. These descriptions are presented in full, clear, concise, and exact terms to enable skilled artisans to make and use the inventions without undue experimentation, and they delineate the best mode contemplated for carrying out the inventions.

Reversible Logic Gate-Based Thermal Management with Dedicated Entropy Offloading Unit for High-Performance Processor: In one or more aspects, this can address the problem of heat generation by inter alia, one or more of, employing reversible logic gates in critical areas of the processor to prevent irreversible information loss in situ. The use of these gates helps minimize entropy changes, which in turn reduces the amount of heat produced during computation. The invention incorporates a Thermal Output Unit (TOU) designed to offload extraneous or intermediate data from the processor core, and where the irreversible destruction of information occurs. This process isolates heat generation from entropy conversion to the TOU, preventing it from affecting the processor core. The TOU is equipped with heat dissipation systems, such as heat sinks and vapor chambers, to ensure efficient removal of heat, allowing the processor to maintain optimal performance with a reduced risk of thermal overload.

In some arrangements, a reversible logic-gate thermal-management process for high-speed computing with dedicated thermal output based on entropy conversion by information loss includes operating reversible logic gates in processor cores. This preserves information during computations and minimizes heat generation in high-computational intensity areas of the processing cores that exceed a predetermined activity threshold. Additionally, non-reversible logic gates operate in the processor cores in non-high-computational intensity areas of the processing cores that do not exceed the predetermined activity threshold. Intermediate or unnecessary data is offloaded from the processor cores to a thermal output unit (TOU) via a high-bandwidth memory channel. In the TOU, irreversible computations are performed using layers of cascading non-reversible logic gates. This destroys the data and dissipates the generated heat based on entropy conversion due to information loss. Each of the non-reversible logic gates has more inputs than outputs.

In some arrangements, the process may involve the reversible logic gates being Toffoli gates. Or the process may involve the reversible logic gates being Fredkin gates.

In some arrangements, the process may involve the reversible logic gates including both Toffoli and Fredkin gates.

In some arrangements, the thermal output unit (TOU) is internal to an integrated circuit on which the processing cores reside. Or the TOU can be remote from an integrated circuit on which the processing cores reside.

In some arrangements, the process further comprises dynamically monitoring the computational load of the processor cores via an entropy offloading module to determine areas of high computational intensity. The entropy offloading module plays a critical role in identifying which processor cores are experiencing a high computational load and may be contributing significantly to heat generation due to entropy conversion.

In some arrangements, the entropy offloading module transfers data to the thermal output unit (TOU) only from processor cores that exceed a predetermined computational threshold. This targeted offloading ensures that only the cores generating excess heat due to high computational activity are subject to entropy management, optimizing the overall efficiency of the system.

In some arrangements, the process further comprises adjusting the offloading rates of the data from the processor cores to the TOU based on real-time temperature data monitored by a thermal management module. The thermal management module ensures that offloading rates are dynamically controlled to balance both computational performance and heat dissipation requirements.

In some arrangements, the thermal management module activates a heat dissipation mechanism, such as a heat sink or vapor chamber, to dissipate heat from the TOU after irreversible computations are performed. This mechanism ensures that heat generated by the irreversible destruction of data in the TOU is efficiently managed, preventing thermal buildup in critical system components.

In some arrangements, the process further comprises utilizing a performance optimization module to regulate the operation of reversible logic gates in processor cores based on the computational intensity and temperature data. This module allows for adjusting the balance between performance and thermal management by selectively deploying reversible logic gates in areas where heat generation is a concern.

In some arrangements, the performance optimization module prioritizes the use of reversible logic gates in areas where heat generation exceeds a predetermined threshold, reducing local entropy conversion. This prioritization allows the system to minimize heat generation by preventing unnecessary irreversible computations in regions of the processor that are more prone to overheating.

In some arrangements, the process further comprises using thermal imaging or thermal simulation data to identify regions within the processor cores where standard logic gates generate excessive heat. This data-driven approach enables the system to pinpoint specific hot spots that require thermal management intervention, improving overall system efficiency.

In some arrangements, regions identified by the thermal imaging or simulation data are retrofitted with reversible logic gates to minimize heat generation. The retrofitting of these areas ensures that regions with excessive heat are optimized for better thermal management through the use of reversible gates.

In some arrangements, data from the retrofitted regions is offloaded to the TOU for irreversible computation via high-bandwidth memory channels. These memory channels facilitate the efficient transfer of information entropy away from the processor cores, reducing the risk of localized overheating from entropy conversion.

In some arrangements, the TOU performs irreversible computations using multi-input to reduced-output non-reversible logic gates that progressively dissipate heat across multiple heat loss levels. This cascading design ensures that heat generated by entropy conversion is managed effectively within the TOU, reducing thermal impact on the processor cores.

In some arrangements, the process further comprises analyzing the performance of reversible logic gates after retrofitting based on ongoing thermal data to ensure optimized heat dissipation and computational efficiency. This continuous analysis allows the system to fine-tune its thermal management strategy, ensuring that reversible gates are functioning as intended.

In some arrangements, the processor design is iteratively refined based on the analysis of thermal data, with additional reversible gates being implemented in areas where thermal improvements are required. This iterative approach allows for the continuous enhancement of the processor's thermal management capabilities, ensuring that it remains optimized for high-performance computing tasks.

In some arrangements, A reversible logic-gate thermal-management process for high-speed computing with dedicated thermal output based on heat entropy creation from information loss begins with the operation of reversible logic gates within processor cores. These reversible gates are selectively activated in areas of high computational intensity, defined as regions exceeding a predetermined activity threshold. The reversible gates preserve input-output state mappings during computations to prevent information loss, minimizing entropy conversion and reducing the associated heat production in critical high-performance regions. Non-reversible logic gates operate in processor cores that are identified as non-high-computational intensity areas, where computational activity does not exceed the threshold. In these regions, irreversible computations proceed without concern for heat generation, allowing the system to balance performance with heat management across the processor cores by determining optimal locations for using non-reversible gates.

The process involves dynamically monitoring the computational load of each processor core in real-time through an entropy offloading module, which detects areas of high computational activity using data from load and thermal sensors distributed throughout the cores. The module continuously analyzes this data to identify areas where computational intensity causes excessive heat buildup, determining where reversible logic gates should be activated or deactivated. Intermediate or unnecessary data is offloaded from the processor cores to a dedicated thermal output unit (TOU) via high-bandwidth memory channels. The entropy offloading module prioritizes data from cores exceeding the predetermined computational threshold, transferring excess information entropy to the TOU to prevent localized heat accumulation within the cores.

The offloading rates of data from the processor cores to the TOU are adjusted based on real-time feedback from a thermal management module, which continuously monitors temperature fluctuations within the cores and the TOU. The thermal management module dynamically controls the rate and volume of entropy offloading in response to changing thermal conditions, optimizing both performance and thermal efficiency to reduce the risk of overheating or thermal throttling during intensive computations. Irreversible computations are performed within the TOU using a hierarchical arrangement of cascading multi-input to reduced-output non-reversible logic gates. Each non-reversible gate has more inputs than outputs, destroying offloaded data and generating heat through heat entropy creation due to information loss. These computations are isolated within the TOU to reduce the impact of heating on the performance of the processor cores.

The TOU's heat dissipation mechanism, which includes heat sinks, vapor chambers, and optional liquid cooling systems, is activated to efficiently dissipate the heat generated by irreversible computations. The thermal dissipation system is strategically integrated to ensure heat is managed within the TOU, preventing any thermal backflow that could negatively impact the temperature stability of the processor cores. A performance optimization module regulates the operation of reversible logic gates in the processor cores. This module continuously adjusts the use of reversible gates based on real-time computational intensity and temperature data received from the thermal management module, prioritizing activation in areas where heat generation exceeds a predetermined threshold to reduce entropy conversion while deactivating them in regions where computational intensity drops below the threshold.

Thermal imaging, thermal simulation, or other thermal analysis techniques are utilized to identify regions within the processor cores where standard non-reversible logic gates generate excessive heat. The imaging or simulation data is used to pinpoint hot spots or areas of excessive entropy conversion, which are then targeted for retrofitting or replacement with reversible logic gates. Retrofitting these hot spot regions with reversible logic gates minimizes heat generation by replacing standard irreversible gates, transforming areas prone to high heat into thermally optimized zones. This enhances overall thermal management and ensures that high-computational intensity areas do not exceed safe thermal limits.

Data from the retrofitted regions is offloaded to the TOU via high-bandwidth memory channels, where it is processed by the TOU's irreversible logic gates. These gates are specifically designed to handle excess entropy from high-intensity computations and efficiently destroy unnecessary data, ensuring that heat generated from irreversible data destruction is concentrated in the TOU rather than the processor cores. The performance of the retrofitted reversible logic gates is analyzed using the thermal management module, which continuously monitors thermal performance in real-time. This ensures that the gates are effectively reducing heat generation in retrofitted areas, and adjustments to the operational parameters of the processor cores are made to optimize both computational efficiency and thermal management.

The processor design and operation are iteratively refined based on ongoing analysis of thermal data, continuously monitoring the cores to identify additional areas that could benefit from the implementation of reversible logic gates. Further design optimizations are made to reduce overall heat generation by fine-tuning the placement of reversible gates, adjusting computational loads, or adding additional entropy offloading paths to the TOU, enhancing overall system efficiency. This process allows the processor to sustain higher computational performance over extended periods by reducing thermal throttling, maintaining stable operating temperatures, and reducing overall energy consumption. The system can operate at higher clock speeds and processing rates without overheating, performance degradation, or increased power usage, improving scalability for high-performance applications such as artificial intelligence, machine learning, and real-time data processing.

In some arrangements, a reversible logic-gate thermal-management system for high-speed computing with dedicated thermal output based on entropy conversion from information loss comprises processor cores that are configured to handle high-computational intensity tasks. Each processor core contains both reversible and non-reversible logic gates. The reversible logic gates are selectively deployed in regions of the cores that exceed a predetermined computational activity threshold to minimize heat generation by preserving input-output state mappings during computations. Non-reversible logic gates are deployed in regions where computational activity does not exceed the threshold, allowing irreversible computations to proceed in areas where heat generation is less critical.

Reversible logic gates integrated into the processor cores are designed to prevent irreversible information loss in high-computation areas, thus reducing entropy conversion and minimizing heat generation. Non-reversible logic gates are also integrated into the processor cores to handle computations in low-computational intensity regions, allowing for irreversible computations without significant thermal concerns. An entropy offloading module dynamically monitors real-time computational load and temperature data from sensors distributed across the processor cores. This module identifies areas of high computational intensity and directs intermediate or unnecessary data from these high-load areas to a thermal output unit (TOU) based on a predetermined activity threshold.

The thermal output unit (TOU) is structurally separate from the processor cores and is configured to receive data from the entropy offloading module via high-bandwidth memory channels. It performs irreversible computations on the offloaded data using a cascading arrangement of multi-input to reduced-output non-reversible logic gates, where each gate destroys the data and generates heat through entropy conversion. High-bandwidth memory channels connect the processor cores to the TOU, ensuring efficient, real-time data transfer from high-computational areas to the TOU without bottlenecks for optimal thermal management.

A thermal management module continuously monitors temperature data from sensors embedded in both the processor cores and the TOU, dynamically controlling the rate and volume of entropy offloading to optimize thermal efficiency. Heat dissipation mechanisms, integrated into the TOU, include heat sinks, vapor chambers, and optional liquid cooling systems, which manage the heat generated by the irreversible computations performed in the TOU, ensuring thermal isolation from the processor cores.

A performance optimization module is coupled to both the processor cores and the entropy offloading module. This module adjusts the operation of the reversible logic gates based on real-time computational intensity and temperature data, prioritizing the activation of reversible gates in areas where heat generation exceeds a predetermined threshold. A thermal imaging and simulation subsystem performs real-time or periodic thermal analysis of the processor cores, identifying regions where standard non-reversible logic gates generate excessive heat. This data is used to optimize the placement of reversible logic gates.

A retrofitting mechanism replaces standard non-reversible logic gates with reversible gates in areas identified as generating excessive heat, enhancing thermal management and reducing entropy conversion. A data offloading system, integrated into the processor cores and the TOU, manages the transfer of data from retrofitted regions of the processor cores to the TOU for irreversible computation.

A continuous performance monitoring module, integrated into the thermal management and performance optimization modules, analyzes the performance of retrofitted reversible logic gates and adjusts computational parameters based on real-time thermal and performance data. An iterative design refinement subsystem continually refines the design and operation of the processor cores, using ongoing analysis of thermal and performance data to identify areas for further implementation of reversible logic gates or adjustments in computational load and entropy offloading pathways.

The system incorporates both active and passive cooling components, including fans, radiators, and other solutions, to support heat dissipation in the processor cores and the TOU, maintaining safe thermal limits during high-performance operation. A system control module is responsible for coordinating the thermal management processes, including the operation of reversible and non-reversible logic gates, entropy offloading, heat dissipation, and performance optimization. It interfaces with various subsystems to ensure seamless coordination between computational tasks and thermal management.

The system also includes a processor scalability structure, enabling it to scale for different high-performance applications by adding additional processor cores and TOUs to meet growing computational and thermal demands while maintaining the same thermal management processes. The system allows high-performance computing tasks to be executed at optimal levels by reducing heat generation within the processor cores, minimizing the risk of thermal throttling, and enabling the processor to operate at higher clock speeds without overheating. Additionally, it achieves energy efficiency by reducing the need for extensive cooling resources, ensuring scalability for applications requiring sustained high computational intensity.

Reversible Logic Gate-Based Thermal Management with Software-Controlled Entropy Offloading Unit for High-Performance Processor: In one or more aspects, this can address the problem of heat generation by inter alia, one or more of, building upon the foregoing by incorporating software modules that provide dynamic control over entropy offloading and thermal performance. These software modules include an entropy offloading module that determines when and where information entropy should be transferred to the TOU, a dynamic heat regulation module that monitors real-time computational and thermal data, and a performance optimization module that adjusts the use of reversible logic gates based on computational demand and heat generation. By combining these software controls with the hardware-based TOU, this enhances adaptability and thermal efficiency, ensuring that heat generation is minimized while the processor operates at peak performance. The TOU continues to handle irreversible data destruction, while the software modules provide fine-tuned control over the entropy management process.

In some arrangements, a reversible logic gate-based thermal management system with software-controlled entropy offloading for high-performance computing comprises several key steps. The process begins by operating reversible logic gates within the processor cores to preserve information during computations, reducing heat generation in areas that exceed a predetermined computational activity threshold. In contrast, non-reversible logic gates operate in areas of the processor cores where the computational intensity does not exceed the threshold, allowing irreversible computations to proceed in regions where heat generation is less of a concern.

The system continuously monitors real-time computational and temperature data within the processor cores using embedded thermal sensors and computational load monitors. This real-time data informs the dynamic control of entropy offloading from high-computation regions of the processor cores to a thermal output unit (TOU) via a software-based entropy offloading module. The entropy offloading module prioritizes the transfer of intermediate or unnecessary data from high-computation areas, ensuring that entropy is effectively managed.

Intermediate or unnecessary data is offloaded from the processor cores to the TOU through a high-bandwidth memory channel, which ensures that excess information entropy is efficiently transferred for further processing and heat dissipation. The TOU then performs irreversible computations using layers of cascading non-reversible logic gates, each having more inputs than outputs, to destroy the offloaded data and generate heat due to entropy conversion from information loss.

The irreversible data destruction in the TOU is accompanied by integrated heat dissipation mechanisms such as heat sinks and vapor chambers, which dissipate the heat generated during the irreversible computations. Additionally, the offloading rates from the processor cores to the TOU are dynamically adjusted based on real-time feedback from a dynamic heat regulation module. This module optimizes the performance of the reversible logic gates and ensures efficient thermal management and computational performance optimization, allowing the system to operate effectively even under high-performance conditions.

In some arrangements, the thermal output unit (TOU) is internal to an integrated circuit on which the processor cores reside and is coupled to a heat dissipation component, such as a heat sink or vapor chamber, to efficiently dissipate the heat generated by irreversible computations. This arrangement allows for localized thermal management within the integrated circuit.

In some arrangements, the thermal output unit (TOU) is remote from the integrated circuit on which the processor cores reside and is coupled to a heat dissipation component, ensuring that the heat generated by irreversible computations in the TOU is dissipated distant from the processor cores to maintain optimal thermal conditions. This configuration helps protect the processor cores from thermal interference.

In some arrangements, the thermal output unit (TOU) includes multi-level cascading logic gates, where each level reduces the number of outputs compared to inputs, progressively destroying information at each level of the TOU. This structure leads to more efficient entropy management and heat dissipation as information is destroyed in stages.

In some arrangements, the thermal output unit (TOU) further comprises a dynamic heat dissipation control module that adjusts the operation of heat dissipation mechanisms based on real-time thermal data collected from temperature sensors embedded within both the TOU and the processor cores. This module ensures that heat is dissipated efficiently in response to variable workloads, optimizing the cooling process.

In some arrangements, the dynamic heat dissipation control module integrates with a liquid cooling system, wherein coolant circulates either through heat sinks external to the TOU processor package or through microchannels embedded in the TOU, providing additional heat dissipation for high-performance computational loads and preventing overheating in extreme computational conditions. This integration enhances the system's ability to manage significant heat output during intensive tasks.

In some arrangements, the software-based entropy offloading module dynamically adjusts the rate of entropy offloading from the processor cores to the TOU based on real-time temperature and computational load data. This ensures that data from high-computational areas is offloaded at optimal rates to prevent localized overheating in the cores.

In some arrangements, a performance optimization module monitors the performance of both reversible and non-reversible logic gates in the processor cores, dynamically adjusting the balance of reversible gate operations based on computational intensity and thermal conditions. This ensures that heat generation in the processor is appropriately managed while maintaining high performance across the system.

In some arrangements, the performance optimization module includes a predictive analytics component that uses machine learning algorithms to predict future thermal conditions based on historical computational data. This allows the system to proactively adjust the use of reversible and non-reversible logic gates before high thermal thresholds are reached, reducing the risk of overheating.

In some arrangements, the system includes thermal sensors within the processor package, which generate real-time thermal maps of the processor cores and the TOU. These maps allow the system to visualize areas of high heat concentration and adjust entropy offloading and gate operations to mitigate thermal stress and balance heat distribution.

In some arrangements, the real-time thermal maps generated by the thermal imaging sensors are used to retrospectively analyze the performance of the reversible logic gates, enabling iterative design adjustments. These adjustments may include the selective replacement of non-reversible logic gates with reversible gates in high-computational intensity regions that exhibit excessive heat generation.

In some arrangements, the process further comprises an iterative design refinement module that uses thermal analysis data to refine the architecture of the processor over time. This refinement progressively improves thermal efficiency by increasing the proportion of reversible gates in regions prone to heat buildup and optimizing the TOU's cascading logic gate structure to further enhance entropy offloading efficiency.

In some arrangements, the iterative design refinement module collaborates with the entropy offloading module to reallocate high-computation tasks to areas of the processor cores that have better thermal conditions, optimizing overall system performance and ensuring balanced thermal loads across all cores.

In some arrangements, the processor cores are configured with region-specific optimization, where different regions within the cores have varying degrees of reversible and non-reversible gate configurations, each tailored to the specific computational tasks handled by that region. This maximizes efficiency and minimizes heat generation.

In some arrangements, the thermal output unit (TOU) is capable of operating in both active and passive cooling modes, where passive cooling systems such as heat sinks and vapor chambers are engaged during lower computational loads, and active cooling systems such as fans and liquid cooling are additionally engaged during high-intensity workloads. This ensures adaptive and efficient thermal management based on real-time performance requirements.

In some arrangements, a reversible logic gate-based thermal management process with software-controlled entropy offloading and thermal management for high-performance computing involves operating reversible logic gates in the processor cores. These reversible logic gates are selectively activated in regions of high-computational intensity within the processor cores that exceed a predetermined activity threshold. The reversible gates preserve input-output state mappings during computations, preventing information loss, thereby reducing entropy conversion and reducing heat generation in critical high-performance regions of the cores. This enables continuous high-speed operations without throttling due to excessive heat.

In some arrangements, non-reversible logic gates operate in the processor cores in regions identified as non-high-computational intensity areas, where computational activity remains below the predetermined threshold. This allows irreversible computations to be conducted in these areas where heat generation is less of a concern, optimizing overall processing efficiency while controlling heat generation across the processor cores.

In some arrangements, real-time computational load and temperature data within the processor cores are monitored using embedded thermal sensors and computational load monitors. The data is collected by a software-based entropy offloading module, which continuously analyzes and evaluates the thermal conditions and computational intensity of each core to detect regions where computational intensity is generating excessive heat. The system dynamically adjusts performance and heat management parameters accordingly.

In some arrangements, the offloading of entropy from high-computational regions of the processor cores to a thermal output unit (TOU) is dynamically controlled via the software-based entropy offloading module. The module prioritizes the identification and transfer of intermediate or unnecessary data from regions of the processor cores exceeding a predefined computational threshold, offloading data to prevent localized heat accumulation and thermal stress within the cores.

In some arrangements, intermediate or unnecessary data is offloaded from the processor cores to the TOU through high-bandwidth memory channels, transferring data in real time to prevent delays in offloading. This optimizes the removal of entropy-generating data from the cores, ensuring that processing resources are devoted to high-priority computational tasks, while surplus data is offloaded to the TOU for irreversible processing.

In some arrangements, irreversible computations are performed in the TOU using a cascading arrangement of multi-input to reduced-output non-reversible logic gates. Each level of non-reversible logic gates in the TOU has more inputs than outputs, progressively destroying offloaded data and generating heat due to entropy conversion from information loss. Each stage in the cascade increases the efficiency of entropy destruction and minimizes the thermal load on the cores.

In some arrangements, dedicated heat dissipation mechanisms within the TOU are used. These mechanisms may comprise a combination of passive cooling systems, such as heat sinks and vapor chambers, as well as active cooling systems like liquid cooling loops and fans. These systems are designed to dissipate heat generated by the irreversible computations performed within the TOU, ensuring that heat is managed in an isolated environment and preventing thermal feedback from impacting the performance of the processor cores.

In some arrangements, the offloading rates of entropy from the processor cores to the TOU are adjusted based on real-time feedback from a thermal management module. The thermal management module continuously monitors temperature data collected from sensors embedded in both the processor cores and the TOU, dynamically optimizing the rate of entropy offloading to ensure that heat does not accumulate in the cores or the TOU, and that the system operates within safe thermal thresholds, even during high computational demand.

In some arrangements, the performance of the reversible logic gates within the processor cores is regulated through a performance optimization module. This module dynamically adjusts the activation and deactivation of the reversible logic gates based on computational intensity and thermal data in real-time. The module prioritizes the use of reversible gates in regions where computational loads exceed the predefined threshold and heat generation is a concern, while deactivating reversible gates in lower-load areas to optimize power consumption and maintain efficient system performance.

In some arrangements, the TOU is configured to be either internal or remote from the integrated circuit (IC) containing the processor cores. When internal, the TOU is thermally coupled to a heat dissipation component such as heat sinks or vapor chambers to manage localized heat production. When remote, the TOU is connected to an external heat dissipation system to handle heat dissipation away from the cores, ensuring that the thermal effects of entropy destruction do not interfere with core performance.

In some arrangements, a dynamic heat regulation module adjusts both the entropy offloading rates to the TOU and the operational performance of the reversible logic gates. These adjustments are based on continuous real-time analysis of temperature data from the thermal management module, ensuring that heat buildup is prevented in both the processor cores and the TOU, optimizing system performance for sustained high-computation tasks.

In some arrangements, multi-level cascading logic gates within the TOU progressively reduce the number of outputs compared to inputs at each subsequent level. This arrangement efficiently destroys information and converts the entropy to heat, while ensuring that the entropy is managed in a controlled and structured manner to prevent excessive heat accumulation.

In some arrangements, predictive analytics are employed within the performance optimization module. The system leverages historical computational and thermal data to predict future thermal conditions, allowing proactive adjustments to entropy offloading rates and reversible gate usage before thermal thresholds are reached. This prevents performance degradation due to overheating.

In some arrangements, real-time thermal sensors for thermal imaging are integrated within the processor cores and the TOU. The thermal imaging sensors generate detailed thermal maps that visualize regions of high computational intensity and heat generation. These maps are used to adjust the operations of the reversible and non-reversible logic gates, as well as entropy offloading rates, in real-time to balance the thermal load across the system.

In some arrangements, high-entropy regions of the processor cores identified through thermal imaging are retrofitted with additional reversible logic gates. Standard non-reversible logic gates in these areas are selectively replaced with reversible logic gates to minimize entropy conversion and heat generation. The retrofitted regions are optimized for efficient thermal management, with offloaded data transferred to the TOU for irreversible computation.

In some arrangements, the system design is iteratively refined through an iterative design refinement module. This module uses data from thermal imaging and real-time performance monitoring to continually adjust the architecture of the processor cores and TOU. Refinements may include increasing the proportion of reversible gates in high-computational regions, optimizing the cascading logic gate structures in the TOU, and improving the entropy offloading mechanisms for enhanced thermal efficiency.

In some arrangements, the balance of computational tasks across the processor cores is adjusted based on region-specific optimization. Different regions of the cores are configured with varying concentrations of reversible and non-reversible logic gates, depending on the specific computational and thermal requirements of the tasks being handled. This enables optimal heat management and computational efficiency in each region.

In some arrangements, the TOU is capable of operating in both active and passive cooling modes. Passive heat dissipation systems such as heat sinks and vapor chambers manage heat during lower computational loads, while active cooling systems such as liquid cooling and fans are activated during periods of high computational intensity. This provides adaptive thermal management that scales according to real-time system requirements.

In some arrangements, the system is capable of scaling to handle increasing levels of high-performance computing tasks. This includes the addition of processor cores, TOUs, and enhanced cooling systems to accommodate growing computational and thermal demands, ensuring that the system maintains optimal performance levels under varying workloads while preventing overheating, minimizing thermal throttling, and reducing overall energy consumption. The system is thus equipped to support applications in artificial intelligence, machine learning, real-time data processing, and other high-performance environments.

In some arrangements, a reversible logic gate based thermal management system with software-controlled entropy offloading and thermal management for high-performance computing comprises processor cores configured to execute high-computational intensity tasks. These processor cores include both reversible and non-reversible logic gates. The reversible logic gates are selectively activated in regions of the processor cores that exceed a predetermined computational activity threshold, preserving input-output state mappings during computations to prevent information loss. This minimizes entropy conversion and heat generation in critical high-performance areas. The non-reversible logic gates are deployed in regions where computational intensity is below the threshold, allowing irreversible computations to proceed in areas where heat generation is less critical.

In some arrangements, reversible logic gates are embedded within the processor cores to prevent irreversible information loss during computations in high-intensity regions. The use of these gates is dynamically adjusted based on real-time computational intensity and thermal conditions, reducing heat generation by minimizing entropy conversion. Non-reversible logic gates are also embedded within the processor cores, handling computations in regions where activity does not exceed the predetermined threshold, thus limiting heat production to lower-intensity areas and optimizing thermal balance across the processor cores.

In some arrangements, the entropy offloading module dynamically monitors real-time computational loads and temperature data from embedded sensors in the processor cores. It detects high-computation regions that exceed a predefined activity threshold and initiates the offloading of intermediate or unnecessary data from these regions to a thermal output unit (TOU) for further processing and heat management, based on the detected intensity and thermal conditions.

In some arrangements, the thermal output unit (TOU) is structurally separate from the processor cores and connected via high-bandwidth memory channels. The TOU receives offloaded data and performs irreversible computations using a cascading arrangement of multi-input to reduced-output non-reversible logic gates. Each level of cascading logic gates has more inputs than outputs, progressively destroying information and generating heat through entropy conversion, while isolating heat generation from the processor cores.

In some arrangements, high-bandwidth memory channels connect the processor cores to the TOU, enabling real-time transfer of entropy-generating data from high-computational regions to the TOU for irreversible processing. This reduces the risk of thermal overload in the processor cores and ensures efficient offloading of entropy during intense computational tasks.

In some arrangements, a thermal management module continuously monitors real-time temperature data from sensors embedded within both the processor cores and the TOU. The module dynamically adjusts the rates of entropy offloading to the TOU based on detected thermal conditions to ensure that heat generation in the processor cores remains below critical thresholds, while preventing heat buildup in the TOU by optimizing the timing and rate of irreversible computations.

In some arrangements, heat dissipation mechanisms are integrated into the TOU, comprising both passive cooling systems like heat sinks and vapor chambers, and active cooling systems, such as liquid cooling loops and fans. These mechanisms manage the heat generated by irreversible computations within the TOU, isolating thermal effects from the processor cores and ensuring optimal TOU operation regardless of computational load.

In some arrangements, a performance optimization module regulates the operation of reversible logic gates within the processor cores. The module dynamically adjusts the activation and deactivation of the reversible gates based on real-time computational intensity and thermal data, prioritizing reversible gate use in high-computational intensity regions to reduce heat generation while deactivating reversible gates in lower-load regions to optimize energy efficiency and computational performance.

In some arrangements, a predictive analytics component, integrated within the performance optimization module, uses machine learning algorithms to analyze historical computational and temperature data to predict future thermal conditions. This enables the system to proactively adjust entropy offloading rates and reversible gate usage before thermal thresholds are reached, preventing heat-induced performance degradation, and optimizing system efficiency.

In some arrangements, a thermal imaging subsystem comprises real-time thermal sensors embedded within both the processor cores and the TOU. These sensors generate detailed thermal maps of the cores to visualize regions of high computational intensity and heat generation. The thermal maps are used to dynamically adjust entropy offloading rates, reversible gate usage, and non-reversible computations in response to real-time thermal data, ensuring optimal thermal balance across the processor cores and TOU.

In some arrangements, a retrofitting mechanism selectively replaces non-reversible logic gates in high-entropy regions of the processor cores with additional reversible gates. This is done based on the thermal maps generated by the thermal imaging subsystem, transforming critical regions into thermally optimized zones with minimal entropy conversion. Offloaded data from these retrofitted regions is transferred to the TOU for irreversible computation.

In some arrangements, cascading non-reversible logic gates are embedded within the TOU and arranged in a multi-level configuration. Each level progressively reduces the number of outputs compared to inputs, efficiently destroying offloaded data and generating heat in a controlled manner. This ensures that entropy is managed efficiently within the TOU, preventing excessive heat generation while isolating thermal effects from the processor cores.

In some arrangements, an iterative design refinement module is integrated with the thermal management and performance optimization modules. The refinement module uses data from thermal imaging, real-time performance monitoring, and predictive analytics to continually adjust the architecture of the processor cores and TOU. Refinements may include increasing the concentration of reversible gates in high-computational regions, refining the cascading gate structures in the TOU, and optimizing entropy offloading pathways to improve thermal efficiency and system performance over time.

In some arrangements, a dynamic heat regulation module adjusts both the offloading rates of data from the processor cores to the TOU and the performance of the reversible logic gates. The module dynamically analyzes real-time thermal data from sensors across the system, regulating heat dissipation mechanisms within the TOU to maintain optimal operating temperatures and prevent overheating in both the processor cores and the TOU during high computational demand.

In some arrangements, the system employs a region-specific optimization architecture, wherein different regions of the processor cores are configured with varying concentrations of reversible and non-reversible logic gates. The configuration is tailored to the specific computational tasks handled by each region, ensuring optimal thermal management and computational efficiency. High-computation regions are prioritized for reversible gate operation to minimize heat generation.

In some arrangements, cooling components comprising both active and passive cooling systems are integrated into the system architecture to manage the heat generated by both the processor cores and the TOU. Passive cooling systems like heat sinks and vapor chambers dissipate heat during lower computational loads, while active systems such as liquid cooling loops and fans provide additional thermal management during high-intensity workloads, ensuring safe operating temperatures under all conditions.

In some arrangements, a system control module coordinates the overall thermal management process, including the operation of reversible and non-reversible logic gates, entropy offloading to the TOU, heat dissipation mechanisms, and performance optimization. The control module interfaces with all subsystems to ensure seamless coordination between computational tasks, heat management, and real-time monitoring of thermal conditions.

In some arrangements, a processor scalability structure enables the system to scale for different high-performance computing tasks. Additional processor cores, TOUs, and cooling systems can be added to meet growing computational and thermal demands while maintaining the same entropy offloading, thermal management, and performance optimization processes. This ensures that the system can handle increasing workloads without compromising performance or overheating.

In some arrangements, the system sustains high-performance computing tasks by dynamically managing entropy conversion and heat generation within the processor cores and TOU. This allows the system to operate at higher clock speeds and processing rates without raising the risk of thermal throttling, overheating, or performance degradation, and while reducing overall energy consumption. The system achieves this through efficient use of reversible logic gates, predictive analytics, and adaptive cooling strategies, making it suitable for applications in artificial intelligence, machine learning, real-time data processing, and other demanding computing environments.

Thermal Imaging-Based Entropy Management with Reversible Logic Gates and Thermal Output Unit for High-Performance Processor Optimization: In one or more aspects, this can address the problem of heat generation by inter alia, one or more of, using thermal observation, thermal imaging, thermal simulation or the like to identify regions of the processor(s), core(s), IC(s), etc. with high gate activity and entropy conversion. These regions, where standard logic gates generate excessive heat, are retrofitted or redesigned using lossless reversible gates to reduce heat generation. Additionally, entropy is offloaded to the TOU, where the irreversible destruction of data is performed. The invention uses thermal observation data to iteratively redesign the processor to optimize performance and heat dissipation efficiency.

In some arrangements, a thermal imaging-based entropy management design process for optimizing high-performance computing comprises using thermal imaging or simulation to identify high-entropy regions within processor cores. Once these regions are identified, they are retrofitted or redesigned with reversible logic gates to reduce heat generation. The entropy from these high-activity regions is then offloaded to the thermal output unit (TOU) for further processing. Irreversible computations are performed within the TOU using cascading non-reversible logic gates, where the generated heat is dissipated. The processor design is iteratively refined based on the thermal simulation data to continuously improve performance and thermal efficiency.

In some arrangements, the thermal output unit (TOU) is internal to the integrated circuit on which the processor cores reside. It is coupled to a heat dissipation component, such as a heat sink or vapor chamber, to efficiently dissipate the heat generated by irreversible computations. This setup allows for localized heat management within the processor package.

In some arrangements, the thermal output unit (TOU) is remote from the integrated circuit on which the processor cores reside. It is coupled to a heat dissipation component that ensures the heat generated by irreversible computations in the TOU is dissipated distant from the processor cores, maintaining optimal thermal conditions in the processor cores and isolating heat dissipation tasks from the main computational units.

In some arrangements, the thermal output unit (TOU) includes multi-level cascading logic gates. Each level progressively reduces the number of outputs compared to the number of inputs, thereby progressively destroying information at each level of the TOU. This design leads to more efficient entropy management and heat dissipation, ensuring that thermal conditions remain controlled as data is processed.

In some arrangements, a thermal management module continuously monitors real-time thermal data from sensors embedded within the processor cores and the thermal output unit (TOU). This module dynamically adjusts the operation of reversible logic gates in response to heat buildup in high-entropy regions identified by the thermal imaging system, optimizing both computational performance and heat management.

In some arrangements, the thermal management module is integrated with an entropy offloading module. This module is configured to adjust the rate of entropy offloading from the processor cores to the TOU based on real-time temperature readings. This ensures that heat dissipation is managed efficiently to prevent overheating while maintaining computational performance during intense workloads.

In some arrangements, the process further comprises a performance optimization module, which continuously analyzes computational load and thermal data to balance the use of reversible and non-reversible logic gates. This module dynamically adjusts the proportion of reversible gates in high-entropy regions to reduce heat generation while ensuring optimal computational throughput, thus enhancing both performance and thermal efficiency.

In some arrangements, the performance optimization module includes a machine learning-based predictive model that uses historical computational and thermal data to predict future thermal conditions. This allows the system to proactively adjust the operation of reversible logic gates and entropy offloading rates before thermal thresholds are exceeded, reducing the risk of overheating and thereby maintaining system performance.

In some arrangements, the thermal imaging system includes thermal sensors integrated into the processor cores and the thermal output unit (TOU). These sensors are used to generate high-resolution thermal maps that provide a detailed view of heat distribution within the processor cores. This enables more precise identification of high-entropy-conversion regions for optimization and better management of thermal conditions across the system.

In some arrangements, the thermal imaging system works in conjunction with a thermal simulation module that models the heat distribution within the processor cores over time. This simulation allows the system to predict future thermal conditions and plan for the deployment of additional reversible logic gates in regions expected to experience increased heat generation, enabling the system to stay ahead of potential thermal issues.

In some arrangements, the process further comprises a dynamic cooling system that includes both passive and active cooling components. Passive cooling systems such as heat sinks and vapor chambers are used during low-computation periods, while active cooling systems, including liquid cooling loops and fans, are dynamically engaged during periods of high computational intensity. This assists in dissipating the heat generated by the TOU and the processor cores, ensuring efficient thermal management throughout different workloads.

In some arrangements, the dynamic cooling system is integrated with the thermal management module, allowing the cooling system to adjust its operation based on real-time feedback from the thermal imaging sensors. This ensures that heat is effectively dissipated from both the processor cores and the TOU during peak workloads, maintaining optimal thermal conditions.

In some arrangements, the thermal output unit (TOU) is designed with multi-tier heat dissipation mechanisms, including heat sinks, vapor chambers, and optional liquid cooling systems. Each tier is activated based on the level of heat generated by the irreversible computations performed in the cascading logic gates, ensuring that heat is dissipated in stages to prevent overheating within the TOU.

In some arrangements, the TOU includes a modular heat dissipation architecture, allowing additional cooling systems to be attached or removed based on the evolving thermal requirements of the processor. This modular design enables the TOU to adapt to future increases in computational intensity without requiring a full redesign of the system, providing flexibility as workload demands change.

In some arrangements, the process further comprises an iterative design refinement module. Thermal data generated from the thermal imaging system is used to continually refine the placement of reversible logic gates and optimize the cascading logic gate structures in the TOU. The system makes iterative improvements to ensure that entropy is efficiently managed and heat is minimized over time, even as computational workloads increase, ensuring the system remains thermally optimized.

In some arrangements, a thermal imaging-based entropy management process for optimizing high-performance computing with reversible logic gates and a thermal output unit (TOU) begins by using thermal imaging or thermal simulation to identify high-entropy regions within the processor cores. Real-time thermal data is gathered from high-resolution thermal sensors embedded throughout the cores. These sensors generate detailed thermal maps that visualize regions of high computational intensity, heat generation, and entropy conversion caused by irreversible logic gate operations, allowing the system to precisely locate and quantify thermal hotspots prone to overheating.

In some arrangements, the high-entropy regions identified through thermal imaging or simulation are retrofitted or redesigned with reversible logic gates. These gates are installed in high-entropy areas to preserve input-output state mappings during computations, preventing information loss and significantly reducing entropy conversion and heat generation. This allows the processor cores to sustain higher computational speeds without succumbing to thermal throttling or performance degradation due to overheating.

In some arrangements, entropy is offloaded from the high-entropy regions of the processor cores to the TOU. Intermediate or unnecessary data generated during computations in high-computational regions is offloaded via high-bandwidth memory channels. The entropy offloading module dynamically adjusts the offloading rate in real time based on temperature data from the thermal sensors and the computational load of the processor cores. This ensures that entropy-generating data is efficiently transferred to the TOU for further processing before it leads to heat buildup within the cores.

In some arrangements, irreversible computations are performed in the TOU using cascading layers of multi-input to reduced-output non-reversible logic gates. The TOU is equipped with a multi-tier arrangement of gates where each gate progressively reduces the number of outputs compared to inputs, ensuring that offloaded data is destroyed during irreversible computations. This generates heat through the process of entropy conversion, with the heat generation isolated within the TOU to prevent interference with the performance of the processor cores.

In some arrangements, heat generated in the TOU is dissipated through a multi-level heat dissipation system. This system comprises both passive cooling systems, such as heat sinks and vapor chambers, and active cooling systems, including liquid cooling loops and fans. The active systems are dynamically activated based on real-time feedback from the thermal management module to ensure that heat generated by irreversible computations in the TOU is efficiently managed. Passive systems handle moderate workloads, while active systems engage when computational intensity or heat generation exceeds predefined thresholds, preventing overheating in the TOU and ensuring the system remains thermally stable even during peak workloads.

In some arrangements, the TOU is configured to be either internal or remote from the integrated circuit (IC) containing the processor cores. When the TOU is internal, it is thermally coupled to heat dissipation components such as heat sinks or vapor chambers attached to the IC, managing heat generated by irreversible computations directly within the processor package. When the TOU is remote, it is connected to a separate, external heat dissipation system that handles the thermal load away from the processor cores, allowing the processor cores to maintain optimal operating temperatures while concentrating heat dissipation outside the IC.

In some arrangements, a thermal management module continuously monitors real-time thermal data from sensors embedded within both the processor cores and the TOU. This module dynamically adjusts the operation of the reversible logic gates in the processor cores based on detected thermal conditions. The module ensures that reversible gates are activated in high-computational-entropy regions to minimize heat generation, and deactivated in lower-entropy regions to optimize computational efficiency.

In some arrangements, entropy offloading rates are adjusted based on real-time feedback from the thermal management module. The entropy offloading module controls the rate of data transfer from high-computational-entropy regions of the processor cores to the TOU, ensuring that entropy is offloaded at an optimal rate to prevent heat buildup within the cores while preventing overloading of the TOU during periods of high computational intensity. This balance ensures optimal processing speed and heat dissipation across the system.

In some arrangements, thermal sensors embedded within the processor cores and the TOU generate real-time thermal maps. These thermal maps provide detailed spatial representations of heat distribution across the cores and TOU, allowing the system to accurately pinpoint areas of high heat generation and entropy conversion. This enables the thermal management module to make more informed decisions regarding the activation of reversible gates, the rate of entropy offloading, and the engagement of heat dissipation mechanisms, thereby improving the overall thermal stability of the system.

In some arrangements, processor design is iteratively refined based on thermal simulation data and real-time feedback from the thermal imaging system. High-entropy regions of the processor cores identified through thermal simulation are retrofitted or redesigned with additional reversible logic gates. The system continually optimizes the placement of these gates to reduce heat generation while also optimizing the cascading non-reversible logic gate structures within the TOU to improve entropy destruction efficiency and heat dissipation over time. This iterative process ensures the system is continually optimized for both thermal management and computational performance as workloads evolve.

In some arrangements, dynamic cooling systems operate in conjunction with the thermal management module. Passive cooling systems, such as heat sinks and vapor chambers, are used during periods of moderate computational intensity to dissipate heat efficiently. Additional active cooling systems, such as liquid cooling loops and fans, are dynamically engaged based on real-time thermal data to provide additional cooling capacity during periods of high computational intensity. This ensures the system remains thermally stable under peak workloads without sacrificing performance.

In some arrangements, a dynamic heat regulation module controls the cooling systems based on real-time feedback from the thermal imaging system and thermal sensors. The heat regulation module adjusts the operation of the cooling systems to prevent overheating during periods of high-computational intensity while minimizing energy consumption during lower-intensity workloads. This ensures that heat is dissipated efficiently across both the processor cores and the TOU without compromising energy efficiency.

In some arrangements, a modular heat dissipation architecture is utilized within the TOU. The TOU is designed with a scalable heat dissipation structure that allows additional cooling systems to be added or removed based on the system's evolving thermal requirements. This enables the TOU to adapt to future increases in computational load or changes in processor design without requiring a complete redesign, ensuring that the system remains scalable and adaptable to the growing demands of high-performance computing.

In some arrangements, the system ensures scalability and adaptability. Both the TOU and processor cores are designed to scale based on the computational and thermal demands of the system. This allows for the addition of processor cores, TOUs, and enhanced cooling systems to meet evolving computational workloads, ensuring that the system can handle increased processing speeds and computational intensity without overheating or performance degradation.

In some arrangements, the system continually refines its architecture through an iterative design refinement module. This module uses real-time thermal data and predictive analytics to optimize the placement and operation of reversible logic gates, refine the cascading non-reversible logic gate structures in the TOU, and fine-tune entropy offloading rates and heat dissipation mechanisms. This ensures that the system maintains optimal thermal efficiency and computational performance as workloads evolve and increase in intensity.

In some arrangements, a high-performance computing system with thermal imaging-based entropy management incorporates reversible logic gates and a thermal output unit (TOU) for optimizing processor efficiency and thermal management. The system comprises processor cores, each configured to execute high-computational intensity tasks. These cores include both reversible and non-reversible logic gates. The reversible logic gates are activated in regions identified as high-computational-entropy by thermal imaging or simulation, preserving input-output state mappings during computations to prevent irreversible information loss, thereby reducing entropy conversion and heat generation. Non-reversible logic gates are deployed in lower-computational intensity regions, allowing standard irreversible computations in areas where heat generation is less critical.

In some arrangements, reversible logic gates are embedded within high-entropy regions of the processor cores and are dynamically activated and deactivated based on real-time feedback from a thermal management module. These reversible gates prevent irreversible data loss in high-computation areas to minimize heat generation, ensuring computational efficiency while preventing localized overheating.

In some arrangements, non-reversible logic gates are embedded in regions of the processor cores that do not exceed a predefined computational threshold. These gates allow irreversible computations to proceed, handling standard logic operations in areas where heat generation is not a major concern. This optimizes computational efficiency while balancing thermal loads across the cores.

In some arrangements, an entropy offloading module is configured to dynamically monitor and manage the transfer of intermediate or unnecessary data from the high-entropy regions of the processor cores to the TOU. The entropy offloading module is linked to high-bandwidth memory channels that facilitate real-time transfer of information entropy. The module continuously adjusts offloading rates based on real-time computational and thermal data, ensuring that heat is efficiently managed within the cores.

In some arrangements, the thermal output unit (TOU) is configured as a separate processing unit connected to the processor cores via high-bandwidth memory channels. The TOU performs irreversible computations using cascading layers of multi-input to reduced-output non-reversible logic gates. These gates progressively reduce the number of outputs from each stage to efficiently destroy offloaded data, generating heat through entropy conversion and isolating the heat from the processor cores.

In some arrangements, cascading non-reversible logic gates are embedded in the TOU and arranged in a hierarchical, multi-level configuration. Each level of logic gates receives data offloaded from the processor cores, progressively destroying the data and generating heat in a controlled manner that is isolated within the TOU, preventing thermal interference with the processor cores.

In some arrangements, high-bandwidth memory channels link the processor cores to the TOU, providing high-speed data transfer for entropy offloading. These channels allow intermediate or unnecessary data to be rapidly moved from high-computation regions of the processor cores to the TOU for further processing, ensuring that unwanted information entropy is offloaded before it can generate excessive heat in the processor cores.

In some arrangements, a thermal management module is responsible for continuously monitoring real-time temperature data from thermal sensors embedded within both the processor cores and the TOU. This module dynamically adjusts the operation of the reversible logic gates and entropy offloading rates based on thermal conditions, ensuring that heat buildup is minimized in the processor cores and that the TOU handles the thermal load efficiently.

In some arrangements, thermal sensors are embedded within both the processor cores and the TOU. These sensors generate high-resolution thermal maps that visualize regions of high entropy conversion and heat generation. The sensors provide real-time feedback to the thermal management module, allowing precise control over the operation of reversible gates and the rate of entropy offloading to the TOU. This ensures that heat is distributed efficiently across the system and that thermal bottlenecks are avoided.

In some arrangements, a dynamic heat regulation module is configured to manage the system's cooling components, including both passive cooling systems such as heat sinks and vapor chambers, and active cooling systems such as liquid cooling loops and fans. The dynamic heat regulation module adjusts the activation of the active cooling components based on real-time thermal data to ensure that heat generated by the TOU and processor cores is dissipated efficiently during high-intensity computational periods while reducing energy consumption during lower-computational periods.

In some arrangements, a modular heat dissipation architecture is employed within the TOU. The TOU's cooling systems are scalable and can be expanded or adjusted as thermal requirements evolve. This allows for the addition of extra cooling components, such as additional heat sinks or liquid cooling loops, without requiring a complete system redesign. This ensures that the TOU can handle future increases in computational load and heat generation without overheating.

In some arrangements, a performance optimization module is responsible for dynamically balancing the use of reversible and non-reversible logic gates within the processor cores. The module continuously analyzes real-time computational load and thermal data to adjust the ratio of reversible gates in high-computational-entropy regions, optimizing both heat generation and computational performance. The module uses predictive analytics to forecast future thermal conditions based on historical data, allowing the system to proactively adjust entropy offloading rates and gate configurations before high thermal thresholds are reached.

In some arrangements, a machine learning-based predictive model is integrated within the performance optimization module. The system leverages historical data on heat generation and computational loads to predict future thermal patterns, allowing it to adjust the activation of reversible gates and the rate of entropy offloading in real-time to prevent overheating, while maintaining optimal performance even during periods of fluctuating workload intensities.

In some arrangements, a thermal simulation module works alongside the thermal imaging sensors. The simulation module models future heat distribution based on current and predicted computational loads, allowing the system to continuously refine the placement of reversible gates and adjust the TOU's cascading logic gate structure, ensuring that heat is managed efficiently across both the processor cores and the TOU while minimizing inefficiencies in entropy conversion and information destruction.

In some arrangements, an iterative design refinement module is employed. The system continually refines its architecture based on real-time thermal feedback and data from the thermal simulation module. This allows the system to redesign or retrofit high-entropy regions with additional reversible gates, optimize the cascading logic gate structure in the TOU, and improve entropy offloading processes over time, ensuring that both the processor cores and the TOU operate with maximum thermal efficiency as computational workloads evolve.

In some arrangements, a dynamic cooling system is employed, comprising both passive and active cooling mechanisms. Passive cooling components, such as heat sinks and vapor chambers, are engaged during low-computation periods to dissipate heat from the TOU and processor cores. Additional active cooling components, such as liquid cooling systems and fans, are dynamically engaged based on real-time thermal conditions to handle peak computational workloads, ensuring that heat is managed effectively during periods of high-intensity processing without impacting overall system performance.

In some arrangements, a scalable system architecture is implemented, where the processor cores, TOU, and cooling systems are designed to be modular and scalable. This allows for the addition of new cores, TOUs, or cooling components as computational and thermal requirements grow. The architecture ensures that the system can adapt to future increases in workload without suffering from thermal throttling or overheating, maintaining optimal performance in demanding high-performance computing applications, such as artificial intelligence, machine learning, and real-time data processing.

In some arrangements, a system control module coordinates the overall operation of the system, including the activation of reversible and non-reversible logic gates, entropy offloading to the TOU, and the dynamic engagement of cooling systems. This module interfaces with the thermal management module, performance optimization module, and machine learning-based predictive model to ensure that the system maintains optimal thermal balance and computational efficiency at all times. This reduces the risk of thermal bottlenecks and ensures stable performance across varying workloads.

In some arrangements, the system is capable of continuously refining its architecture, adapting to evolving computational loads and thermal demands. It uses real time thermal data, predictive analytics, and machine learning-based models to iteratively optimize entropy management, heat dissipation, and performance. This ensures sustained high-performance computing with reduced risk of thermal throttling, overheating, or performance degradation, making the system suitable for demanding applications such as artificial intelligence, machine learning, and high-throughput data processing environments.

A person of skill in the art will recognize that one or more of the foregoing arrangements and aspects of the invention may be combined or substituted for one another as desired to implement the optimum design for a particular situation. All are within the sphere and scope of this disclosure and the claims appended hereto.

In this regard, the following description and claims, in conjunction with the drawings—all integral parts of this specification—will clarify various features and characteristics of the current technology. Like reference numerals in the figures correspond to similar parts, enhancing understanding of the technology's methods of operation and the functions of related structural elements, as well as the synergies and economies of their combinations. Some of the processes or procedures described here may be implemented, in whole or in part, as computer-executable instructions recorded on computer-readable media, configured as computer modules, or in other computer constructs. These steps and functionalities may be executed on a single device or distributed across multiple devices interconnected with one another. However, it is important to acknowledge that the drawings primarily serve for descriptive and illustrative purposes and are not intended to delineate the limits of the invention. Unless contextually evident, the singular forms of "a," "an," and "the" used throughout the specification and claims should be interpreted to include their plural counterparts.

BRIEF DESCRIPTION OF DRAWINGS

FIG. 1A depicts the prior art processor design that employs only non-reversible logic gates, leading to significant heat generation in high-computational regions. This results in localized hot spots, highlighting the relative inefficiency of traditional logic gates in managing heat during intensive computations.

FIG. 1B depicts an updated processor design where reversible logic gates are introduced into critical high-activity areas, reducing conversion of information to heat entropy and thereby reducing overall heat generation. The figure illustrates how strategic placement of reversible gates can lower thermal stress in applicable area subsets on the processor cores.

FIG. 1C depicts a variant of the processor design where the Thermal Output Unit (TOU) is placed externally to or remote from the main processor cores. This separation enables more efficient heat management by isolating irreversible operations from the main processing area, preventing heat buildup in critical regions.

FIG. 4A depicts a sample process flow for identifying high-entropy regions in the processor, replacing standard gates with reversible ones, and offloading excess entropy to the TOU. This process is designed to minimize heat in critical areas while maintaining computational efficiency.

FIG. 4B depicts another advanced process that incorporates software-controlled entropy offloading and thermal regulation modules. The figure highlights how the system dynamically adjusts offloading rates and cooling strategies based on real-time thermal feedback and computational demands.

FIG. 4C depicts a system that uses thermal imaging to detect hotspots and identify high-entropy regions for optimization. Reversible logic gates are retrofitted into these regions, reducing heat generation and improving overall processor efficiency.

DETAILED DESCRIPTION

Figure 1D:
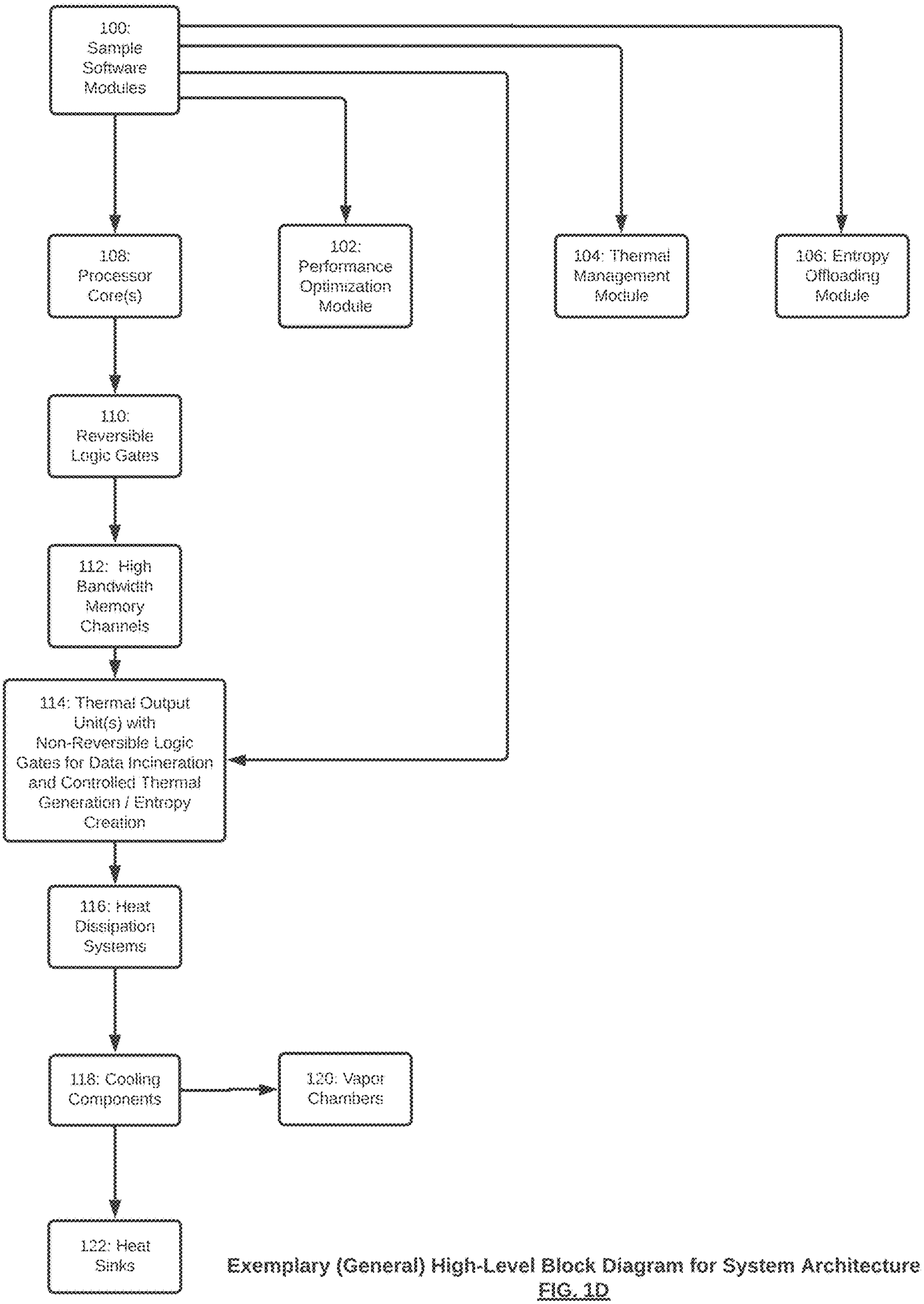
FIG. 1D depicts a high-level architecture of a sample system, showcasing the integration of processor cores with reversible logic gates, a TOU for entropy offloading, and advanced cooling mechanisms. The diagram illustrates the relationships between these components and their role in maintaining optimal performance while managing heat.

The inventions revolve around enhancing processor efficiency, particularly in high-performance computing, through thermal management and entropy conversion control mechanisms. The primary focus is on addressing heat generation at its root, rather than merely dissipating it after the fact. Heat in modern processors, especially those handling large computational loads, is a major bottleneck to achieving higher processing speeds. This is in part because traditional logic gates, used for computation, irreversibly erase information, which according to Landauer's Principle, results in entropy conversion and thus heat. As processors scale and become more complex, the heat generated becomes even more problematic, leading to performance throttling and inefficiencies.

The core innovation lies in the use of reversible logic gates, such as Toffoli and Fredkin gates, which preserve information during computation, significantly reducing information loss and thereby minimizing heat generation. This solution targets the areas of the processor that are prone to high computational intensity, where the use of reversible gates can yield the most thermal benefits. However, since the storage burden of retaining irrelevant or outdated contextual information is high, irreversible operations are still required. For this reason, such irreversible operations are offloaded to a specialized unit known as the Thermal Output Unit (TOU).

The TOU is designed to handle the heat entropy generated from irreversible computations in a controlled manner, isolating heat generating activities away from the processor's core. It employs advanced thermal management components like heat sinks, vapor chambers, and even liquid cooling systems to effectively dissipate the heat generated. By concentrating entropy offloading and irreversible operations in the TOU, the invention reduces localized overheating within the processor cores, allowing for sustained high-performance computing with a reduced risk of thermal bottlenecks.

A critical aspect of this invention is the adaptability and scalability it offers. By selectively using reversible gates in areas of high computational demand and employing the TOU for managing heat from irreversible computations, the system can be scaled for different levels of processor complexity. This modular approach allows the system to be used in various environments, from mobile devices and edge computing to data centers and quantum computing applications.

The invention also integrates real-time monitoring and dynamic management through software modules that adjust the entropy offloading and computational intensity based on the processor's thermal conditions. This includes an entropy offloading module, a dynamic heat regulation module, and a performance optimization module. These software elements continuously analyze the processor's computational load and adjust the balance between reversible and irreversible operations to maintain an optimal thermal profile.

One innovative approach discussed is the use of thermal imaging or simulations to identify hot spots within the processor. These areas can then be retrofitted with reversible logic gates, thereby reducing heat generation. This ongoing refinement based on real-time thermal data ensures that the processor architecture evolves in response to its thermal environment, leading to continual performance improvements and better thermal management.

The TOU, central to the invention, is capable of handling high levels of entropy by performing irreversible computations using standard logic gates. It is designed to be either internal to or remote from the processor package, depending on the system's needs. In extreme performance scenarios, the TOU can employ liquid cooling and other advanced thermal solutions to manage the heat generated by these computations.

This invention is especially beneficial for environments that demand high computational throughput, such as artificial intelligence, machine learning, scientific computing, and data centers. By reducing the heat generated at the source, it allows processors to run at higher speeds without overheating, thus preventing thermal throttling, which is a common limitation in high-performance computing systems.

Another significant advantage is energy efficiency. Traditional processors require substantial energy to power both computation and the associated cooling systems. By reducing the amount of heat generated during computation, this invention reduces the energy required for cooling, which is particularly important in data centers where cooling costs are a major operational expense. This reduction in energy consumption also translates to a lower environmental impact, addressing a growing concern in large-scale computing environments.

In mobile devices, the invention can lead to longer battery life and improved performance by minimizing heat generation. As mobile processors continue to handle more complex tasks, the need for efficient thermal management becomes even more critical. This invention offers a solution that allows mobile devices to perform more advanced computations with a reduced risk of overheating or rapidly draining the battery.

In edge computing, where cooling resources are limited, the ability to manage heat at the source through entropy offloading and reversible logic gates enables more reliable and efficient processing at the network's edge. This invention is particularly relevant for IoT applications and smart city infrastructure, where localized computing must be both powerful and energy-efficient.

Additionally, the invention is designed to be easily integrated into existing processor architectures. This means that manufacturers can incorporate these innovations into their processors without a complete overhaul of their designs. The system is modular and adaptable, making it feasible for use in a wide range of applications from high-performance computing to mobile and edge devices.

The scalability of the system allows it to keep pace with the increasing complexity of modern processors, making it a future-proof solution. As processors continue to incorporate more transistors and cores, this system's ability to manage heat at its source will become increasingly important for maintaining performance and ensuring the longevity of the hardware.

Overall, this invention represents a significant advancement in processor design, helping to address one of the most critical challenges in modern computing—heat generation. By employing reversible logic gates, entropy offloading, and a dedicated thermal management unit, the invention offers a scalable, energy-efficient solution for high-performance processors. It not only improves computational efficiency but also extends the life of processors by mitigating the damaging effects of heat. This makes it a promising innovation for the future of high-performance and energy-efficient computing.

The description of various example embodiments herein is intended to achieve the goals previously outlined, referencing the illustrations included in this disclosure. These illustrations depict multiple systems and methods for implementing the disclosed information. It should be recognized that alternative implementations are possible, and modifications to both structure and functionality may be made. The description details various connections between elements, which should be interpreted broadly. Unless explicitly stated otherwise, these connections can be either direct or indirect and may be established through either wired or wireless methods. This document does not aim to restrict the nature of these connections.

In various configurations, terms such as "computers" and "machines" refer to devices that may be general-purpose or specialized for specific tasks, whether physical or virtual, and capable of network connectivity. These devices encompass all necessary hardware, software, and components known to skilled practitioners, including application-specific integrated circuits (ASICs), microprocessors, cores, or other processing units. These components execute, control, or implement various types of software, instructions, data, modules, processes, or routines. The terms used do not restrict the device type and should be broadly interpreted. Software, data, and executable code can reside on various physical, computer-readable storage devices, such as local memory, cloud-based storage, or network-attached storage. These can be stored in both volatile and non-volatile memory and may function autonomously or respond to specific triggers. These elements can be consolidated or distributed across multiple devices and stored in accessible memory systems such as distributed databases, big data infrastructures, blockchains, or distributed ledgers.

Networks and similar references refer to a broad range of communication systems, from local area networks (LANs) and wide area networks (WANs) to the Internet and cloud-based networks, supporting wired and wireless configurations. Specialized networks like digital subscriber line (DSL), frame relay, asynchronous transfer mode (ATM), and virtual private networks (VPN) are included. These networks utilize various hardware and software components, including modems, routers, firewalls, switches, and adapters, to facilitate communication. Networks are also equipped with virtual IP addresses and support multiple protocols like HTTPS, enabling effective packet-based data transmission and communication.

Generative Artificial Intelligence (AI) refers to AI techniques that learn from training data and generate new content, such as text, code, images, and audio. Generative AI systems, often powered by large language models (LLMs) like GPT-3, GPT-4, Meta LlaMA, and others, can be deployed through APIs, search engines, or chatbots. These models, which may be proprietary or open-source, leverage deep learning methods and are generally governed by enterprise policies regarding AI and risk. Models such as BERT, T5, AlphaFold, Watson, Megatron, and others play a role in generating or interpreting language and content for various applications.

Generative AI and LLMs are utilized throughout this disclosure for tasks including natural language processing, data analysis, real-time processing, software development, and creative content generation. Specific functions include trend analysis, data classification, sentiment analysis, writing assistance, language translation, and decision-making support. These models enable capabilities like feedback learning, context determination, and comprehensive search operations, improving performance through iterative learning and feedback from human or system interactions. The wide range of applications supported by generative AI makes these systems a powerful tool in generating, analyzing, and managing information across diverse fields. All configurations and uses of these models are within the scope of this disclosure.

In FIG. 1A, which represents a prior art design, a sample four-core processor is depicted using traditional, non-reversible logic gates. The cores are labeled as 20, 22, 24, and 26, and are connected within an integrated circuit design. Each core experiences high activity, which is reflected in the areas marked 21, 23, 25, 27, and 29. These areas, where most logical operations occur, show significant heat generation, some of which is due to the irreversible nature of the logic gates used. This heat is concentrated in critical areas because the standard gates employed in the processor irreversibly destroy contextual information during processing, resulting in conversion of the information to heat entropy. Specifically, these high-activity regions produce localized hot spots, which correspond to the areas where the most heat is generated. The design suffers from inefficiencies in thermal management, as the heat generated by each core's activity must be handled through external cooling mechanisms. The issue here stems from the loss of information during logical operations, which inherently generates additional heat.

FIG. 1B illustrates the new design, where a thermal output unit (TOU) labeled 30A is integrated within the processor to help manage heat more efficiently. In this configuration, certain portions of the integrated circuit (IC) that experience high activity have been replaced with reversible logic gates, denoted by the numbers 32. These reversible gates are designed to operate without information loss, which in turn significantly reduces heat production in critical areas of the processor. The previously mentioned high-activity regions in the IC that generated large amounts of heat in FIG. 1A are now optimized to prevent such losses by using reversible gates. The unlabeled portions of the IC still utilize standard, irreversible gates, as these areas do not exceed the activity threshold where reversible gates would be beneficial. The result is a more balanced thermal management system, with heat generation localized only in non-critical areas. The integrated TOU serves to offload and manage entropy where irreversible operations still occur, ensuring that heat generation is minimized without needing to alter the overall computing paradigm.

FIG. 1C showcases an alternative new design, where the thermal output unit (30B) is positioned outboard, or external to the main processor circuitry. This outboard TOU is used to handle the heat generated by irreversible operations in a similar manner to FIG. 1B, but the physical separation allows for more efficient heat dissipation. High-activity portions of the IC, represented by 32, are once again replaced with reversible gates to reduce entropy and heat generation in critical areas. The unlabeled portions of the IC continue to utilize standard gates for regions of lower activity that do not require the entropy-conversion-reducing benefits of reversible logic. The outboard TOU (30B) is connected to the IC via thermal management channels, enabling heat generated by any remaining irreversible operations to be effectively managed and dissipated. This design allows for further optimization of thermal performance by keeping the heat generated by the cores away from the main processor, improving overall system efficiency and allowing the processor to operate at higher computational intensities without throttling due to overheating.

In FIG. 1D, a high-level block diagram of the system architecture is presented, offering a comprehensive view of how the different components interact to manage computation and thermal performance. The processor core(s) are labeled as 108, which represents the central processing units responsible for carrying out computational tasks. Integrated into these cores are reversible logic gates, numbered 110, which are strategically placed to minimize entropy conversion and heat generation during computational processes. These reversible gates work by preserving information during logical operations, preventing the irreversible information loss that results in conversion of the entropy to heat.

The diagram also shows high-bandwidth memory channels, labeled 112, which connect the processor core(s) to other critical components within the system. These channels play a pivotal role in ensuring efficient communication between the cores and other subsystems, such as the thermal output unit (TOU). The TOU is depicted as 114 and contains non-reversible logic gates designed specifically for data incineration and controlled thermal generation. These non-reversible gates are used when information must be irreversibly processed, resulting in the controlled conversion to heat entropy, but the heat generated by these operations is effectively managed within the TOU.

The system also includes heat dissipation systems, shown as 116, which work in tandem with the TOU to manage the heat produced by the irreversible operations. These systems utilize a combination of cooling components, labeled as 118, such as heat sinks (122) and vapor chambers (120), to ensure that the heat generated is efficiently dissipated away from the processor cores, preventing overheating and maintaining optimal performance.

Additionally, a suite of software modules, indicated by 100, is responsible for controlling various aspects of the system's operation. The entropy offloading module (106) dynamically monitors the computational load within the processor cores and directs entropy-generating data to the TOU when necessary. This prevents localized heat buildup within the cores and allows the system to maintain high computational efficiency. The thermal management module (104) works to optimize the heat balance across the system by dynamically adjusting the operation of the heat dissipation systems in response to real-time temperature data. Finally, the performance optimization module (102) ensures that the processor operates at its maximum potential by selectively adjusting the use of reversible and non-reversible logic gates based on the current computational load and thermal conditions.

In summary, FIG. 1D illustrates how the combination of reversible logic gates, high-bandwidth memory channels, non-reversible logic gates in the TOU, and an advanced thermal management system work together to create a highly efficient and scalable processor architecture. The system is capable of maintaining high levels of performance while minimizing heat generation, thanks to the strategic use of entropy offloading, dynamic thermal regulation, and advanced cooling technologies such as heat sinks and vapor chambers. The software modules that govern the system's operation provide real-time adjustments, ensuring that the processor can handle intensive workloads without being compromised by overheating.

Figure 2A:
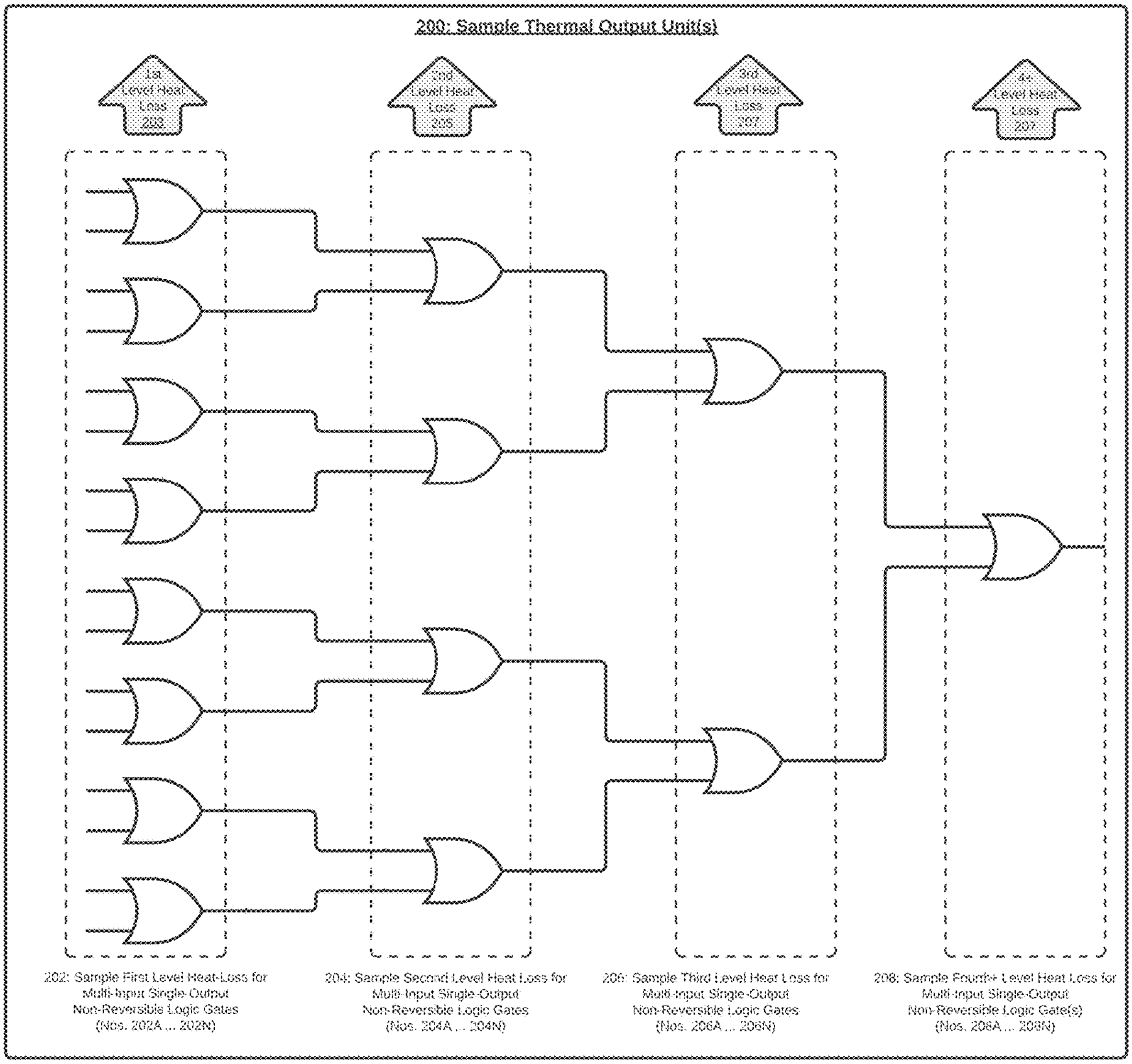
FIG. 2A depicts an idealized sample internal structure of the TOU, which uses cascading non-reversible logic gates to handle offloaded data. The figure shows how these gates progressively manage entropy and spread heat generation over multiple stages to avoid thermal overload.

In FIG. 2A, a high-level "idealized" view of a sample Thermal Output Unit (TOU) is presented, showcasing an example architecture for managing entropy and heat dissipation during the irreversible computation stages. The TOU incorporates various logic gates, which can include, for example, AND (210), NAND (212), XOR (214), OR (216), NOR (218) gates, any multiple input/reduced or single output gate (220), etc. which will perform irreversible computations. In the interest of brevity, FIG. 2A only uses NOR gates, chosen as an example as their implementation in silicon is often simple and relatively low power. These gates are identified as non-reversible logic gates, which produce heat as a result of entropy created during data processing.

The TOU is specifically optimized to manage heat loss across multiple stages, as indicated in the figure. Each level of computation within the TOU is designed to progressively dissipate heat, with the first-level heat loss represented as 203, the second-level heat loss as 205, the third-level heat loss as 207, and subsequent levels of heat loss indicated as 207 again. This tiered approach to heat management ensures that the heat entropy generated by irreversible computations is efficiently dissipated, preventing localized overheating and maintaining the thermal stability of the TOU processor.

The multi-input, reduced-output gates, such as NOR, AND, XOR, and others, are integral to the TOU's operation, as they enable the system to manage multiple streams of data simultaneously while minimizing entropy at each stage. The reduction in outputs ensures that unnecessary data is incinerated, allowing the TOU to generate heat in a controlled manner while maintaining efficient entropy management. This configuration allows the TOU to function as a centralized hub for managing the thermal load generated by the system's irreversible operations.

Figure 2B:
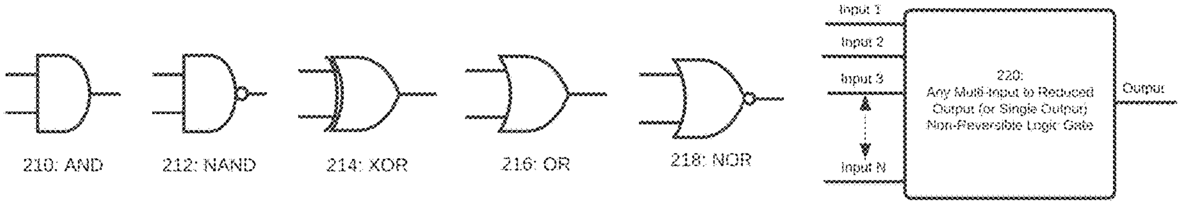
FIG. 2B depicts sample types of standard logic gates that can be used in the TOU.

In FIG. 2B, options for same standard gates that can be used in TOU's multi-level heat dissipation structure are shown. Again, irrespective of which gates or combinations thereof are used, heat is progressively managed through various stages of the TOU. At each level of the TOU, non-reversible logic gates are employed to handle data processing, with heat being generated and managed at each stage. The first-level heat loss occurs in gates identified as 202A through 202N, labeled as 202, representing the initial stage of entropy conversion and heat dissipation.

The second-level heat loss is managed by gates 204A through 204N, labeled as 204, and the third-level heat loss is handled by gates 206A through 206N, labeled as 206. Finally, the fourth and subsequent levels of heat loss are represented by gates 208A through 208N, labeled as 208. Each level of heat loss represents a progressive reduction in the amount of data being processed, as multi-input gates produce fewer outputs, ensuring that the heat entropy generated during the processing of unnecessary data is minimized.

This multi-level structure allows the TOU to effectively manage the heat generated during irreversible operations by breaking down the heat entropy generation into manageable stages. The cascading effect of heat loss across multiple levels ensures that the overall thermal load is distributed evenly and efficiently managed, preventing any single level of the TOU from becoming a thermal bottleneck. This design is critical in maintaining the processor's ability to perform high-intensity computations without being limited by thermal constraints.

In summary, FIG. 2A and FIG. 2B illustrate the detailed architecture of the TOU, showing how multi-input non-reversible logic gates are used to manage irreversible computations and dissipate heat across multiple levels. The tiered approach to heat management ensures that entropy is controlled and dissipated efficiently, allowing the processor to maintain high-performance levels without overheating. The various types of logic gates, such as AND, XOR, and OR gates, etc. are integral to this design, as they enable the TOU to handle complex computations while minimizing heat generation at each stage.

Figure 3:
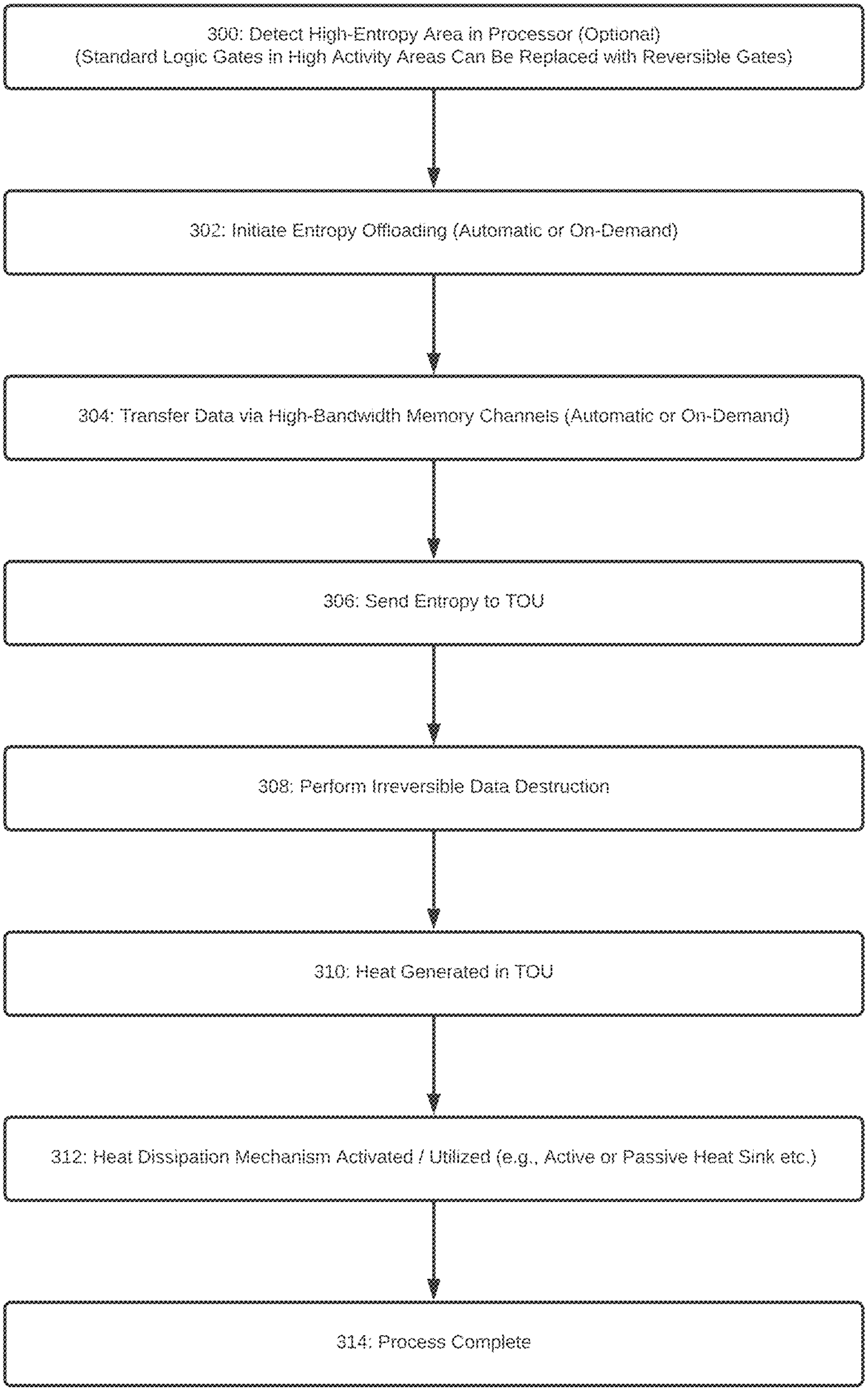
FIG. 3 depicts a sample overall entropy offloading process, beginning with detecting high-computation areas in the processor and transferring entropy to the TOU. The figure also illustrates how heat generated by irreversible computations in the TOU is managed through dedicated cooling systems.

In FIG. 3, a detailed high-level flow diagram illustrates the entire entropy offloading process, which is central to managing heat generated during high-intensity computations in a processor. The process begins at step 300, where the system detects a high-entropy area in the processor. High-entropy areas are regions where the standard logic gates are performing irreversible operations that generate significant amounts of heat due to entropy conversion. This detection can be achieved through real-time monitoring of computational loads and thermal profiles within the processor. In high-activity areas, standard logic gates that process data irreversibly are prone to generating excessive heat. The system may optionally replace these standard gates with reversible gates, which preserve information and drastically reduce entropy conversion, thus mitigating heat production. This step is particularly critical in environments where sustained high performance is required, as it allows the system to preemptively identify potential thermal bottlenecks.

Once an area of high entropy conversion has been identified, the system moves to step 302, where the entropy offloading process is initiated. The initiation of this process can occur automatically, triggered by predefined conditions such as when the processor reaches certain thermal thresholds, or when computational intensity exceeds an acceptable limit. Alternatively, the process can be either always-on, or manually initiated, allowing system operators or control mechanisms to activate offloading based on real-time conditions or specific system needs. This flexibility ensures that the system can respond dynamically to changing computational and thermal environments.

At step 304, the system begins transferring the information entropy, consisting of unnecessary or intermediate data, through high-bandwidth memory channels. These channels are optimized for rapid data transfer, ensuring that offloading occurs without introducing latency that could slow down the processor. The high-bandwidth memory channels serve as a critical link between the high-computation-entropy areas in the processor and the Thermal Output Unit (TOU), allowing for swift and efficient data offloading. This step ensures that unwanted data is quickly removed from the processor cores for destruction elsewhere, preventing localized overheating that could lead to thermal throttling or a reduction in performance.

Step 306 marks the point where the offloaded entropy is directed to the TOU, a dedicated component designed specifically for entropy management. The TOU functions as an isolated area where irreversible computations, such as the destruction of unnecessary data, are performed. This ensures that entropy conversion to heat is managed away from the critical processing areas of the system, allowing the processor to maintain high computational efficiency without being impacted by the heat generated from irreversible operations.

In step 308, the TOU performs the irreversible data destruction process using non-reversible logic gates. Unlike reversible gates, which minimize entropy conversion by preserving information, non-reversible gates inherently generate heat due to the irreversible nature of their operations. This step is vital because it allows the system to manage excess data, eliminating it in a controlled environment. As data is destroyed, heat entropy is created and dissipated from within the TOU. This process is carefully controlled to ensure that the heat generation is localized to the TOU and does not affect the performance of the main processor cores.

Step 310 illustrates the generation of heat as a result of the entropy conversion during data destruction. The TOU is specifically designed to manage this heat, limiting it to a thermally isolated area. By confining heat generation to the TOU, the system prevents the processor cores from being affected by thermal fluctuations, allowing them to operate at optimal performance levels without the risk of overheating. The ability to localize heat within the TOU is a key advantage of this architecture, as it separates the computationally intensive tasks from the heat management tasks.

To manage the heat generated in the TOU, step 312 involves the activation of heat dissipation mechanisms. These mechanisms can include both active and passive cooling solutions, depending on the thermal requirements of the system. Active cooling solutions, such as fans, liquid cooling systems, or pumps, provide immediate and powerful responses to heat generation by moving heat away from critical areas. On the other hand, passive cooling solutions, like heat sinks or vapor chambers, are designed to absorb and dissipate heat without relying on mechanical systems, offering a quieter and energy-efficient way to manage thermal load. The combination of active and passive cooling mechanisms ensures that the system can respond dynamically to the heat generated in the TOU, maintaining thermal equilibrium and preventing overheating.

Finally, step 314 signals the completion of the process. Once the information entropy has been successfully offloaded, destroyed, and the heat dissipated, the system returns to its normal operational state, ready to handle new computational tasks. This step marks the end of the current entropy offloading cycle, ensuring that the processor is now operating at an optimal thermal level, free from the excess heat that was generated by high-entropy-conversion operations.

The overall flow in FIG. 3 illustrates a robust and efficient method for managing the heat generated by irreversible computations in modern processors. By detecting high-entropy areas, offloading unnecessary data, managing heat in a dedicated Thermal Output Unit, and using advanced cooling mechanisms, the system ensures that the processor can maintain high performance without being constrained by thermal limitations. The integration of both automatic and on-demand controls provides flexibility, enabling the system to adapt to a variety of computing environments and performance needs. This process not only helps prevent overheating but also enhances the overall longevity and reliability of the processor by keeping thermal stress in check during peak operations.

In FIG. 4A, an exemplary sequence diagram illustrates the reversible logic gate-based thermal management system that employs a dedicated entropy offloading unit (TOU) for high-performance processors. The diagram provides a clear visual representation of the step-by-step process involved in identifying high-computational areas, implementing reversible logic gates, and managing heat generation and dissipation.

The process begins at step 400, where the system identifies high-computational areas within the processor core. These areas are regions of intense data processing that generate significant amounts of heat due to the irreversible nature of standard logic gates. The identification of these high-computational zones is crucial, as they are potentially significant contributors to heat generation, and managing their entropy is key to maintaining system performance.

Once these high-computational areas are identified, the system moves to step 402, where it selects reversible logic gates to replace the standard gates in these regions. Reversible logic gates are chosen because they preserve input-output state mappings during computations, preventing irreversible information loss. By reducing entropy changes, these gates minimize the amount of heat generated, making them ideal for use in high-activity areas.

At step 404, the selected reversible logic gates are implemented into the high-computational areas. This step involves physically replacing the standard gates with reversible ones, ensuring that the processor can now handle the same computational loads while generating less heat. The reduction in heat generation is a direct result of the entropy-preserving nature of the reversible gates, which allows the processor to perform at a high level without creating thermal bottlenecks.

After the reversible logic gates are implemented, the system begins the entropy offloading process, starting at step 406. During this phase, extraneous or intermediate data, which would need to be discarded causing entropy conversion, is offloaded from the processor core to the TOU via high-bandwidth memory channels. This offloading process is critical for managing the data due for destruction, which must be achieved through irreversible computations.

Step 408 involves the actual transfer of data from the processor core to the TOU. The high-bandwidth memory channels facilitate this transfer, ensuring that the entropy is efficiently removed from the core without slowing down the system's performance. The rapid transfer of data is essential for preventing overheating in the processor core, as it ensures that heat-generating operations are isolated within the TOU.

Once the data reaches the TOU, step 410 begins, where irreversible computations are performed. The TOU is specifically designed to handle these operations, and by isolating them from the processor core, it ensures that heat generated during this phase is confined to the TOU. This step is crucial for keeping the processor core cool and operational while still performing the necessary irreversible computations required for certain data processing tasks.

Following the irreversible computations, heat is generated within the TOU, and step 412 addresses this by initiating the heat dissipation mechanism. This can involve various systems, such as heat sinks or vapor chambers, designed to absorb and dissipate the thermal energy produced during entropy conversion. These mechanisms are integrated into the TOU to ensure that the heat does not affect the performance of the processor core.

Finally, at step 414, the heat dissipation process is executed. The thermal dissipation mechanisms work to relieve the heat generated by the irreversible computations, ensuring that the TOU remains cool and preventing thermal feedback into the processor core. This step is vital for maintaining the long-term performance and reliability of the processor, as it prevents heat buildup that could lead to thermal throttling or hardware damage.

The notes accompanying FIG. 4A emphasize the importance of reversible logic gates in key areas of the processor to prevent irreversible information loss and reduce heat generation. The reversible gates preserve the input-output state mappings, ensuring that entropy is minimized, while the TOU isolates heat production away from the core. By combining this system with advanced heat dissipation technologies such as heat sinks and vapor chambers, the system maintains the processor's optimal performance even during high-intensity computational tasks.

In FIG. 4B, an exemplary sequence diagram expands upon the reversible logic gate-based thermal management system introduced in FIG. 4A by incorporating advanced software-controlled entropy offloading for high-performance processors. This enhanced design adds software modules that dynamically manage the entropy offloading process and thermal performance, providing real-time adaptability to the system. The inclusion of these modules allows for more precise control over heat generation and dissipation, which is critical in maintaining optimal processor performance during high computational loads.

The process begins with the monitoring of computational data in step 430. The entropy offloading module continuously monitors the processor core's activity levels, focusing on areas where high computational intensity may lead to excess heat generation. This real-time data collection allows the system to stay ahead of potential thermal issues, ensuring that it can respond dynamically to changes in workload.

At the same time, in step 432, the dynamic heat regulation module monitors temperature data from the processor. This step ensures that thermal conditions are continuously tracked, allowing the system to make informed decisions about when and where to offload entropy and adjust computational operations. By integrating real-time thermal monitoring, the system can detect when heat levels rise to a point that could affect performance and initiate preventive measures.

Once the computational and thermal data have been gathered, the entropy offloading process continues with step 434, where the data is sent to the TOU (Thermal Output Unit). This step involves the transfer of entropy-related data from the processor core to the TOU, similar to the process described in FIG. 4A. However, in this system, the software modules provide an added layer of control by adjusting the timing and rate of offloading based on the computational and thermal conditions.

Step 436 involves a decision process regarding the offloading rates. The system determines how quickly or slowly entropy should be offloaded based on the current computational load and the temperature data it has received. This dynamic adjustment allows an optimal balance between performance and heat management, as it ensures that entropy is offloaded at a rate that prevents overheating without negatively affecting the processor's computational efficiency.

Once the offloading rate decision has been made, the system moves to step 438, where the offloading rates are adjusted in real-time. This ensures that the entropy offloading process can scale up or down depending on the immediate needs of the processor, allowing the system to handle varying levels of computational intensity without causing unnecessary delays or thermal issues.

At step 440, the entropy offloading module offloads the entropy data from the processor core to the TOU. This step involves transferring the extraneous data via high-bandwidth memory channels, ensuring that the entropy is removed efficiently and quickly. The TOU processes the data by performing irreversible computations, generating heat in a controlled manner, and isolating the resulting thermal load from the processor core.

Simultaneously, the system analyzes the performance of the reversible logic gates in step 442. This step ensures that the reversible gates are functioning as intended, reducing entropy conversion and minimizing heat generation in the areas of the processor core where they are implemented. The software modules use real-time data to evaluate the efficiency of these gates and make any necessary adjustments to optimize their performance.

At step 444, the dynamic heat adjustment is triggered. The software modules make real-time adjustments to the system's heat dissipation mechanisms, such as fans or liquid cooling systems. By dynamically controlling these cooling components, the system can maintain optimal thermal conditions and prevent any excess heat from impacting the performance of the processor cores.

Finally, in step 446, the system adjusts the performance of the reversible logic gates based on the real-time data from the computational and thermal monitoring processes. This allows the system to fine-tune the use of reversible gates, ensuring that they are employed efficiently to reduce heat generation in critical areas without compromising the overall performance of the processor.

The notes accompanying FIG. 4B emphasize the adaptability and precision of the system, highlighting the role of software modules in controlling the entropy offloading process and thermal regulation. These modules include an entropy offloading module, a dynamic heat regulation module, and a performance optimization module. The TOU processes offloaded data similarly to FIG. 4A but benefits from enhanced control through software, which dynamically manages the offloading rates and heat dissipation. This software-controlled system ensures that the processor can maintain high performance while minimizing heat generation and preventing overheating through precise, real-time adjustments.

In FIG. 4C, an exemplary sequence diagram showcases a thermal imaging-based entropy management system that utilizes reversible logic gates and a Thermal Output Unit (TOU) to optimize the performance and heat dissipation efficiency of high-performance processors. This system relies on thermal observation methods, such as thermal imaging, simulations, or similar techniques, to identify regions of the processor that are prone to generating excessive heat due to high gate activity and entropy conversion. The insights gained from this thermal data allow for precise interventions in the processor's architecture to reduce heat generation and optimize performance.

The process begins at step 460, where thermal imaging, simulation, or thermal observation is used to identify high-entropy regions within the processor core. These are areas where standard, non-reversible logic gates are generating significant heat due to the irreversible destruction of data. Thermal imaging or simulation enables the system to visually detect hotspots, highlighting which parts of the processor are contributing the most to entropy conversion and heat generation. By mapping these regions, the system can target them for optimization.

Once the high-entropy regions have been identified, step 462 involves retrofitting or redesigning these areas using reversible logic gates. This step is critical because reversible gates prevent the irreversible loss of information that typically leads to entropy conversion and heat generation. By replacing the standard gates with reversible ones, the system ensures that the processor can handle intensive computational loads without producing as much heat. This retrofit or redesign can be an iterative process, allowing for ongoing improvements as more thermal data is collected.

In step 464, the system reduces heat generation in the identified regions. The reversible logic gates, once implemented, preserve the input-output state mappings during computations, significantly lowering entropy changes and, as a result, minimizing heat production. This step is crucial for maintaining the processor's performance under high loads, as it prevents overheating in critical areas without compromising the system's computational efficiency.

Step 466 begins the process of offloading entropy to the TOU. In regions where irreversible computations are still necessary, information entropy that cannot be eliminated by reversible gates is offloaded to the TOU through high-bandwidth memory channels. The TOU is a dedicated unit responsible for handling the heat entropy generated during these irreversible operations, ensuring that the heat generated from entropy conversion is isolated from the processor core.

Once the entropy is offloaded, step 468 involves performing irreversible computations within the TOU. These computations are handled by non-reversible logic gates in the TOU, where the destruction of unnecessary data generates heat in a controlled environment. By isolating these computations from the processor core, the system ensures that heat generated during irreversible operations does not affect the core's performance.

At step 470, the heat generated by the irreversible computations in the TOU is dissipated. The system activates thermal dissipation mechanisms such as heat sinks, vapor chambers, or active cooling systems to remove the heat generated during entropy destruction. These cooling systems ensure that the TOU remains within optimal temperature ranges, preventing heat from building up and negatively impacting the overall system.

The final step, 472, involves refining the design of the processor using the thermal data collected during the process. The thermal observation data can be used iteratively to redesign the processor or integrated circuit (IC) to improve its performance and enhance heat dissipation efficiency. This iterative refinement allows for ongoing optimization, ensuring that the processor remains capable of handling high computational loads while minimizing heat generation and improving thermal management.

The notes accompanying FIG. 4C emphasize the importance of using thermal observation data to identify areas of high entropy conversion and to retrofit or redesign those areas with reversible logic gates. This process reduces heat generation and offloads remaining entropy to the TOU for controlled data destruction and heat dissipation. The ability to use thermal imaging data to iteratively refine the processor design ensures that the system can continuously improve its performance and thermal efficiency over time, adapting to changing computational demands and minimizing the risks of overheating.

Figure 5A:
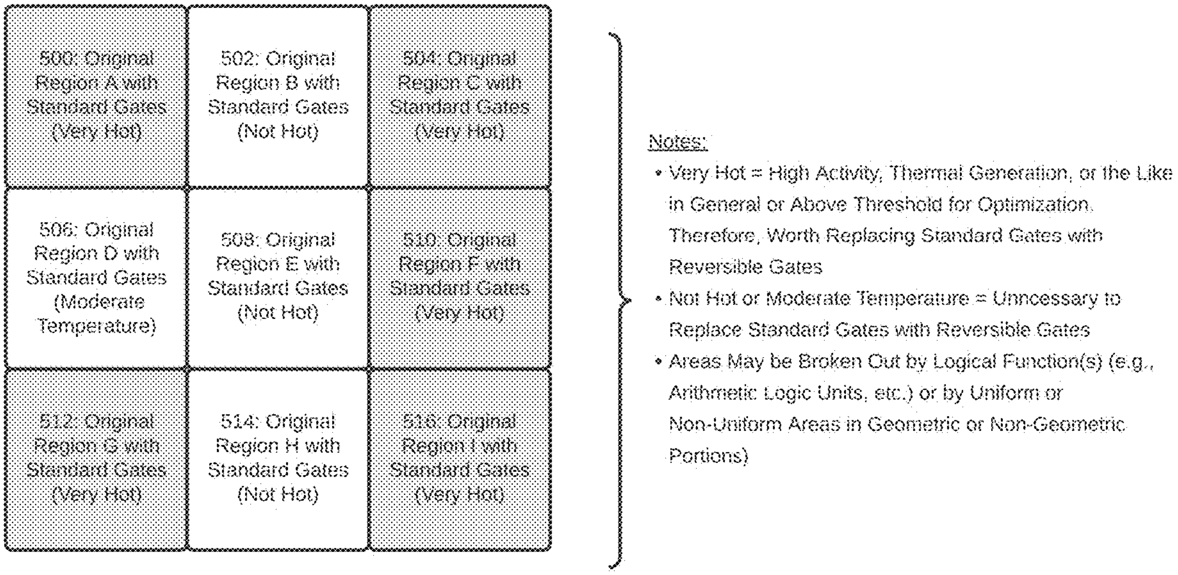
FIG. 5A depicts a thermal heat map of a processor designed with non-reversible logic gates, showing areas of significant heat buildup due to high computational activity. This figure visually represents the relative inefficiency of traditional gate designs in managing heat during intense operations.

In FIG. 5A, the thermal or heat map offers a detailed view of the heat generation across different regions of a processor designed using traditional, non-reversible logic gates. Each region within the processor experiences varying degrees of heat buildup depending on the computational activity and the inherent inefficiency of standard logic gates, which generate heat entropy and lead to significant thermal challenges. Region A (500) is marked as "Very Hot," indicating that this area is experiencing substantial computational activity and generating excessive heat. This "Very Hot" designation suggests that the standard gates in this area are under high stress, performing numerous irreversible computations that result in considerable entropy conversion. The heat generated in this region poses a problem, as it risks causing localized overheating, which can lead to thermal throttling or even damage to the processor over time if not managed effectively.

Region C (504) is similarly marked as "Very Hot," indicating that this part of the processor is also experiencing significant heat generation. Like Region A, this area likely handles intensive computational tasks, and the use of standard, non-reversible logic gates is contributing to excessive heat entropy. The presence of such "hotspots" in the processor design is a clear indicator that these areas require optimization to prevent overheating and improve thermal efficiency.

Region F (510), Region G (512), and Region I (516) are also marked as "Very Hot," showing that these areas are experiencing high thermal loads due to heavy computational activity. The pattern seen across multiple regions of the processor demonstrates that the heat issue is not isolated to one or two parts but is spread throughout the chip, especially in areas where standard gates are performing high-intensity operations. In these regions, heat generation is a significant concern, as it puts additional pressure on the cooling systems and limits the processor's ability to perform at peak efficiency.

In contrast, other parts of the processor, such as Region B (502), Region E (508), and Region H (514), are labeled as "Not Hot," suggesting that these areas are not experiencing high levels of computational activity or heat entropy generation. These regions are likely handling less complex or less frequent operations, which is why standard logic gates are still sufficient here. The low thermal output in these regions means they are not contributing significantly to the overall heat management challenges faced by the processor.

Region D (506) is marked as being at a "Moderate Temperature," indicating that while it is generating some heat, the levels are not as critical as those seen in the "Very Hot" regions. This region may still benefit from thermal management interventions but does not represent an immediate concern for overheating. The heat map in FIG. 5A provides a clear snapshot of where thermal management is most needed, pointing out the specific regions where the current design is insufficient for handling the processor's demands.

Figure 5B:
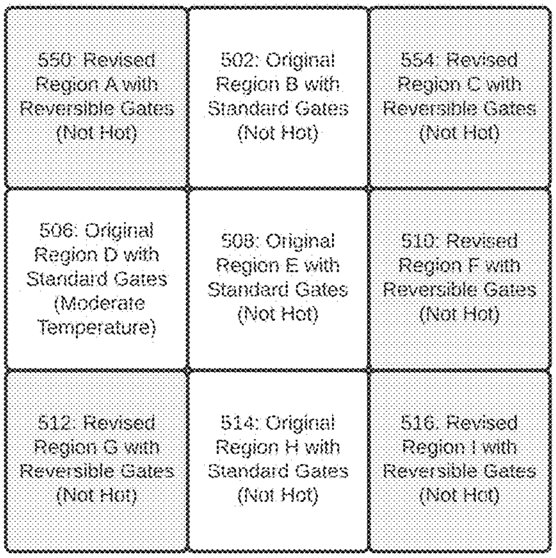
FIG. 5B depicts a redesigned thermal heat map, where reversible logic gates have been strategically placed in high-computation regions to reduce heat generation. The figure demonstrates the effectiveness of reversible gates in improving thermal performance and lowering the overall heat load on the processor.

In FIG. 5B, the thermal or heat map shows a redesigned version of the processor, where key regions have been retrofitted with loss-less or reduced-loss reversible logic gates. This redesign addresses the heat issues identified in FIG. 5A by replacing standard gates with reversible ones in the areas that were generating excessive heat. Reversible gates are fundamentally different from standard gates in that they preserve input-output state mappings, which eliminates the change in information entropy and, by extension, this form of heat generation.

Revised Region A (550), for example, was marked as "Very Hot" in FIG. 5A but is now labeled as "Not Hot" in FIG. 5B. This change illustrates the effectiveness of replacing standard gates with reversible gates in high-computational regions. The implementation of reversible logic gates has successfully reduced heat generation in this area, preventing it from becoming a hotspot and allowing the processor to operate at a cooler, more stable temperature. The same improvement can be seen in Revised Region C (554), which has similarly cooled from "Very Hot" to "Not Hot" following the introduction of reversible logic gates.

Revised Region F (510), Revised Region G (512), and Revised Region I (516) have also been upgraded with reversible gates and are no longer classified as "Very Hot." These regions, which were previously critical heat-generating areas, have been optimized to significantly reduce local entropy conversion, thereby eliminating the thermal concerns that plagued the original design. The introduction of reversible logic gates in these high-activity regions has not only reduced heat but also allowed for more efficient processing without the need for extensive external cooling measures.

Meanwhile, other regions of the processor, such as Region B (502), Region E (508), and Region H (514), remain unchanged between the two diagrams. These regions were already marked as "Not Hot" in FIG. 5A, meaning they did not require any retrofitting with reversible gates. Since these regions did not contribute significantly to the overall heat generation, the design decision to leave them unchanged demonstrates that the thermal optimization efforts were focused solely on the areas that posed the greatest risk of overheating.

Region D (506) continues to exhibit a "Moderate Temperature" in FIG. 5B, suggesting that this region did not require extensive redesign. The moderate heat levels in this region are manageable within the processor's existing thermal management system, and the introduction of reversible gates would not significantly impact thermal performance in this part of the chip.

The accompanying notes for FIG. 5B explain that regions identified as "Very Hot" in the original processor design—due to high activity and thermal generation—were prime candidates for being replaced with reversible gates. These areas exceeded the threshold for optimization, making the use of reversible gates essential for improving thermal performance and maintaining processor efficiency. On the other hand, regions marked as "Not Hot" or "Moderate Temperature" were not prioritized for redesign, as they did not contribute significantly to the processor's heat challenges.

The revised heat map in FIG. 5B shows how thermal management can be significantly improved through the selective replacement of standard logic gates with reversible ones. The result is a cooler processor that can handle high-intensity computational loads without the risk of overheating, thereby improving both performance and energy efficiency. The retrofitting of critical regions with reversible gates eliminates the hotspots identified in FIG. 5A and allows the processor to perform at higher levels without being constrained by thermal limitations.

This detailed comparison between FIG. 5A and FIG. 5B highlights the advantages of using reversible logic gates in modern processor design. By reducing entropy conversion and minimizing heat generation in key areas, the redesigned processor can operate more efficiently, preventing the risk of thermal throttling and ensuring that the system remains cool under high-performance conditions. This approach to thermal management offers a scalable solution that can be applied to various processor architectures, making it a significant innovation for the future of high-performance computing.

Figure 6:
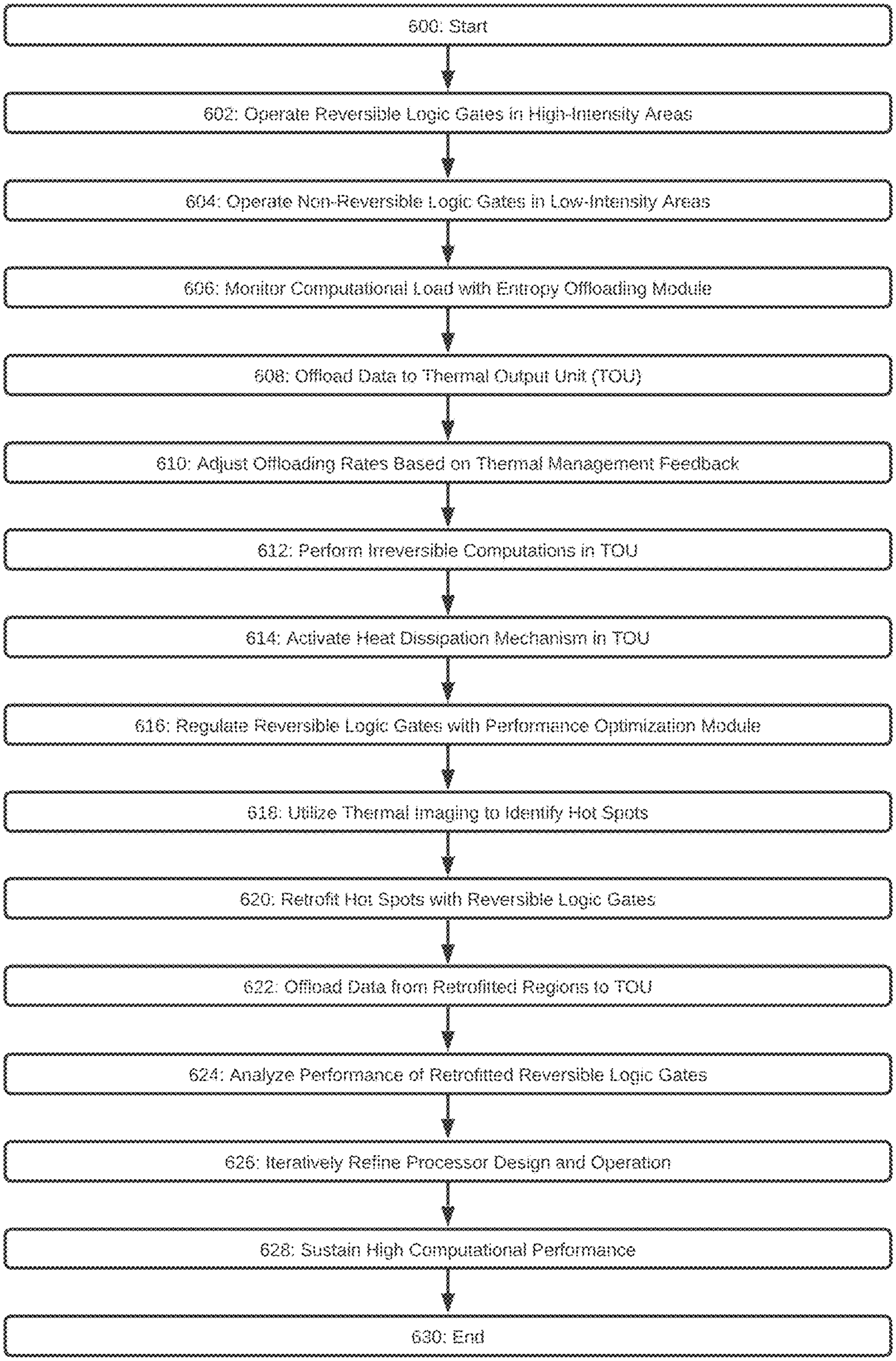
FIG. 6 depicts a sample detailed step-by-step process of managing entropy and heat in a high-performance processor through the use of reversible logic gates and the TOU. The figure also highlights how the system dynamically adjusts entropy offloading and cooling mechanisms based on real time thermal data.

In FIG. 6, the depicted process outlines a robust approach to managing the thermal performance of a high-performance processor by leveraging reversible logic gates and a dedicated entropy offloading unit (TOU). The process begins at step 600, marking the start of the thermal management sequence. This initiates a series of steps aimed at efficiently handling the computational load while preventing excessive heat generation.

At step 602, the system operates reversible logic gates in high-intensity areas of the processor. These gates are used in regions where computational activity is intense and entropy conversion is typically high. The reversible logic gates are specially designed to preserve input-output state mappings, eliminating information destruction during computation and therefore reducing the amount of heat generated. By deploying reversible gates in these critical areas, the system ensures that high-intensity computations can be carried out without some of the usual thermal challenges posed by irreversible logic gates.

In contrast, step 604 governs the operation of non-reversible logic gates in lower-intensity areas of the processor. These areas do not experience the same computational loads as high-intensity regions, so the use of non-reversible gates here is sufficient without posing significant thermal risks. These standard gates handle less complex operations and do not generate excessive heat, allowing the system to balance performance and efficiency.

At step 606, the system monitors the computational load using an entropy offloading module. This module continuously tracks the workload across the processor and identifies when and where entropy exceeds predefined thresholds. By monitoring computational intensity in real time, the module ensures that areas generating too much heat entropy can be managed efficiently, preventing localized overheating.

Once entropy build-up is detected, the process moves to step 608, where data is offloaded from high-intensity regions to the TOU. The offloading process ensures that heat-generating operations are transferred to the TOU via high-bandwidth memory channels, effectively removing the need for data destruction and its corresponding heat output from the processor cores. This separation allows the processor to continue operating at high performance without being impacted by the heat generated from irreversible computations.

At step 610, the offloading rates are adjusted based on thermal feedback from the system. This dynamic adjustment process ensures that data is offloaded to the TOU at a rate that prevents overheating while maintaining the processor's overall efficiency. The feedback mechanism allows the system to fine-tune its operations in real time, ensuring that heat buildup is minimized.

The TOU performs irreversible computations at step 612. These computations, which involve the destruction of offloaded data, generate heat from entropy conversion. However, by isolating these operations within the TOU, the system ensures that the main processor cores are not affected by the thermal load. This design helps to contain and manage heat in a dedicated part of the system.

In step 614, the heat dissipation mechanisms within the TOU are activated. These mechanisms may include both passive and active cooling systems, such as heat sinks, vapor chambers, fans, or liquid cooling. The dissipation systems work to remove the heat generated by the irreversible computations in the TOU, ensuring that the processor remains cool and stable during periods of high computational demand.

Step 616 involves regulating the reversible logic gates using a performance optimization module. This module dynamically adjusts the operation of the gates in response to changing computational loads and thermal conditions. By optimizing the use of reversible gates, the system can maintain high performance while minimizing entropy and heat generation in critical areas.

At step 618, thermal imaging is used to identify hotspots within the processor. This imaging technology allows the system to visualize areas where excessive heat is being generated, providing real-time data that informs the ongoing optimization process. Hotspots are typically regions where entropy is higher than expected, indicating that further adjustments may be needed to improve thermal performance.

Step 620 focuses on retrofitting these hotspots with reversible logic gates. By replacing the standard gates in these areas with reversible ones, the system reduces entropy conversion and heat generation, bringing the temperature of these regions back under control. This retrofit ensures that the processor can continue to handle high-intensity workloads without the risk of overheating.

Once the retrofitting process is complete, step 622 involves offloading data from the retrofitted regions to the TOU. The use of reversible gates means that additional and unwanted contextual data from calculations will be retained. This information but subsequently be destroyed and the entropy converted to heat and so the TOU handles these processes in a controlled environment. The data transfer ensures that any remaining heat-generating operations are isolated from the processor cores.

Step 624 involves analyzing the performance of the retrofitted reversible logic gates. The system continuously assesses how well these gates are performing in their new roles, making adjustments if necessary to further optimize thermal efficiency and computational performance.

In step 626, the system iteratively refines the processor design and operation. Using the data gathered from thermal imaging and performance analysis, the system continually improves its architecture and processes to ensure that the processor operates at peak efficiency while minimizing heat generation.

Finally, at step 628, the system sustains high computational performance by dynamically managing entropy and heat generation across the processor. The combination of reversible gates, entropy offloading, and advanced thermal management ensures that the processor can handle demanding workloads without suffering from thermal limitations. The process concludes at step 630, marking the end of the thermal management sequence.

This detailed process in FIG. 6 demonstrates a sophisticated approach to thermal management, utilizing reversible logic gates, real-time monitoring, entropy offloading, and iterative refinement to optimize both performance and heat dissipation in high-performance processors. By isolating heat-entropy-generating operations in the TOU and leveraging thermal imaging for ongoing optimization, the system can sustain high computational performance while preventing overheating, ensuring long-term efficiency and reliability.

Figure 7:
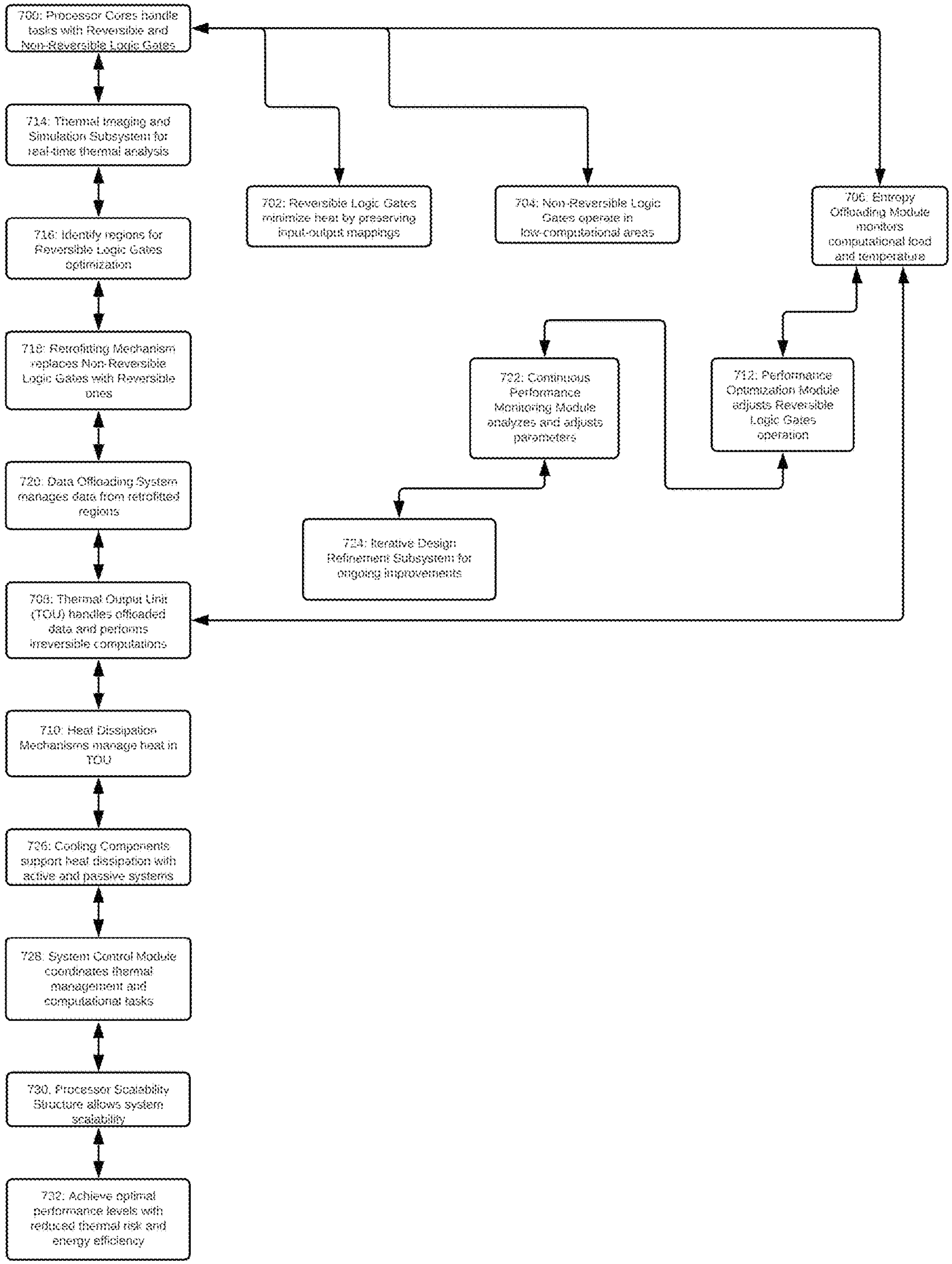
FIG. 7 depicts a sample system architecture that includes real-time monitoring, predictive modeling, and scalable cooling solutions to maintain thermal stability under varying computational loads. The system is designed to dynamically balance heat generation and performance through continuous adjustments.

In FIG. 7, the illustrated system provides a comprehensive approach to thermal management for high-performance processors through the use of reversible logic gates, entropy offloading to a dedicated Thermal Output Unit (TOU), and an array of active and passive cooling mechanisms. This system is designed to sustain optimal performance while effectively mitigating heat generation and managing entropy across various regions of the processor.

The process begins with element 700, where the processor cores handle tasks using both reversible and non-reversible logic gates. This dual approach allows the system to strategically deploy different types of logic gates based on the computational intensity of different regions. Reversible gates are particularly useful in high-computational areas as they reduce heat production by preserving input-output state mappings, while non-reversible gates are used in less intensive areas where heat generation is not as much of a concern.

Element 702 describes the role of reversible logic gates, which are deployed in high-computational-intensity areas to minimize heat. These gates work by preventing the irreversible loss of information, thereby reducing entropy conversion and preventing heat buildup that could otherwise occur with standard logic gates. This ensures that the processor can continue performing high-intensity operations without being hindered by excessive heat generation, which is a critical factor in maintaining system performance.

On the other hand, element 704 governs the operation of non-reversible logic gates. These gates are used in low-computational intensity areas where the need for thermal management is less pressing. By deploying non-reversible gates in these less active regions, the system ensures that it is optimized for energy efficiency without unnecessarily expending resources on managing heat in areas where the computational demand does not warrant it.

In element 706, an entropy offloading module continuously monitors computational load and temperature across the processor cores. This module identifies areas where entropy conversion is excessive, typically in high-activity regions, and initiates the offloading of data to the TOU. The real-time monitoring allows for the proactive management of heat generation by offloading computational tasks that generate significant heat entropy through information destruction to a separate, dedicated unit designed to handle such tasks.

Element 708 outlines the role of the TOU, which receives and processes offloaded data from high-entropy regions. Inside the TOU, irreversible computations are performed, which inherently generate heat entropy. However, the TOU is designed to isolate these heat-generating processes from the main processor cores, preventing localized overheating and ensuring that the main processor remains cool and operational. By handling the heat production in a controlled environment, the TOU helps maintain system performance without thermal interference.

Heat dissipation mechanisms are managed by element 710. These mechanisms include both active cooling components, such as fans and liquid cooling systems, and passive components, like heat sinks and vapor chambers. The system dynamically engages the active cooling mechanisms based on the heat output from the TOU and other regions of the processor, ensuring that the thermal load is managed effectively and that no part of the processor overheats.

The performance optimization module, described in element 712, dynamically adjusts the operation of the reversible logic gates in real time. This module continuously evaluates the computational load and thermal conditions, ensuring that reversible gates are deployed in areas where they are most needed to minimize entropy conversion. By optimizing the balance between reversible and non-reversible gates, the system ensures maximum computational efficiency while keeping thermal output within safe limits.

Element 714 introduces a thermal imaging and simulation subsystem that performs real-time thermal analysis of the processor. This subsystem allows for the identification of hotspots—regions within the processor that are generating excessive heat. Thermal imaging provides a clear view of where heat is concentrated, helping the system determine which areas require further optimization.

Once hotspots are identified, element 716 describes how these regions are optimized by retrofitting them with reversible logic gates. By replacing standard, non-reversible gates in these high-entropy areas, the system reduces heat generation, allowing the processor to continue operating at high capacity without risking thermal damage. This optimization ensures that the most computationally demanding areas of the processor are equipped with gates that can handle the load without generating excessive heat.

The retrofitting process is managed by element 718, which is responsible for replacing non-reversible logic gates with reversible ones in regions where thermal optimization is necessary. This replacement process allows the processor to adapt to real-time changes in computational load, ensuring that it is always operating at maximum efficiency with minimal heat generation.

After the retrofitting is complete, element 720 manages the offloading of data from these optimized regions to the TOU. Even with reversible gates in place, some data will still need to be processed irreversibly, and the TOU handles these computations in a controlled environment. The offloading system ensures that data is transferred efficiently, preventing heat buildup in the processor cores.

In element 722, a continuous performance monitoring module analyzes the real-time performance of both reversible and non-reversible logic gates. This module ensures that the system is always operating at peak efficiency by making dynamic adjustments to the gate configurations and data offloading processes based on thermal and computational data.

The system undergoes continual refinement, as described in element 724, where an iterative design refinement subsystem is employed to make ongoing improvements to the processor's architecture and operations. This subsystem uses data gathered from thermal imaging and performance monitoring to make incremental changes to the design, such as adding more reversible gates or improving the TOU's capacity to handle entropy. This iterative process ensures that the processor becomes more efficient over time, adapting to changing computational and thermal demands.

Element 726 focuses on the cooling components that support heat dissipation throughout the system. Both active and passive cooling systems are employed, with passive components managing moderate heat loads and active systems engaging when computational demand and thermal output increase. This dynamic cooling strategy ensures that the system can scale its thermal management efforts as needed.

The system control module, referenced in element 728, coordinates the overall thermal management process, interfacing with the performance optimization module, entropy offloading module, and cooling systems. This module ensures seamless communication between computational tasks and thermal management efforts, adjusting gate operations, data offloading rates, and cooling mechanisms in real time to maintain the system's balance between performance and heat dissipation.

In element 730, the system's scalability structure is outlined. This structure allows the processor architecture to scale as computational and thermal demands grow, enabling the addition of more processor cores, TOUs, and cooling systems as necessary. This scalability ensures that the system can handle increased workloads while maintaining optimal thermal efficiency.

Finally, element 732 describes how the system achieves optimal performance levels with reduced thermal risk and increased energy efficiency. By dynamically managing entropy conversion, offloading heat-generating data to the TOU, and utilizing advanced cooling systems, the processor is able to maintain high computational performance with significantly reduced risk of overheating. This makes the system suitable for a wide range of high-performance applications, where both energy efficiency and thermal management are critical.

By integrating thermal imaging, real-time entropy management, and iterative design refinements, the system outlined in FIG. 7 offers a powerful solution for managing the heat generated by high-performance processors, ensuring long-term efficiency and reliability.

Figure 8:
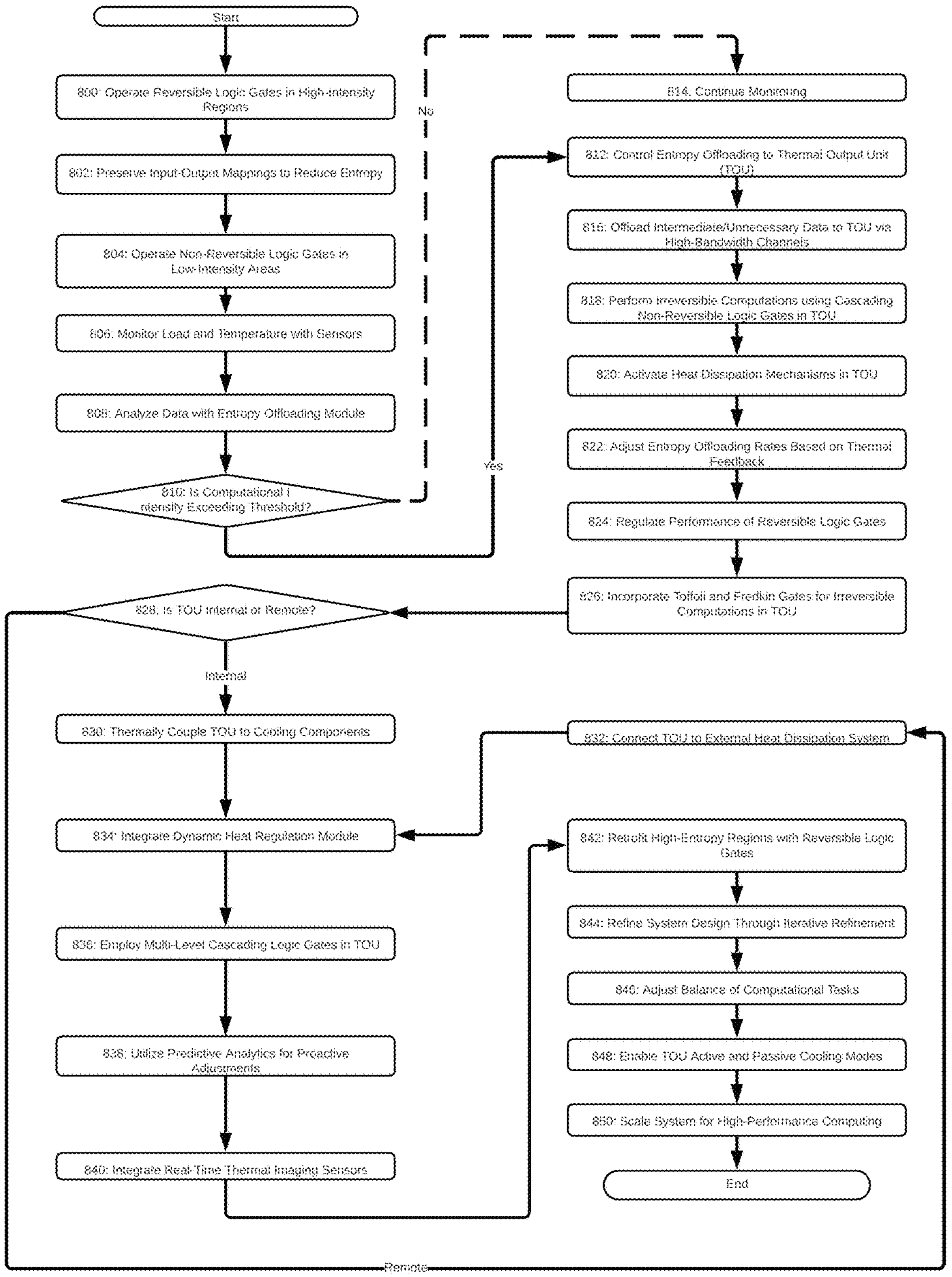
FIG. 8 depicts a sample process that integrates thermal imaging with entropy management to proactively identify high-heat regions in the processor. This figure demonstrates how iterative design refinements and real-time thermal adjustments help the system maintain peak performance while managing heat.

In FIG. 8, the depicted process outlines a detailed approach to managing the thermal performance of a high-performance processor through the use of reversible logic gates, software-controlled entropy offloading, and a dedicated Thermal Output Unit (TOU). This step-by-step process is designed to ensure optimal computational efficiency while minimizing heat generation and managing entropy across various regions of the processor.

The process begins with step 800, where reversible logic gates are operated in high-intensity regions of the processor. These regions are prone to generating excessive heat due to the intensity of the computations being performed. Reversible logic gates are used here because they preserve input-output state mappings, preventing information destruction leading to the generation of heat. By avoiding the irreversible destruction of information, these gates reduce the overall heat produced, allowing the processor to sustain high-performance operations with a reduced risk of thermal overload.

In step 802, the system preserves input-output mappings to reduce entropy conversion. This is a critical aspect of the reversible logic gates, as the prevention of information loss directly correlates with lower entropy conversion and thus less heat. This step is fundamental in maintaining the thermal efficiency of the processor in its most active regions, where heat is most likely to build up during intense computational tasks.

Step 804 involves the operation of non-reversible logic gates in low-intensity areas of the processor. In these regions, computational demands are lower, meaning that the heat generated by non-reversible gates does not pose a significant risk to the overall thermal performance. These gates are used where simplicity can be prioritized over heat minimization, as the computational load in these areas is less likely to create overheating concerns.

At step 806, the system uses sensors to monitor both computational load and temperature across the processor. This real-time monitoring allows the system to detect areas where computational intensity and heat generation may exceed safe limits. The gathered data is continuously fed into the entropy offloading module, ensuring that the processor can adapt to changing conditions as necessary.

In step 808, the entropy offloading module analyzes the data collected by the sensors to determine whether computational intensity in any part of the processor is reaching a critical threshold. This analysis is crucial for identifying when and where entropy needs to be offloaded to prevent overheating. The system dynamically adjusts its behavior based on the findings from this module.

Step 810 evaluates whether the computational intensity is exceeding a predefined threshold. If the computational load is too high, the system moves to step 812, where it controls the offloading of entropy to the TOU. The TOU is responsible for handling information destruction leading to heat output, thus preventing this heat from accumulating in the processor cores themselves.

Step 814 ensures that the system continues to monitor computational loads and thermal conditions during the entropy offloading process. This ongoing monitoring allows the system to adjust its strategies dynamically, ensuring that entropy conversion management occurs without negatively affecting performance. If entropy levels remain manageable, the system continues normal operations without intervention.

In step 816, the system offloads intermediate or unnecessary data to the TOU through high-bandwidth memory channels. This efficient transfer of unwanted entropy-laden data ensures that heat-generating destruction operations are moved out of the processor cores and handled separately in the TOU. The high-bandwidth channels facilitate rapid data movement, minimizing any performance delays.

Once the data reaches the TOU, step 818 involves performing irreversible computations using cascading non-reversible logic gates. These gates are designed to progressively destroy data while generating controlled amounts of heat entropy. By managing entropy through a cascading structure, the TOU ensures that heat production is spread out and does not overwhelm the system.

At step 820, heat dissipation mechanisms are activated within the TOU. These mechanisms include both active cooling components, such as fans or liquid cooling systems, and passive components like heat sinks or vapor chambers. The heat dissipation systems work to remove the thermal energy generated during the irreversible computations, keeping the TOU's temperature within acceptable limits.

In step 822, the system adjusts entropy offloading rates based on thermal feedback. This feedback is continuously provided by the sensors, allowing the system to fine-tune the rate at which data is transferred to the TOU. This dynamic adjustment ensures that the TOU can handle the thermal load without overwhelming the cooling systems or processor cores.

Step 824 regulates the performance of reversible logic gates, adjusting their operation based on the system's computational and thermal demands. This regulation ensures that reversible gates are employed in the most efficient way possible, minimizing entropy in high-computation regions while allowing for peak performance.

Step 828 determines whether the TOU is located internally within the processor or remotely. If the TOU is internal, step 830 thermally couples it to cooling components, such as internal heat sinks or vapor chambers, to dissipate the heat generated by the entropy offloading process. If the TOU is remote, step 832 connects it to external heat dissipation systems, ensuring that the heat generated by the irreversible computations is managed efficiently outside the processor.

At step 834, the system integrates a dynamic heat regulation module, which continuously adjusts the cooling mechanisms and entropy offloading processes based on real-time thermal feedback. This module enables the system to proactively manage thermal conditions, adjusting its strategies as needed to prevent overheating and maintain peak performance.

The TOU employs a multi-level cascading structure of logic gates in step 836, which progressively reduces the number of outputs relative to the inputs. This cascading structure helps manage information destruction and ensures that heat generation is spread across multiple levels, preventing localized overheating within the TOU.

Step 838 utilizes predictive analytics to make proactive adjustments to the system's operation. By analyzing historical computational and thermal data, the system can anticipate future heat generation challenges and adjust the use of reversible gates, entropy offloading rates, and cooling mechanisms accordingly. This step ensures that the system remains one step ahead of potential thermal issues.

In step 840, real-time thermal sensors are used to monitor the processor's heat distribution. These sensors generate detailed thermal maps that help the system identify areas where heat is building up due to high computational intensity. This data informs further optimizations in gate usage and cooling strategies, allowing the system to target specific areas for thermal management.

Step 842 involves retrofitting high-entropy regions with reversible logic gates to reduce heat generation. In regions where entropy is particularly high, the system replaces non-reversible gates with reversible ones, reducing information destruction and ensuring that these regions can handle intense workloads without generating excessive heat.

The system undergoes continuous refinement through step 844, where iterative design improvements are made based on real-time data from the thermal imaging sensors and performance monitoring. This iterative refinement process ensures that the system's thermal management strategies are always up to date, enabling long-term efficiency and reliability.

Step 846 adjusts the balance of computational tasks between reversible and non-reversible logic gates, dynamically optimizing the system's performance based on real-time workload demands. This step ensures that the system maintains a balance between heat minimization and computational efficiency.

At step 848, the TOU's cooling modes are adjusted, enabling both active and passive cooling systems as needed. The passive systems handle moderate loads, while additional active cooling systems engage when the computational load and heat generation increase, ensuring that the TOU remains cool during peak operations.

Finally, in step 850, the system is scaled for high-performance computing, allowing for the addition of more TOUs, processor cores, and cooling components to accommodate growing computational demands. This scalability ensures that the system can handle increased workloads while maintaining thermal efficiency and preventing overheating.

By integrating these steps, the process outlined in FIG. 8 offers a comprehensive solution for managing heat in high-performance processors, leveraging reversible logic gates, entropy offloading, and dynamic cooling systems to maintain optimal performance and efficiency.

Figure 9:
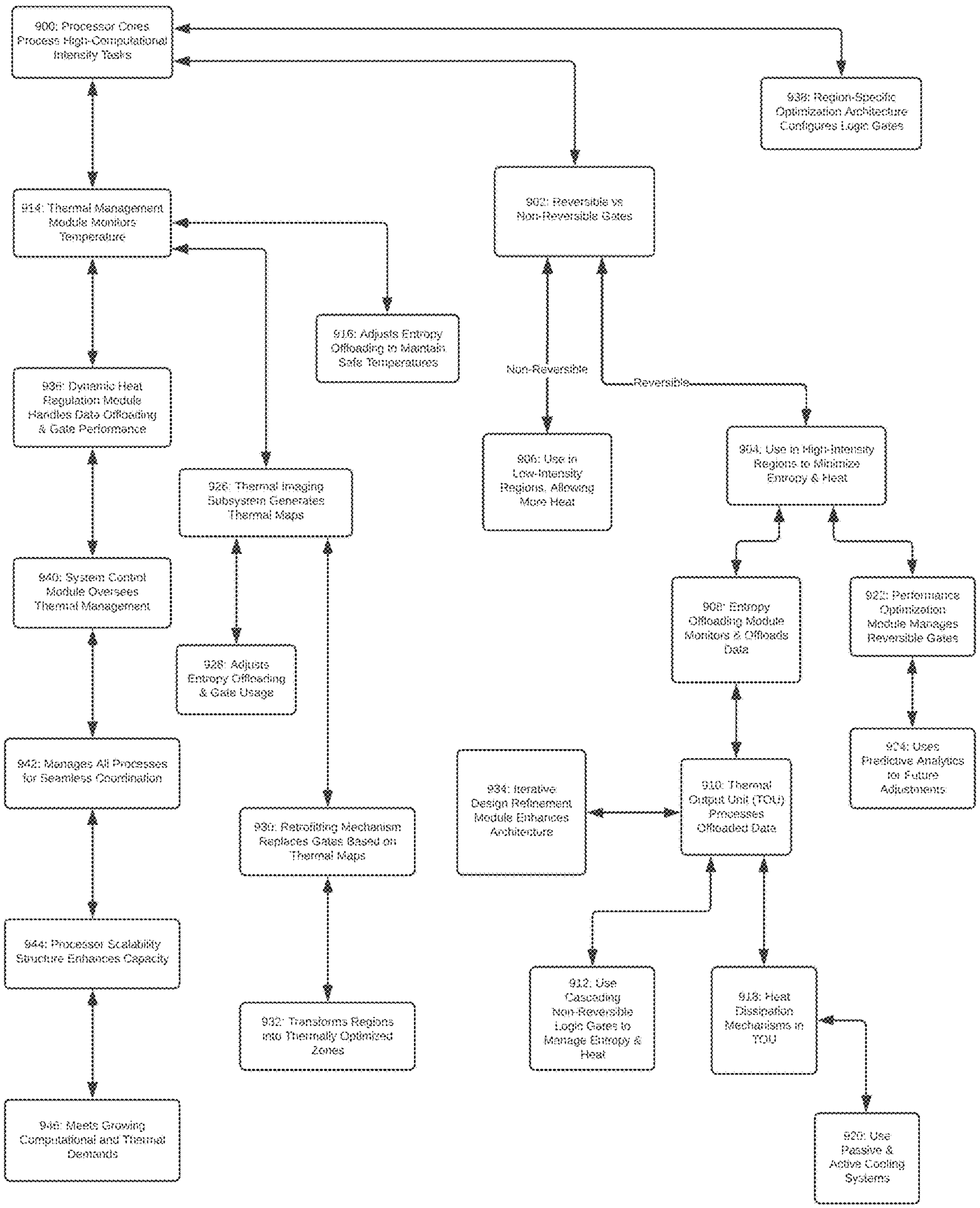
FIG. 9 depicts a sample thermal management system that leverages reversible logic gates, a predictive analytics model, and a TOU to optimize heat generation and dissipation. The system dynamically adjusts gate configurations and cooling systems based on historical data and real-time feedback.

In FIG. 9, the system depicted focuses on reversible logic gate-based thermal management for high-performance processors, utilizing a software-controlled entropy offloading unit (TOU) to manage heat effectively. The system begins with step 900, where the processor cores handle high-computational-intensity tasks. In these regions, computations generate substantial heat due to the complexity and volume of operations being performed. The system helps to mitigate this issue by strategically deploying different types of logic gates, depending on the computational load and thermal characteristics of each area.

Step 902 distinguishes between reversible and non-reversible logic gates within the processor. Reversible gates are used in areas with high computational intensity, as they minimize entropy conversion and heat generation by preserving input-output state mappings, which prevents the loss of information that typically leads to increased heat. Non-reversible gates are more suitable for low-computational regions, where heat generation is less of a concern.

Step 904 describes the use of reversible logic gates in high-intensity regions. These gates are essential for reducing entropy conversion, as they prevent irreversible changes that would otherwise produce heat. By preserving the data state during computation, reversible gates minimize the thermal footprint in these critical areas, allowing the processor to operate efficiently without the risk of overheating. Conversely, step 906 discusses the use of non-reversible logic gates in low-intensity regions, where the heat generated by such gates can be tolerated without overwhelming the system's thermal management capabilities. In these areas, the focus is on simplicity rather than heat reduction.

In step 908, the system employs an entropy offloading module that continuously monitors computational loads and temperature across the processor. This module plays a critical role in managing heat by identifying regions where computational intensity is high and heat entropy generation exceeds acceptable levels. When heat builds up, the module initiates the process of offloading excess data to the TOU, where it can be handled away from the processor cores.

Step 910 describes how the TOU processes the offloaded data. The TOU is designed to manage the heat entropy created during irreversible computations. Once the data is offloaded to the TOU, irreversible computations are performed, which cause the dissipation of the entropy as heat. By handling these processes in a thermally isolated environment, the TOU ensures that the heat generated does not affect the processor's performance.

To manage this entropy efficiently, step 912 describes the use of cascading non-reversible logic gates within the TOU. These gates progressively reduce the number of outputs in relation to the inputs, controlling the destruction of information in a way that spreads out the entropy conversion and heat generation over multiple stages. This cascading structure ensures that entropy conversion is managed incrementally, preventing localized thermal spikes that could disrupt system performance.

The system's thermal management module, introduced in step 914, continuously monitors the temperature across the processor and TOU. This module gathers real-time thermal data, which it uses to make decisions about when and how to adjust entropy offloading. In step 916, the system dynamically adjusts the offloading rates based on the thermal feedback it receives, ensuring that entropy is offloaded to the TOU at a rate that prevents overheating while maintaining the processor's performance.

Step 918 outlines the heat dissipation mechanisms within the TOU. These mechanisms include both passive cooling systems, such as heat sinks and vapor chambers, and active systems like fans or liquid cooling systems. These components are crucial for removing the heat generated during irreversible computations, preventing it from accumulating within the TOU and ensuring that it does not affect the processor cores.

In step 920, the system uses a combination of passive and active cooling systems to manage the heat generated by the TOU. Passive systems are employed to handle moderate thermal loads, while active systems are additionally engaged during periods of higher computational demand, ensuring that heat is dissipated efficiently and that the TOU remains cool during intense operations.

Step 922 introduces the performance optimization module, which regulates the operation of reversible logic gates based on computational demand and thermal conditions. This module continuously evaluates the load on the processor and makes adjustments to ensure that reversible gates are prioritized in high-entropy-conversion regions, minimizing heat generation while allowing for optimal computational performance.

To anticipate future thermal challenges, step 924 incorporates predictive analytics. By analyzing historical computational and thermal data, the system can predict when and where heat buildup is likely to occur. This foresight allows the system to make proactive adjustments, such as increasing the use of reversible gates or adjusting the rate of entropy offloading, before overheating becomes a problem.

Step 926 describes the system's thermal imaging subsystem, which generates real-time thermal maps of the processor. These maps provide a detailed spatial representation of heat distribution across the processor cores, allowing the system to identify specific areas where heat buildup is occurring. Using this information, the system can target high-entropy-conversion regions for optimization.

Based on the thermal maps generated, step 928 adjusts entropy offloading rates and gate usage to improve thermal performance in areas where heat is concentrated. By dynamically adjusting gate usage, the system ensures that reversible gates are used in high-heat areas to reduce entropy, while non-reversible gates are deployed in regions where heat generation is less of a concern.

Step 930 introduces a retrofitting mechanism that replaces non-reversible logic gates with reversible ones in areas that exhibit excessive heat generation. This retrofitting process transforms these regions into thermally optimized zones, where heat generation due to information loss is reduced, and the processor can continue to operate at high performance with a reduced risk of overheating.

The iterative design refinement module, described in step 934, continually refines the processor's architecture based on real-time thermal data. By making incremental improvements to the system's design, such as adjusting gate configurations or enhancing the TOU's capacity to handle entropy, the processor becomes more thermally efficient over time, adapting to changing computational demands.

Step 936 outlines the role of the dynamic heat regulation module, which adjusts the entropy offloading process and the operation of reversible gates based on real-time thermal data. This module ensures that the system maintains a balance between performance and heat management, dynamically adapting to the current workload.

In step 938, the system configures logic gates based on region-specific optimization. This step ensures that the appropriate type of gate—reversible or non-reversible—is used in each region of the processor, depending on the computational load and thermal conditions in that specific area.

The system control module, detailed in step 940, oversees the coordination of all thermal management processes. This module integrates the various subsystems, including entropy offloading, gate regulation, and heat dissipation, ensuring that all elements work together seamlessly to maintain optimal thermal performance.

Step 942 expands on the role of the system control module, explaining how it manages all processes involved in thermal management. This coordination is critical for maintaining balance between computational tasks and heat dissipation, ensuring that the processor remains stable even during high-intensity operations.

Step 944 describes the system's scalability structure, which allows the architecture to grow as computational and thermal demands increase. This structure supports the addition of new processor cores, TOUs, and cooling systems as needed, ensuring that the system can handle increased workloads without sacrificing performance or thermal efficiency.

Finally, step 946 explains how the system meets growing computational and thermal demands. As workloads increase, the system adapts by scaling up its components and optimizing its processes, ensuring that it can maintain peak performance while managing heat generation.

Figure 10:
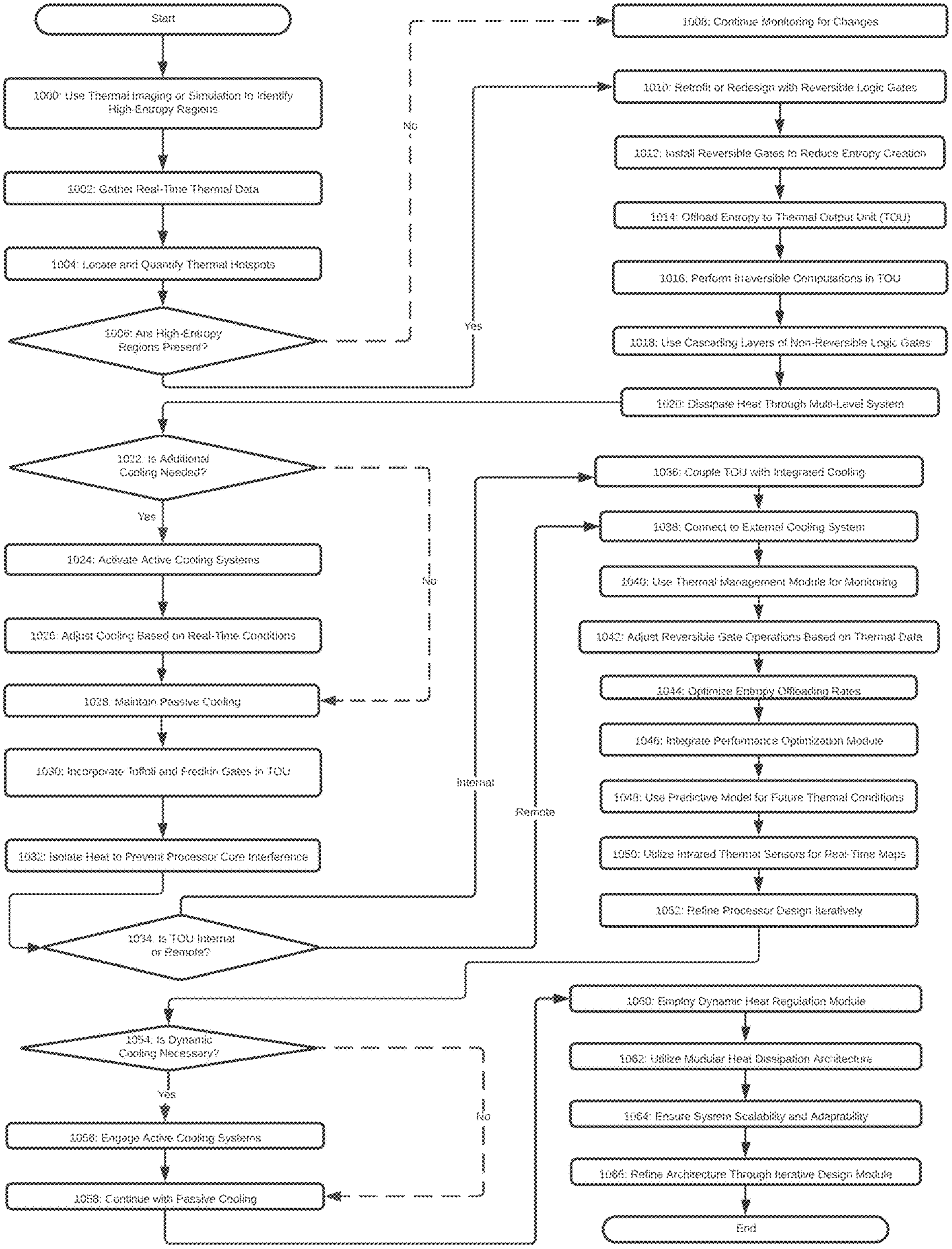
FIG. 10 depicts a sample system that identifies high-entropy regions, retrofits them with reversible gates, and efficiently offloads entropy to the TOU for thermal management. The figure illustrates the process of thermal monitoring, dynamic cooling, and real-time adjustments to prevent overheating in critical areas.

In FIG. 10, the process begins with step 1000, where thermal imaging or simulations are employed to identify high-entropy-conversion regions within the processor. High-entropy-conversion regions are typically areas where intense computational tasks are being executed, leading to a buildup of heat due to the entropy conversion caused by non-reversible computations. By using advanced thermal imaging sensors or simulations, the system can precisely locate these regions. The importance of this step lies in the system's ability to proactively address heat issues before they affect performance.

In step 1002, the system gathers real-time thermal data from sensors placed throughout the processor. This data provides a comprehensive view of how heat is distributed across various regions of the processor, which is critical for determining which areas are at risk of overheating. The real-time nature of the data allows the system to make dynamic adjustments as computational loads fluctuate.

Step 1004 focuses on locating and quantifying thermal hotspots, which are areas in the processor where the temperature exceeds optimal levels due to high entropy conversion. These hotspots are identified through the real-time thermal data gathered in the previous step, enabling the system to pinpoint specific areas of concern. Once these hotspots are located, the system can take targeted action to mitigate the associated risks of overheating.

If high-entropy-conversion regions are detected, as evaluated in step 1006, the system moves to step 1010, where these regions are either retrofitted or redesigned with reversible logic gates. Reversible logic gates are essential in reducing entropy conversion because they prevent the irreversible loss of information during computations. This step is crucial for minimizing heat generation, as they avoid the information destruction that causes emission of heat. This retrofitting process helps transform the high-entropy-conversion areas into thermally optimized zones.

In step 1012, the reversible gates are installed to replace or augment the existing non-reversible gates. These gates significantly reduce the amount of entropy conversion during computation, thus lowering the heat produced. The system leverages this technology to maintain high performance while preventing the processor from overheating, especially in critical regions that handle intense workloads.

Step 1014 involves offloading any residual entropy to the Thermal Output Unit (TOU). The use of reversible gates means that additional and potentially unwanted contextual information must be preserved during computations, and this information must later be destroyed inherently generating heat. The system addresses this by offloading such tasks to the TOU, a dedicated unit that is designed to manage heat-producing processes separately from the main processor cores.

Once the entropy is offloaded to the TOU, step 1016 describes the process of performing irreversible computations within the TOU. These computations are necessary for destroying the extraneous data from computations, but they generate significant heat. To manage this, the TOU utilizes cascading layers of non-reversible logic gates, as outlined in step 1018. These gates progressively reduce the information entropy, spreading the heat generation over multiple stages to prevent localized overheating.

In step 1020, a multi-level system for dissipating the heat generated in the TOU is employed. This system integrates both passive and active cooling components, such as heat sinks and liquid cooling systems. The multi-level approach ensures that the heat is dissipated efficiently, keeping the TOU at a manageable temperature while allowing the processor to continue operating at high performance.

The system evaluates whether additional cooling is necessary in step 1022. If the heat generated by the TOU or processor exceeds the capacity of passive cooling systems, step 1024 additionally activates more aggressive, active cooling systems. These systems might include fans, liquid cooling loops, or other advanced thermal management technologies designed to handle significant thermal loads.

Step 1026 dynamically adjusts the cooling systems based on real-time thermal conditions. This ensures that the processor and TOU are kept within safe temperature ranges without over-utilizing cooling resources when they are not needed. If active cooling is not required, step 1028 allows the system to continue using passive cooling systems, which are more energy-efficient and sufficient for moderate heat levels.

Step 1040 introduces the thermal management module, which continuously monitors the thermal conditions of both the processor and the TOU. This module plays a vital role in ensuring that the system can dynamically adjust the cooling and entropy offloading processes based on real-time data. In step 1042, the module adjusts the operation of the reversible logic gates to maintain optimal thermal conditions and prevent any regions from becoming excessively hot.

In step 1044, the system optimizes the entropy offloading rates to ensure that data is efficiently transferred from high-computational regions to the TOU. This process prevents the processor from overheating by offloading the requirement to destroy information before it can cause localized thermal issues.

The performance optimization module, introduced in step 1046, integrates predictive models to anticipate future thermal conditions. These models analyze past data and current trends to forecast potential thermal spikes, allowing the system to proactively adjust the operation of the gates and cooling mechanisms before any issues arise. Step 1048 emphasizes the use of these predictive models to enhance the system's overall efficiency and responsiveness to thermal changes.

Thermal sensors are utilized in step 1050 to generate real-time thermal maps. These sensors provide highly accurate data on the heat distribution across the processor and TOU, enabling the system to identify specific areas where heat is building up. This information is critical for making precise adjustments to the system's cooling and gate configurations.

Step 1052 describes how the system refines the processor design iteratively. Based on the real-time thermal maps and data gathered from the sensors, the system continually makes improvements to the architecture, enhancing the efficiency of the reversible gates and optimizing the TOU's heat management capabilities.

In step 1054, the system assesses whether dynamic cooling is necessary. If so, step 1056 engages active cooling systems to manage any thermal spikes that may occur. If dynamic cooling is not required, the system continues using passive cooling strategies, as detailed in step 1058.

The dynamic heat regulation module, introduced in step 1060, adjusts the entropy offloading process and the operation of reversible gates based on current thermal conditions. This module ensures that the system can adapt to changing computational loads without sacrificing thermal efficiency. In step 1062, the system uses a modular heat dissipation architecture, allowing it to scale the cooling systems as needed to meet increasing thermal demands.

Finally, in step 1064, the system ensures scalability and adaptability for future computational loads. As processing demands grow, the system can scale by adding more TOUs, cooling components, and processor cores. This scalability is made possible through iterative design refinement, as described in step 1066, where the architecture is continuously improved to handle greater computational and thermal challenges.

The process outlined in FIG. 10 provides a comprehensive solution for managing thermal conditions in high-performance processors. By integrating thermal imaging, dynamic heat regulation, and advanced cooling systems, the system can maintain optimal performance while reducing the risk of overheating. The use of reversible logic gates, combined with real-time thermal data and predictive models, ensures that the processor operates efficiently even under intense computational loads. This iterative approach to design and thermal management allows the system to evolve over time, adapting to future demands while maintaining both computational efficiency and thermal stability.

Figure 11:
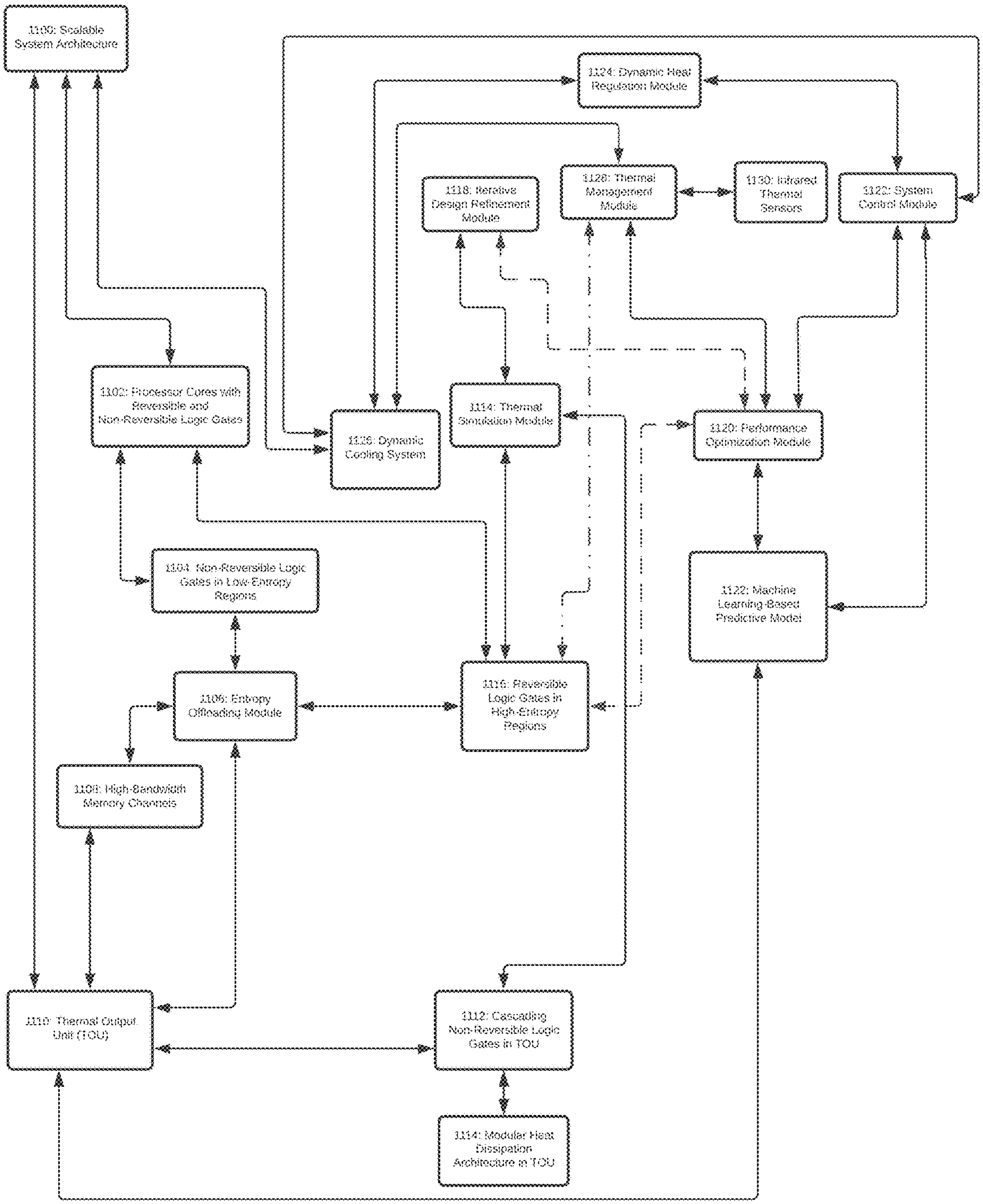
FIG. 11 depicts a sample advanced system architecture that integrates multiple components, including thermal imaging, machine learning-based predictive models, and modular cooling systems. The system dynamically regulates heat generation and entropy offloading to sustain high-performance computing tasks without the risk of overheating.

In FIG. 11, the system is designed to manage heat generation from entropy conversion in high-performance processors by leveraging both reversible and non-reversible logic gates, alongside a dedicated Thermal Output Unit (TOU). This system is optimized for performance and scalability, integrating thermal imaging, predictive models, and real-time adjustments to ensure that the processor operates efficiently without overheating.

The system begins with element 1102, where processor cores are equipped with a combination of reversible and non-reversible logic gates. Reversible gates are strategically placed in regions of the processor where heat entropy is likely to accumulate due to the high intensity of computations, as shown in element 1116. These gates are crucial because they prevent the irreversible loss of information, which is a key factor in generating heat. By minimizing entropy conversion in these high-computation areas, reversible gates help keep the processor cool while maintaining high performance.

In contrast, element 1104 describes how non-reversible logic gates are deployed in low-entropy-conversion regions, where the computational load is lighter, and heat generation is not as critical. These gates are used where efficiency is more important than minimizing heat, allowing the system to balance performance and thermal management.

The entropy offloading module, element 1106, plays a central role in transferring data from high-entropy regions to the TOU. This module monitors real-time computational loads and identifies areas where entropy conversion is high. By offloading data from these regions, the module prevents excessive heat buildup in the processor cores, ensuring that the main processor remains efficient. The data is transferred through high-bandwidth memory channels, as indicated in element 1108, allowing for rapid and efficient offloading to the TOU.

Once the data is offloaded, element 1110, the TOU, handles the irreversible computations that produce heat entropy. These computations are managed by cascading non-reversible logic gates, shown in element 1112, which are designed to progressively reduce information entropy by destroying unnecessary data. This cascading structure ensures that conversion to heat entropy is managed in a controlled way, preventing localized overheating in the TOU. By isolating these heat-generating processes in the TOU, the main processor cores are protected from the thermal load, allowing them to continue operating at high performance.

Element 1114 introduces the modular heat dissipation architecture used within the TOU. This system integrates both passive and active cooling components, such as heat sinks, vapor chambers, and liquid cooling systems. These components work together to dissipate the heat generated by the irreversible computations within the TOU. By managing the thermal output efficiently, the system ensures that the TOU remains within safe operating temperatures, even under high computational loads.

The thermal management module, element 1128, continuously monitors real-time temperature data using thermal sensors embedded throughout the processor and TOU, as shown in element 1130. These sensors provide detailed thermal maps of the system, allowing the thermal management module to visualize where heat is being generated and make adjustments accordingly. This real-time data enables the system to dynamically adapt its cooling mechanisms and entropy offloading rates to prevent overheating.

The performance optimization module, described in element 1120, regulates the operation of both reversible and non-reversible logic gates. This module ensures that the gates are used efficiently based on the current computational load and thermal conditions. In high-entropy-conversion regions, the module prioritizes reversible gates to reduce heat generation, while non-reversible gates are employed in less critical areas. This balance helps optimize performance without compromising thermal stability.

Element 1122 introduces a machine learning-based predictive model that uses historical computational and thermal data to anticipate future thermal challenges. By analyzing past patterns, this model can predict when and where heat generation is likely to occur, allowing the system to make proactive adjustments. For instance, the system can increase the use of reversible gates in high-computation areas or adjust entropy offloading rates before thermal thresholds are reached. This predictive capability helps the system maintain consistent performance, even under varying workloads.

To ensure continuous improvement, the system includes an iterative design refinement module, element 1118. This module uses real-time thermal and performance data to make incremental improvements to the system's architecture. For example, it may recommend adding more reversible gates to high-entropy-conversion regions or optimizing the heat dissipation system in the TOU. By continually refining the design, the system evolves to meet changing computational demands while improving thermal efficiency.

The system is designed to be scalable, as indicated in element 1100. The architecture can be expanded by adding more processor cores, TOUs, and cooling components to handle increasing workloads and thermal demands. This scalability ensures that the system can adapt to future growth without requiring a complete redesign, maintaining optimal performance as computational needs increase.

Element 1124 introduces a dynamic heat regulation module, which continually adjusts the entropy offloading process and the operation of cooling systems based on real-time thermal conditions. This module engages active cooling systems, such as liquid cooling or fans, when necessary, and switches to passive cooling systems, like heat sinks and vapor chambers, during periods of lower thermal demand. By dynamically managing the cooling process, the system ensures that heat is dissipated efficiently without wasting resources.

Finally, the system control module, shown in element 1122, coordinates all thermal management processes. This module interfaces with the thermal management module, performance optimization module, and machine learning-based predictive model to ensure that computational tasks, entropy offloading, and heat dissipation are seamlessly integrated. The system control module continuously monitors the entire system, making real-time adjustments to ensure that the processor operates at maximum efficiency while reducing the risk of thermal overloads.

The system outlined in FIG. 11 provides a comprehensive solution for managing heat from information loss in high-performance processors. By integrating reversible and non-reversible logic gates, real-time thermal monitoring, and advanced cooling mechanisms, the system maintains optimal performance with significantly reduced risk of overheating. Its modular and scalable architecture ensures that it can handle increasing computational demands, while the machine learning-based predictive model and iterative design refinement ensure that the system continues to evolve and improve over time. This sophisticated approach to thermal management enables high-performance computing tasks to be executed efficiently and reliably, even under the most demanding conditions.

Pseudocode exemplars for implementing various aspects of this disclosure are set forth below with explanations for reference.

```
# Initialization of processor cores, reversible gates, non-reversible
gates, TOU, and thermal management modules
def initialize_system( ):
    # Initialize processor cores, reversible and non-reversible logic
gates
  processor_cores = initialize_processor_cores( )
  reversible_logic_gates = initialize_reversible_logic_gates( )
                        non_reversible_logic_gates =
initialize_non_reversible_logic_gates( )
  # Initialize TOU (Thermal Output Unit) and heat dissipation
systems
  TOU = initialize_TOU( )
  heat_dissipation_system = initialize_heat_dissipation_system( )
    # Initialize thermal management modules, including entropy
offloading and performance optimization
                              thermal_management_module =
initialize_thermal_management_module( )
                          performance_optimization_module =
initialize_performance_optimization_module( )
    # Thermal imaging module to detect hot spots and dynamically
adjust gates
  thermal_imaging_module = initialize_thermal_imaging_module( )
          return processor_cores, reversible_logic_gates,
```

-continued

```
non_reversible_logic_gates, TOU, thermal_management_module,
performance_optimization_module, thermal_imaging_module
# Continuous system operation loop
def run_system( ):
    processor_cores, reversible_logic_gates,
non_reversible_logic_gates, TOU, thermal_management_module,
performance_optimization_module, thermal_imaging_module =
initialize_system( )
  # Continuous operation loop while system is running
  while system_is_running( ):
      # Monitor each processor core for computational load and
thermal status
    for core in processor_cores:
      computational_load = monitor_computational_load(core)
                                          temperature =
thermal_management_module.monitor_temperature(core)
      # Reversible vs Non-Reversible Gate Activation
      if computational_load > HIGH_ACTIVITY_THRESHOLD:
        # Activate reversible logic gates to reduce entropy and heat
in high-load areas
        activate_reversible_gates(core)
      else:
      # Use non-reversible logic gates in low-load areas where heat
is less of a concern
        activate_non_reversible_gates(core)
      # Entropy Offloading and Heat Management
      if temperature > THERMAL_THRESHOLD:
        # Offload entropy (intermediate data) to the TOU via high-
bandwidth memory channels
        offload_entropy_to_TOU(core, TOU)
        # Perform irreversible computations in the TOU to destroy
data and generate controlled heat
        TOU.perform_irreversible_computations( )
          # Activate heat dissipation system (heat sinks, vapor
chambers) in the TOU to manage generated heat
        thermal_management_module.activate_heat_dissipa-
tion(TOU)
        # Dynamically adjust offloading rates based on real-time
conditions
      adjust_offloading_rates(core, TOU)
        # Optimize reversible logic gate performance for thermal
efficiency and computational load balancing
          optimize_reversible_gate_performance(processor_cores,
performance_optimization_module)
      # Use thermal imaging to detect high-entropy hot spots and
adjust reversible gate activation
                                          thermal_data =
thermal_imaging_module.analyze_heat_distribution(processor_cores
)
            identify_and_retrofit_hot_spots(thermal_data,
reversible_logic_gates)
  # Gracefully shut down system after processing tasks are complete
  shutdown_system( )
# Supporting functions
def monitor_computational_load(core):
  # Check computational intensity of a processor core (load could be
based on operations per second, etc.)
  return get_core_load(core)
def monitor_temperature(core):
  # Monitor core temperature using thermal sensors
  return get_core_temperature(core)
def activate_reversible_gates(core):
  # Enable reversible logic gates to preserve information and reduce
heat generation in the core
  core.enable_reversible_gates( )
def activate_non_reversible_gates(core):
  # Enable non-reversible logic gates in areas where heat generation
is not a concern
  core.enable_non_reversible_gates( )
def offload_entropy_to_TOU(core, TOU):
  # Transfer unnecessary or intermediate data to the Thermal Output
Unit (TOU) for processing
  data_to_offload = core.get_entropy_data( )
  TOU.receive_entropy(data_to_offload)
def adjust_offloading_rates(core, TOU):
  # Dynamically adjust the rate of entropy offloading based on real-
time conditions such as temperature and load
  load = monitor_computational_load(core)
  temperature = monitor_temperature(core)
```

-continued

```
  if temperature > THERMAL_THRESHOLD:
    increase_offloading_rate(core, TOU)
  else:
    decrease_offloading_rate(core, TOU)
def increase_offloading_rate(core, TOU):
  # Increase the rate of entropy offloading to the TOU
  TOU.set_offloading_rate(core, high_rate=True)
def decrease_offloading_rate(core, TOU):
  # Decrease the rate of entropy offloading to the TOU to preserve
core performance
  TOU.set_offloading_rate(core, high_rate=False)
def          optimize_reversible_gate_performance(processor_cores,
performance_optimization_module):
    # Adjust the performance of reversible gates to balance heat
generation and computational load
  for core in processor_cores:
    performance_optimization_module.optimize_gate_usage(core)
def                    identify_and_retrofit_hot_spots(thermal_data,
reversible_logic_gates):
    # Identify hot spots from thermal imaging and retrofit with
reversible gates to reduce heat generation
  hot_spots = thermal_data.get_hot_spots( )
  for spot in hot_spots:
    retrofit_with_reversible_gates(spot, reversible_logic_gates)
def retrofit_with_reversible_gates(spot, reversible_logic_gates):
  # Retrofit identified hot spots with reversible gates to minimize
heat generation
  reversible_logic_gates.deploy_at(spot)
def shutdown_system( ):
  # Safely shut down all system components
  system.shutdown_all_components( )
```

The foregoing can be understood as follows.

Initialization Phase: In the initialize_system( ) function, various subsystems are initialized:

a. Processor Cores: These handle the computational workload.

b. Reversible and Non-Reversible Logic Gates: The processor cores will use reversible gates in high-computation regions to minimize entropy, while non-reversible gates will be used where thermal generation is less critical.

c. TOU: The Thermal Output Unit is initialized to handle entropy offloading and perform irreversible computations that result in controlled heat generation.

d. Thermal Management Module: This monitors real-time temperature across processor cores and manages thermal dissipation systems.

e. Performance Optimization Module: This dynamically adjusts the usage of reversible gates based on real-time workload and thermal data.

f. Thermal Imaging Module: This monitors processor cores for hot spots that can be retrofitted with reversible gates to minimize heat generation in key areas.

Monitoring and Adjustment: The run_system( ) function contains a loop that monitors computational load and temperature in real-time. Each core's load is evaluated to determine whether reversible or non-reversible gates should be activated. Reversible gates are selectively applied in high-computation regions to preserve information and minimize heat. In contrast, non-reversible gates are used in regions where computational intensity is lower, and heat generation is not a concern.

Entropy Offloading: If the temperature of a core exceeds a threshold, the system initiates the offloading of entropy (data that is no longer needed) from the processor core to the TOU. The TOU performs irreversible computations, destroying unnecessary data, which generates heat. This heat is managed by the thermal management module, which activates heat sinks, vapor chambers, or other cooling mechanisms.

Dynamic Adjustment of Offloading Rates: The system continuously monitors computational load and temperature data to adjust the rate at which entropy is offloaded to the TOU. If the temperature rises, the offloading rate is increased to ensure that heat does not accumulate in the processor cores. Conversely, if the temperature is within safe limits, the offloading rate is decreased to maintain computational efficiency.

Optimization of Reversible Gates: The performance optimization module adjusts the use of reversible gates based on the current computational load and temperature conditions. This ensures that heat generation is minimized without sacrificing processing power, allowing the system to run at optimal performance levels.

Thermal Imaging and Retrofitting: The thermal imaging module uses real-time data to identify regions within the processor cores where heat generation is excessive. These areas, or hot spots, are retrofitted with reversible gates to reduce heat. The system continuously analyzes these hot spots and makes iterative adjustments to ensure that the processor remains thermally optimized.

System Shutdown: Once all tasks are complete, the shutdown_system( ) function safely deactivates all components, ensuring a graceful system shutdown.

Entropy Offloading to the TOU: This offloading process is central to the invention's ability to manage heat. By transferring entropy (unnecessary data) from the processor core to the TOU, the system isolates the heat generated by irreversible computations away from the sensitive core areas. The TOU is designed with advanced heat dissipation mechanisms that ensure this heat does not impact processor performance.

Reversible and Non-Reversible Logic Gate Activation: The pseudocode emphasizes the strategic use of reversible logic gates in high-computational areas to preserve information and minimize entropy conversion. This approach reduces the overall heat output of the processor, ensuring more efficient operation.

Dynamic Rate Adjustments: The rate at which entropy is offloaded is dynamically controlled based on real-time thermal data. If a processor core is running too hot, the offloading rate is increased to avoid overheating, ensuring the system remains within safe operational parameters.

Thermal Imaging and Retrofitting: By continuously monitoring the processor cores using thermal imaging, the system can dynamically retrofit regions that are generating too much heat with reversible logic gates. This iterative process ensures that thermal management is continually optimized.

A skilled artisan, upon reviewing the disclosure, will appreciate that there are numerous alternatives, modifications, combinations, and customizations that can be made to the system described for thermal management using reversible logic gates and a Thermal Output Unit (TOU). The flexibility and adaptability of the invention allow it to be applied in a variety of computing environments, with customizations and optimizations tailored to specific needs. Each of these potential alternatives and modifications remains within the spirit and scope of the disclosure, ensuring that the invention is not limited to a singular configuration or method of implementation. Below, the various alternatives, modifications, combinations, and customizations are identified and explained.

1. Alternatives in Reversible Logic Gates:
   a. Gate Types: The system can incorporate different types of reversible logic gates, such as Toffoli gates, Fredkin gates, and other reversible gates, depending on the computational requirements of the processor cores. These gates can be customized to the nature of the tasks performed within the core.
   b. Gate Placement: The placement of reversible logic gates can vary depending on the thermal hotspots or areas of high computational intensity. Reversible gates could be concentrated in certain areas of the processor or distributed more evenly, depending on the thermal profile of the device.
   c. Selective Use: While the core focus is on reducing heat in high-computational areas, an alternative configuration could involve expanding the use of reversible logic gates throughout the entire processor, albeit selectively activated based on need.
   d. Full vs. Partial Reversibility: Depending on the design, processors could be partially reversible in certain areas, or the entire processor could be designed with reversible logic gates for enhanced efficiency in thermal management.
2. Modifications in the Thermal Output Unit (TOU):
   a. Internal vs. External TOU: The TOU can be configured either as an internal unit integrated within the processor package or as an external unit designed to handle entropy offloading remotely. This customization would depend on the space, heat dissipation, and performance requirements of the system.
   b. Distributed TOUs: Another modification involves deploying multiple distributed TOUs, each associated with different cores or processing units. This configuration could increase the efficiency of entropy management by decentralizing heat dissipation across multiple units, thus avoiding bottlenecks.
   c. Entropy Buffering: A customization of the TOU could include entropy buffering, where offloaded data is temporarily stored before irreversible computations are performed. This buffering would allow heat to be generated at optimal times, reducing the overall thermal stress on the TOU processor.
   d. Dynamic Configuration: The TOU could be dynamically reconfigurable based on the current load and thermal conditions, switching between active and passive cooling mechanisms as needed to minimize energy usage.
3. Heat Dissipation Customizations:
   a. Passive vs. Active Cooling: The system can be customized to use either passive (e.g., heat sinks, vapor chambers) or active cooling mechanisms (e.g., liquid cooling, fans) depending on the heat dissipation needs. These cooling systems can be adapted to specific environments, such as data centers or mobile devices.
   b. Custom Cooling Mechanisms: Advanced cooling methods such as microfluidic cooling, carbon nanotube-based heat sinks, or phase-change materials could be used to enhance the TOU's ability to dissipate heat effectively.
   c. Thermally Isolated Design: The system can be modified to use specialized materials like aerogels or ceramic composites to ensure that heat generated in the TOU does not interfere with the rest of the processor. These materials offer superior thermal insulation, making them suitable for high-performance processors.

4. Combinations of Logic Gates and TOUs:
   a. Hybrid Design: The system can utilize a hybrid approach, combining reversible and non-reversible logic gates across different regions of the processor. This customization allows for fine-tuned thermal management where reversible gates are employed in high-intensity areas and non-reversible gates in low-intensity areas.
   b. Multiple Layers of TOUs: In complex systems, a combination of hierarchical TOUs could be employed, where each TOU handles entropy offloading from a particular segment of the processor, and multiple levels of heat dissipation are applied for optimal performance.
   c. Dynamic Reversible Gate Allocation: In scenarios where computational loads vary greatly over time, the system can be designed to dynamically allocate and activate reversible gates in real-time based on changing workload demands and temperature profiles, creating a more adaptive and responsive design.
5. Customizations for Different Processor Architectures:
   a. Multi-Core Processors: In multi-core processors, the system can be customized to allow each core to have its own thermal management sub-system, including entropy offloading to localized TOUs. This distributed approach would improve scalability and allow each core to manage its own heat independently.
   b. Edge Computing Devices: The invention can be modified for use in edge computing devices, which often lack large-scale cooling systems. In this case, the TOU could be designed to operate with more efficient passive cooling mechanisms to ensure the system remains compact and low-powered.
6. Software-Controlled Alternatives and Modifications:
   a. Entropy Offloading Algorithms: Various algorithms can be implemented within the entropy offloading module to prioritize which data should be offloaded based on thermal and computational load conditions. These algorithms could be further customized to specific applications, such as AI workloads or high-performance simulations.
   b. AI-Based Thermal Management: An AI-driven thermal regulation system could be integrated into the architecture. This system would learn from previous computations and heat profiles, allowing it to predict thermal hotspots before they occur and dynamically adjust entropy offloading and gate activation to prevent heat buildup.
   c. Predictive Heat Management: The system could use predictive analytics to anticipate heat generation in advance, based on workload patterns, enabling preemptive activation of cooling mechanisms or retrofitting reversible logic gates in specific areas.
7. Thermal Imaging-Based Customizations:

Real-Time Thermal Mapping: The system can include real-time thermal mapping through sensors and simulations. This allows the processor to continually adjust the placement of reversible logic gates and offloading patterns based on real-time data, ensuring that the processor adapts to changing workloads and heat conditions.

a. Iterative Design Refinement: With the integration of thermal imaging, the system can be designed to iteratively refine the placement of reversible gates and cooling components. This approach would ensure continuous optimization, not only during initial design but also in real-time operations.
8. Energy Efficiency Customizations:
   a. Green Computing: The system can be further modified to prioritize energy efficiency by incorporating low-power reversible gates and designing TOUs that minimize power consumption during heat dissipation. This is particularly useful in environments such as data centers or mobile devices, where energy consumption is a key concern.
   b. Scaling Based on Load: The system can be customized to scale up or down based on workload intensity. For example, under low-load conditions, the system may operate with reduced cooling or reversible gate usage, while under high-load conditions, it could scale up its thermal management operations to meet demand.
9. Alternative Applications:
   a. Mobile and Embedded Devices: The system can be adapted for mobile and embedded processors, where space constraints and low power consumption are critical. In such applications, the TOU could be embedded within the processor itself, and passive cooling mechanisms could be employed to manage thermal dissipation without bulky cooling solutions.
   b. Automotive and IoT: The invention could be tailored for automotive systems or the Internet of Things (IoT), where processors are exposed to extreme temperature variations and need efficient thermal management. The use of reversible gates and localized TOUs would ensure the reliability and performance of these systems in such environments.
   c. Other Integrated Circuits: The invention can essentially be implemented in any type of integrated circuits or combinations thereof in order to improve heat management and entropy conversion.

In conclusion, skilled artisans will recognize that this disclosure allows for significant flexibility in how any proposed system is implemented. Whether through alternative logic gate configurations, custom TOU designs, different heat dissipation techniques, or specialized software algorithms, the system can be adapted to various processor architectures, thermal environments, and computational needs. All of these alternatives, modifications, combinations, and customizations are within the spirit and scope of the disclosure and contribute to creating an adaptable and highly efficient system for managing processor heat generation through reversible logic and entropy offloading.

Although the present technology has been described based on what is currently considered the most practical and preferred implementations, it is to be understood that this detail is only for that purpose and this disclosure is not limited to the sample descriptions and implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

The invention claimed is:

1. A reversible logic gate-based thermal management with software-controlled entropy offloading process with software-controlled thermal management in high-performance computing, comprising:

operating reversible logic gates in processor cores to preserve information during computations and minimize heat generation in high-computational intensity areas of the processor cores that exceed a predetermined activity threshold;

operating non-reversible logic gates in the processor cores in non-high-computational intensity areas of the processor cores that do not exceed the predetermined activity threshold;

monitoring real-time computational and temperature data in the processor cores using embedded thermal sensors and computational load monitors;

dynamically controlling the offloading of entropy from high-computation regions of the processor cores to a thermal output unit (TOU) via a software-based entropy offloading module, said module prioritizing the transfer of intermediate or unnecessary data from the high-computation areas;

offloading intermediate or unnecessary data from the processor cores to the TOU via a high-bandwidth memory channel, ensuring that excess entropy is efficiently transferred for further processing and heat dissipation;

performing irreversible computations in the TOU using layers of cascading non-reversible logic gates, each having more inputs than outputs, wherein the data is destroyed and heat is generated due to entropy conversion from information loss;

performing irreversible data destruction in the TOU and dissipating the heat generated through integrated heat dissipation mechanisms such as heat sinks and vapor chambers; and adjusting offloading rates from the processor cores to the TOU and optimizing the performance of the reversible logic gates based on real-time thermal and computational data using a dynamic heat regulation module, thereby ensuring efficient thermal management and computational performance optimization.

2. The process of claim 1, wherein the reversible logic gates include Toffoli gates.

3. The process of claim 1, wherein the reversible logic gates include Fredkin gates.

4. The process of claim 1, wherein the reversible logic gates include both Toffoli gates and Fredkin gates.

5. The process of claim 4, wherein the thermal output unit (TOU) is internal to an integrated circuit on which the processor cores reside, and is coupled to a heat dissipation component, such as a heat sink or vapor chamber, to efficiently dissipate the heat generated by irreversible computations.

6. The process of claim 5, wherein the thermal output unit (TOU) is remote from the integrated circuit on which the processor cores reside, and is coupled to a heat dissipation component, ensuring that the heat generated by the irreversible computations in the TOU is dissipated away from the processing cores to maintain optimal thermal conditions.

7. The process of claim 6, wherein the thermal output unit (TOU) includes multi-level cascading logic gates, wherein each level reduces the number of outputs compared to the number of inputs, thereby progressively destroying information at each level of the TOU, resulting in more efficient entropy management and heat dissipation.

8. The process of claim 7, wherein the thermal output unit (TOU) further comprises a dynamic heat dissipation control module that adjusts the operation of heat dissipation mechanisms based on real-time thermal data collected from temperature sensors embedded within both the TOU and the processor cores, ensuring that heat is dissipated efficiently in response to variable workloads.

9. The process of claim 8, wherein the dynamic heat dissipation control module integrates with a liquid cooling system, wherein coolant circulates either through heat sinks external to the TOU processor package or through micro-channels embedded in the TOU, providing additional heat dissipation for high-performance computational loads and preventing overheating in extreme computational conditions.

10. The process of claim 9, wherein the software-based entropy offloading module dynamically adjusts the rate of entropy offloading from the processor cores to the TOU based on the real-time temperature and computational load data, ensuring that data from high-computational areas is offloaded at optimal rates to prevent localized overheating in the cores.

11. The process of claim 10, further comprising a performance optimization module, which monitors the performance of both reversible and non-reversible logic gates in the processor cores, dynamically adjusting the balance of reversible gate operations based on computational intensity and thermal conditions to ensure that heat generation is minimized while maintaining high performance.

12. The process of claim 11, wherein the performance optimization module includes a predictive analytics component that uses machine learning algorithms to predict future thermal conditions based on historical computational data, allowing the system to proactively adjust the use of reversible and non-reversible logic gates before high thermal thresholds are reached.

13. The process of claim 12, wherein the system includes thermal imaging sensors within the processor package, which generate real-time thermal maps of the processor cores and TOU, allowing the system to visualize areas of high heat concentration and adjust entropy offloading and gate operations to mitigate thermal stress.

14. The process of claim 13, wherein the real-time thermal maps generated by the thermal imaging sensors are used to retrospectively analyze the performance of the reversible logic gates, enabling iterative design adjustments, including the selective replacement of non-reversible logic gates with reversible logic gates in high-computational intensity regions that exhibit excessive heat generation.

15. The process of claim 14, further comprising an iterative design refinement module that uses the thermal analysis data to refine the architecture of the processor over time, progressively improving thermal efficiency by increasing the proportion of reversible gates in regions prone to heat buildup, and optimizing the TOU's cascading logic gate structure to further enhance entropy offloading efficiency.

16. The process of claim 15, wherein the iterative design refinement module collaborates with the entropy offloading module to reallocate high-computation tasks to areas of the processor cores that have better thermal conditions, thereby optimizing overall system performance and ensuring balanced thermal loads across all cores.

17. The process of claim 16, wherein the processor cores are configured with region-specific optimization, wherein different regions within the cores have varying degrees of reversible and non-reversible gate configurations, each tailored to the specific computational tasks handled by that region to maximize efficiency and minimize heat generation.

18. The process of claim 17, wherein the thermal output unit (TOU) is capable of operating in both active and passive cooling modes, where passive cooling systems such as heat sinks and vapor chambers are engaged during lower computational loads, and active cooling systems such as fans and liquid cooling are additionally engaged during high-intensity workloads, ensuring adaptive and efficient thermal management based on real-time performance requirements.

19. A reversible logic gate-based thermal management process with software-controlled entropy offloading and thermal management for high-performance computing, comprising:

operating reversible logic gates in processor cores, where said reversible logic gates are selectively activated in regions of high-computational intensity within the processor cores that exceed a predetermined activity threshold, the reversible gates preserving input-output state mappings during computations to prevent information loss, thereby reducing entropy conversion and minimizing heat generation in critical high-performance regions of the cores, enabling continuous high-speed operations without throttling due to excessive heat;

operating non-reversible logic gates in the processor cores in regions identified as non-high-computational intensity areas, wherein computational activity remains below the predetermined threshold, allowing irreversible computations to be conducted in these areas where heat generation is less of a concern, thus optimizing overall processing efficiency while controlling heat generation across the processor cores;

monitoring real-time computational load and temperature data within the processor cores using embedded thermal sensors and computational load monitors, the data being collected by a software-based entropy offloading module, said module continuously analyzing and evaluating the thermal conditions and computational intensity of each core to detect regions where computational intensity is generating excessive heat, and dynamically adjusting system performance and heat management parameters accordingly;

dynamically controlling the offloading of entropy from high-computational regions of the processor cores to a thermal output unit (TOU) via the software-based entropy offloading module, wherein the module prioritizes the identification and transfer of intermediate or unnecessary data from regions of the processor cores exceeding a predefined computational threshold, offloading the data to prevent localized heat accumulation and thermal stress within the cores;

offloading intermediate or unnecessary data from the processor cores to the TOU through high-bandwidth memory channels, wherein the data is transferred in real-time to prevent delays in offloading and to optimize the removal of entropy-generating data from the cores, ensuring that the processing resources of the cores are devoted to high-priority computational tasks, while offloading surplus data to the TOU for irreversible processing;

performing irreversible computations in the TOU using a cascading arrangement of multi-input to reduced-output non-reversible logic gates, wherein each level of non-reversible logic gates in the TOU has more inputs than outputs, resulting in the progressive destruction of offloaded data and the generation of heat due to entropy conversion from information loss, with each stage in the cascade increasing the efficiency of entropy destruction and minimizing the thermal load on the cores;

activating heat dissipation mechanisms within the TOU, said mechanisms comprising a combination of passive cooling systems, including heat sinks and vapor chambers, as well as active cooling systems such as liquid cooling loops and fans, designed to dissipate the heat generated by the irreversible computations performed within the TOU, ensuring that heat is managed in an isolated environment and preventing thermal feedback from impacting the performance of the processor cores;

adjusting offloading rates of entropy from the processor cores to the TOU based on real-time feedback from a thermal management module, wherein the thermal management module continuously monitors temperature data collected from sensors embedded in both the processor cores and the TOU, dynamically optimizing the rate of entropy offloading to ensure that heat does not accumulate in the cores or the TOU, and that the system operates within safe thermal thresholds, even during periods of high computational demand;

regulating the performance of the reversible logic gates within the processor cores through a performance optimization module, wherein the module dynamically adjusts the activation and deactivation of the reversible logic gates based on computational intensity and thermal data in real-time, prioritizing the use of reversible logic gates in regions where computational loads exceed the predefined threshold and heat generation is a concern, while deactivating reversible gates in lower-load areas to optimize power consumption and maintain efficient system performance;

configuring the TOU to be either internal or remote from the integrated circuit (IC) containing the processor cores, wherein when the TOU is internal, it is thermally coupled to a heat dissipation component such as heat sinks or vapor chambers to manage localized heat production, and when the TOU is remote, it is connected to a separate, external heat dissipation system to handle heat dissipation at a distance from the cores, ensuring that the thermal effects of entropy destruction are isolated and do not interfere with core performance;

integrating a dynamic heat regulation module that adjusts both the entropy offloading rates to the TOU and the operational performance of the reversible logic gates, said adjustments being made based on continuous real-time analysis of temperature data from the thermal management module, ensuring that heat buildup is prevented in both the processor cores and the TOU, and optimizing the performance of the overall system for sustained high-computation tasks;

utilizing multi-level cascading logic gates within the TOU, wherein each subsequent level of logic gates processes the output of the previous level, progressively reducing the number of outputs compared to inputs, thereby efficiently destroying information while generating and isolating heat, ensuring that entropy is managed in a controlled and structured manner to prevent excessive heat accumulation;

employing predictive analytics within the performance optimization module, wherein the system leverages historical computational and thermal data to predict future thermal conditions, allowing proactive adjustments to entropy offloading rates and reversible gate usage before thermal thresholds are reached, thereby preventing performance degradation due to overheating;

integrating real-time thermal imaging sensors within the processor cores and the TOU, wherein the thermal imaging sensors generate detailed thermal maps that visualize regions of high computational intensity and heat generation, said maps being used to adjust the operations of the reversible and non-reversible logic gates, as well as entropy offloading rates, in real-time to balance the thermal load across the system;

retrofitting high-entropy regions of the processor cores identified through thermal imaging with additional reversible logic gates, wherein standard non-reversible logic gates in these areas are selectively replaced with reversible logic gates to minimize entropy conversion and heat generation, the retrofitted regions being optimized for efficient thermal management, with offloaded data from these regions being transferred to the TOU for irreversible computation;

iteratively refining the design of the system through an iterative design refinement module, wherein the module uses data from thermal imaging and real-time performance monitoring to continuously adjust the architecture of the processor cores and TOU, including increasing the proportion of reversible gates in high-computational regions, optimizing the cascading logic gate structures in the TOU, and refining the entropy offloading mechanisms to improve the thermal efficiency of the system over time;

adjusting the balance of computational tasks across the processor cores based on region-specific optimization, wherein different regions of the cores are configured with varying concentrations of reversible and non-reversible logic gates depending on the specific computational and thermal requirements of the tasks being handled, enabling optimal heat management and computational efficiency in each region; and allowing the TOU to operate in both active and passive cooling modes, wherein passive heat dissipation systems such as heat sinks and vapor chambers manage heat during lower computational loads, while active cooling systems such as liquid cooling and fans are activated during periods of high-computational intensity, providing adaptive thermal management that scales according to real-time system requirements, wherein the system is capable of scaling to handle increasing levels of high-performance computing tasks, including the addition of processor cores, TOUs, and enhanced cooling systems to accommodate growing computational and thermal demands, ensuring that the system maintains optimal performance levels under varying workloads while preventing overheating, minimizing thermal throttling, and reducing overall energy consumption, enabling the system to support applications in artificial intelligence, machine learning, real-time data processing, and other high-performance environments.

20. A reversible logic gate-based thermal management system with software-controlled entropy offloading and thermal management for high-performance computing, comprising:

processor cores, each configured to execute high-computational intensity tasks, the processor cores comprising reversible logic gates and non-reversible logic gates, wherein the reversible logic gates are selectively activated in regions of the processor cores that exceed a predetermined computational activity threshold, preserving input-output state mappings during computations to prevent information loss, thus minimizing entropy conversion and heat generation, and the non-reversible logic gates are deployed in regions where computational intensity is below the threshold, allowing irreversible computations to proceed where heat generation is less critical;

reversible logic gates, embedded within the processor cores, configured to prevent irreversible information loss during computations in high-intensity regions, thereby reducing heat generation through minimized entropy conversion, and dynamically controlled based on real-time computational intensity and thermal conditions;

non-reversible logic gates, embedded within the processor cores, configured to handle computations in regions of the cores where activity does not exceed the predetermined threshold, allowing standard irreversible operations that produce more heat but are limited to lower-intensity areas, thereby optimizing the thermal balance across the processor cores;

entropy offloading module, configured to dynamically monitor real-time computational loads and temperature data from embedded sensors in the processor cores, the module being responsible for detecting high-computation regions that exceed a predefined activity threshold and initiating the offloading of intermediate or unnecessary data from these regions to a thermal output unit (TOU) for controlled destruction and heat entropy management, based on the detected intensity and thermal conditions;

thermal output unit (TOU), structurally separate from the processor cores and connected to them via high-bandwidth memory channels, the TOU being configured to receive offloaded data and perform irreversible computations using a cascading arrangement of multi-input to reduced-output non-reversible logic gates, wherein each level of the cascading logic gates has more inputs than outputs, progressively destroying information and generating heat through entropy conversion, while isolating the heat generation from the processor cores;

high-bandwidth memory channels, connecting the processor cores to the TOU, enabling the real-time transfer of unwanted information from reversible gates in high-computational regions to the TOU for irreversible processing, thereby preventing thermal overload in the processor cores and ensuring efficient offloading of entropy during intense computational tasks;

thermal management module, configured to continuously monitor real-time temperature data from sensors embedded within both the processor cores and the TOU, said module dynamically adjusting the rates of entropy offloading to the TOU, based on detected thermal conditions, to ensure that heat generation in the processor cores remains below critical thresholds, while preventing heat buildup in the TOU by optimizing the timing and rate of irreversible computations;

heat dissipation mechanisms, integrated into the TOU and comprising both passive cooling systems, such as heat sinks and vapor chambers, and active cooling systems, including liquid cooling loops and fans, the dissipation mechanisms being designed to manage the heat generated by irreversible computations within the TOU, isolating the thermal effects from the processor cores and ensuring that the TOU operates at an optimal temperature, regardless of the computational load;

performance optimization module, configured to regulate the operation of the reversible logic gates within the processor cores, the module dynamically adjusting the activation and deactivation of the reversible logic gates based on real-time computational intensity and thermal data, prioritizing the use of reversible logic gates in high-computational intensity regions to reduce heat generation, while deactivating reversible gates in lower-load regions to optimize energy efficiency and computational performance;

predictive analytics component, integrated within the performance optimization module, wherein machine learning algorithms are used to analyze historical computational and temperature data to predict future thermal conditions, allowing the system to proactively adjust entropy offloading rates and reversible gate usage before high thermal thresholds are reached, thereby preventing heat-induced performance degradation and optimizing system efficiency;

thermal imaging subsystem, comprising real-time thermal imaging sensors embedded within both the processor cores and the TOU, the sensors generating detailed thermal maps of the cores to visualize regions of high computational intensity and heat generation, wherein the thermal maps are used to dynamically adjust entropy offloading rates, reversible gate usage, and non-reversible computations in response to the real-time thermal data, ensuring that the system maintains optimal thermal balance across all regions of the processor cores and TOU;

retrofitting mechanism, configured to selectively replace non-reversible logic gates in high-entropy regions of the processor cores with additional reversible logic gates, based on the thermal maps generated by the thermal imaging subsystem, wherein the retrofitting mechanism is used to reduce heat generation in critical regions by transforming them into thermally optimized zones with minimal entropy conversion, and offloading data from these retrofitted regions to the TOU for irreversible computation;

cascading non-reversible logic gates, embedded within the TOU and arranged in a multi-level configuration, wherein each level progressively reduces the number of outputs compared to inputs, efficiently destroying offloaded data and generating heat in a controlled manner, the cascading gates ensuring that entropy is managed efficiently within the TOU, preventing excessive heat generation while isolating the thermal effects from the processor cores;

iterative design refinement module, integrated with the thermal management and performance optimization modules, the design refinement module using data from thermal imaging, real-time performance monitoring, and predictive analytics to continually adjust the architecture of the processor cores and TOU, including increasing the concentration of reversible gates in high-computational regions, refining the cascading gate structures in the TOU, and optimizing entropy offloading pathways to further improve thermal efficiency and system performance over time;

a dynamic heat regulation module, responsible for adjusting both the offloading rates of data from the processor cores to the TOU and the performance of the reversible logic gates, said module dynamically analyzing real-time thermal data from sensors embedded across the system and regulating heat dissipation mechanisms within the TOU to maintain optimal operating temperatures, preventing overheating in both the processor cores and the TOU during periods of high computational demand;

region-specific optimization architecture, wherein different regions of the processor cores are configured with varying concentrations of reversible and non-reversible logic gates, the configuration being tailored to the specific computational tasks handled by each region to ensure optimal thermal management and computational efficiency, with high-computation regions being prioritized for reversible gate operation to minimize heat generation;

cooling components, comprising both active and passive cooling systems, integrated into the system architecture to manage the heat generated by both the processor cores and the TOU, wherein passive cooling systems such as heat sinks and vapor chambers are used to dissipate heat during low and moderate computational loads, while active cooling systems such as liquid cooling loops and fans are additionally activated during periods of high computational intensity to provide additional thermal management, ensuring that the system maintains safe operating temperatures under all workload conditions;

a system control module, responsible for coordinating the overall thermal management process, including the operation of reversible and non-reversible logic gates, entropy offloading to the TOU, heat dissipation mechanisms, and performance optimization, wherein the control module interfaces with all subsystems to ensure seamless coordination between computational tasks, heat management, and real-time monitoring of thermal conditions; and a processor scalability structure, enabling the system to scale for different high-performance computing tasks, wherein additional processor cores, TOUs, and cooling systems can be added to meet growing computational and thermal demands while maintaining the same entropy offloading, thermal management, and performance optimization processes, thereby ensuring that the system can handle increasing workloads without compromising performance or overheating, wherein the system is capable of sustaining high-performance computing tasks by dynamically managing entropy conversion and heat generation within the processor cores and TOU, enabling the system to operate at higher clock speeds and processing rates without the risk of thermal throttling, overheating, or performance degradation, while reducing overall energy consumption through the efficient use of reversible logic gates, predictive analytics, and adaptive cooling strategies, making the system suitable for applications in artificial intelligence, machine learning, real-time data processing, and other demanding computing environments.

* * * * *